(12) United States Patent
Kambayashi et al.

(10) Patent No.: US 12,484,224 B2
(45) Date of Patent: Nov. 25, 2025

(54) THREE-DIMENSIONAL MEMORY DEVICE INCLUDING COMPOSITE BACKSIDE METAL FILL STRUCTURES

(71) Applicant: SANDISK TECHNOLOGIES LLC, Addison, TX (US)

(72) Inventors: Ryo Kambayashi, Yokkaichi (JP); Kazuto Ohsawa, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/581,037

(22) Filed: Feb. 19, 2024

(65) Prior Publication Data
US 2024/0196619 A1    Jun. 13, 2024

Related U.S. Application Data

(63) Continuation-in-part of application No. 17/806,406, filed on Jun. 10, 2022, now Pat. No. 12,408,337.

(51) Int. Cl.
*H10B 43/27*    (2023.01)
*H10B 41/27*    (2023.01)

(52) U.S. Cl.
CPC ............ *H10B 43/27* (2023.02); *H10B 41/27* (2023.02)

(58) Field of Classification Search
CPC ........ H10B 41/27; H10B 43/27; H10B 43/10; H10B 43/50
USPC ........................... 257/315; 438/201, 211, 257
See application file for complete search history.

(56) References Cited

U.S. PATENT DOCUMENTS

| | | | |
|---|---|---|---|
| 9,419,135 B2 | 8/2016 | Baenninger et al. |
| 9,455,267 B2 | 9/2016 | Zhang et al. |
| 9,698,223 B2 | 7/2017 | Sharangpani et al. |
| 9,768,192 B1 | 9/2017 | Nakamura et al. |
| 9,780,034 B1 | 10/2017 | Tsutsumi et al. |
| 9,799,671 B2 | 10/2017 | Pachamuthu et al. |
| 9,887,207 B2 | 2/2018 | Zhang et al. |
| 9,917,093 B2 | 3/2018 | Chu et al. |
| 10,103,161 B2 | 10/2018 | Ito et al. |
| 10,242,994 B2 | 3/2019 | Inomata et al. |
| 10,355,012 B2 | 7/2019 | Shimabukuro et al. |
| 10,381,372 B2 | 8/2019 | Amano et al. |

(Continued)

OTHER PUBLICATIONS

USPTO Office Communication, Non-Final Office Action for U.S. Appl. No. 17/806,406, mailed on Feb. 27, 2025, 12 pages.

(Continued)

*Primary Examiner* — Didarul A Mazumder
(74) *Attorney, Agent, or Firm* — THE MARBURY LAW GROUP PLLC

(57) ABSTRACT

A three dimensional memory device includes: an alternating stack of insulating layers and electrically conductive layers, memory openings vertically extending through the alternating stack, memory opening fill structures located in the memory openings, and a backside trench fill structure that includes a backside trench insulating spacer and a backside contact via structure. The backside contact via structure includes a first metallic nitride liner including a nitride of a first metal, a first metal core fill conductive material portion include a second metal, and a second metallic nitride liner including a nitride of the second metal located between an inner sidewall of the first metallic nitride liner and an outer sidewall of the first metal core fill conductive material portion.

2 Claims, 79 Drawing Sheets

(56) References Cited

U.S. PATENT DOCUMENTS

| | | | |
|---|---|---|---|
| 10,529,620 | B2 | 1/2020 | Sharangpani et al. |
| 10,658,381 | B1 | 5/2020 | Yu et al. |
| 10,790,296 | B1 | 9/2020 | Yamaha et al. |
| 10,804,197 | B1 | 10/2020 | Kawasaki et al. |
| 10,847,408 | B2 | 11/2020 | Makala et al. |
| 10,854,513 | B2 | 12/2020 | Kawasaki et al. |
| 10,854,573 | B2 | 12/2020 | Ji et al. |
| 11,069,631 | B2 | 7/2021 | Onuma |
| 11,114,406 | B2 | 9/2021 | Kanakamedala et al. |
| 11,199,562 | B2 | 12/2021 | Li et al. |
| 11,289,429 | B2 | 3/2022 | Shimamoto |
| 2015/0179662 | A1 | 6/2015 | Makala et al. |
| 2016/0049421 | A1 | 2/2016 | Zhang et al. |
| 2016/0086969 | A1 | 3/2016 | Zhang et al. |
| 2016/0141419 | A1 | 5/2016 | Baenninger et al. |
| 2016/0149002 | A1 | 5/2016 | Sharangpani et al. |
| 2016/0218059 | A1* | 7/2016 | Nakada .............. H10B 41/27 |
| 2016/0276359 | A1 | 9/2016 | Oginoe et al. |
| 2016/0300848 | A1 | 10/2016 | Pachamuthu et al. |
| 2016/0329343 | A1* | 11/2016 | Pachamuthu ......... H10B 43/50 |
| 2017/0271261 | A1 | 9/2017 | Tsutsumi et al. |
| 2017/0271352 | A1 | 9/2017 | Nakamura et al. |
| 2017/0373078 | A1 | 12/2017 | Chu et al. |
| 2017/0373087 | A1 | 12/2017 | Ito et al. |
| 2018/0006049 | A1 | 1/2018 | Inomata et al. |
| 2018/0019256 | A1 | 1/2018 | Amano et al. |
| 2018/0090373 | A1 | 3/2018 | Sharangpani et al. |
| 2018/0374865 | A1 | 12/2018 | Shimabukuro et al. |
| 2020/0258909 | A1 | 8/2020 | Amano |
| 2021/0104472 | A1 | 4/2021 | Shimamoto |
| 2021/0272912 | A1 | 9/2021 | Wu et al. |
| 2021/0343646 | A1* | 11/2021 | Chen .................. H01L 23/481 |
| 2021/0388500 | A1 | 12/2021 | Shimabukuro et al. |
| 2021/0388502 | A1 | 12/2021 | Shimabukuro et al. |
| 2022/0037203 | A1 | 2/2022 | Tsai et al. |
| 2022/0149002 | A1 | 5/2022 | Hou et al. |
| 2023/0223248 | A1 | 7/2023 | Zhou et al. |
| 2023/0223266 | A1 | 7/2023 | Zhou et al. |
| 2023/0223267 | A1 | 7/2023 | Sharangpani et al. |
| 2023/0223356 | A1 | 7/2023 | Sakiyama et al. |
| 2023/0402387 | A1 | 12/2023 | Sharangpani et al. |
| 2023/0403850 | A1 | 12/2023 | Amano et al. |

OTHER PUBLICATIONS

Bchir, O. J. et al., "MOCVD of tungsten nitride (WNx) thin films from the imido complex Cl4(CH3CN)W(NiPr)," Journal of Crystal, vol. 249, pp. 262-274, (2003); https://doi.org/10.1016/S0022-0248(02)02145-0.

Lahav, A. et al., "Measurement of thermal expansion coefficients of W, WSi, WN, and WSiN thin film metallizations," Journal of Applied Physics, vol. 67, pp. 734-738, (1990); https://doi.org/10.1063/1.345779.

Chen, L., "Synthesis and characterization of silicon dioxide thin films by plasma enhances chemical vapor deposition from diethylsilane and nitrous oxide" (1995). Theses. 1177. https://digitalcommon.niit.edu/theses/1177.

Chiu, H. K. et al., "Characterization of titanium nitride etch rate and selectivity to silicon dioxide in a $Cl_2$ helicon-wave plasma," Journal of Vacuum Science & Technology A 19, 455 (2001); https://doi.org/10.1116/1.1342866.

Endoh et al., "Novel Ultra High-Density Memory with a Stacked-Surrounding Gate Transistor (S-SGT) Structured Cell," IEDM Proc. (2001) 33-36.

ISR—Notification of Transmittal of The International Search Report and Written Opinion of the International Searching Authority for International Patent Application No. PCT/US2023/017061, mailed Aug. 1, 2023, 10 pages.

Jauberteau, I. et al., "Molybdenum Nitride Films: Crystal Structures, Synthesis, Mechanical, Electrical and Some Other Properties," Coatings 2015, vol. 5, No. 4, pp. 656-687; https://doi.org/10.3390/coatings5040656.

Ji, L. et al., "Conformal metal thin-film coatings in high-aspect-ratio trenches using a self-sputtered rf-driven plasma source," Journal of Vacuum Science & Technology B 25, 1227 (2007); doi: 10.1116/1.2749527.

Knoops, H.C.M., et al., "Atomic Layer Deposition," Ch. 27—Atomic Layer Deposition (pp. 1101-1134) in Handbook of Crystal Growth, edited by T. Kuech (Elsevier, 2015). doi: 10.1016/B978-0-444-63304-0.00027-5.

Perry, D. L., "Handbook of Inorganic Compounds," $2^{nd}$ Edition, 2011, Boca Raton, Florida, CRC Press, p. 264, https://doi.org/10.1201/b10908.

Szmyt, W. et la., "Atomic Layer Deposition on Porous Substrates: From General Formulation to Fibrous Substrates and Scaling Laws," Chem. Mater., vol. 34, No. 1, pp. 203-216, (2022) https://doi.org/10.1021/acs.chemmater.1c03164.

IPRP—Notification Concerning Transmittal of International Preliminary Report on Patentability and Written Opinion of the International Searching Authority for International Patent Application No. PCT/US2023/017061, mailed Dec. 19, 2024, 6 pages.

USPTO Office Communication, Notice of Allowance and Fee(s) Due for U.S. Appl. No. 17/806,406, mailed on Jun. 18, 2025, 10 pages.

* cited by examiner

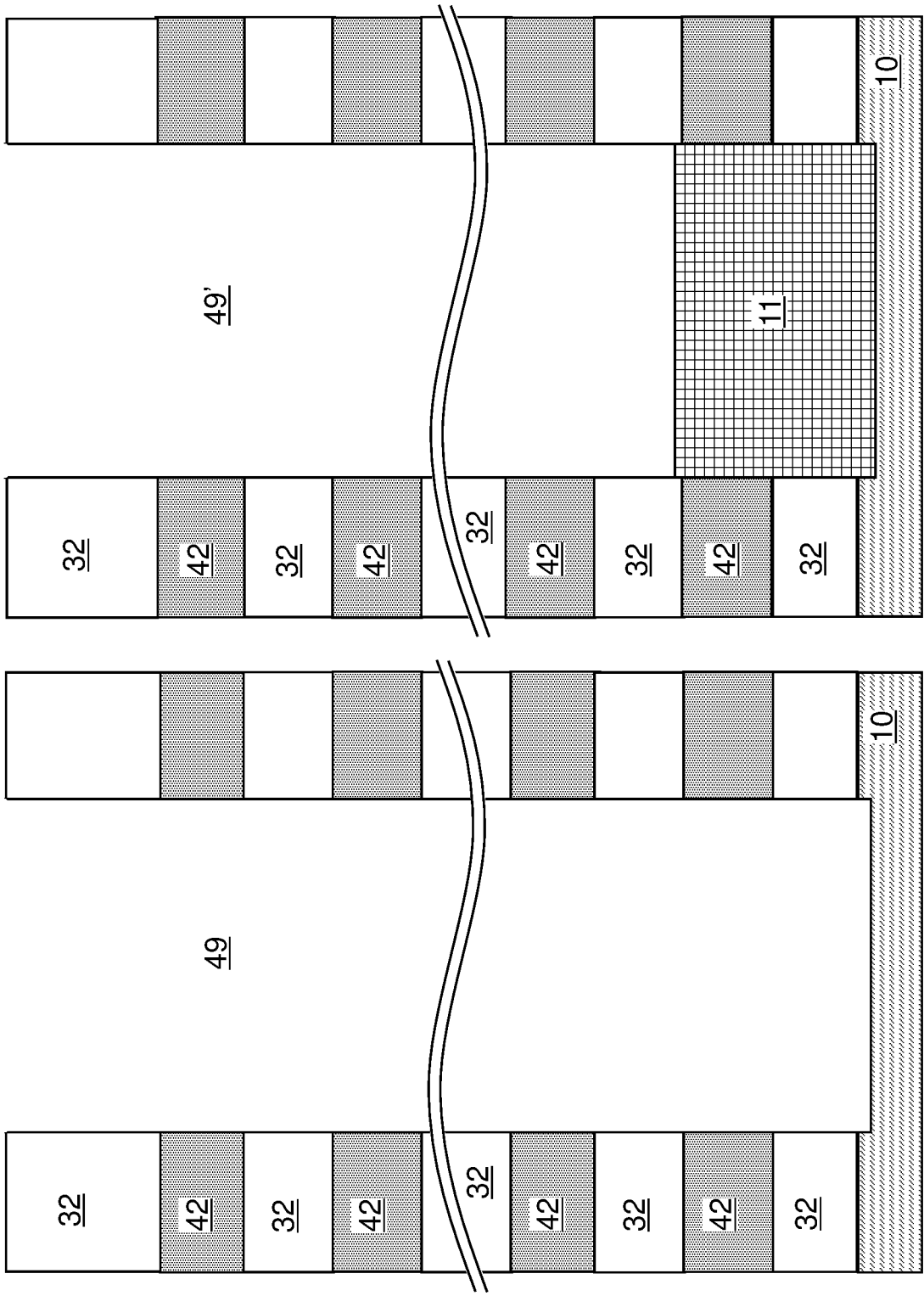

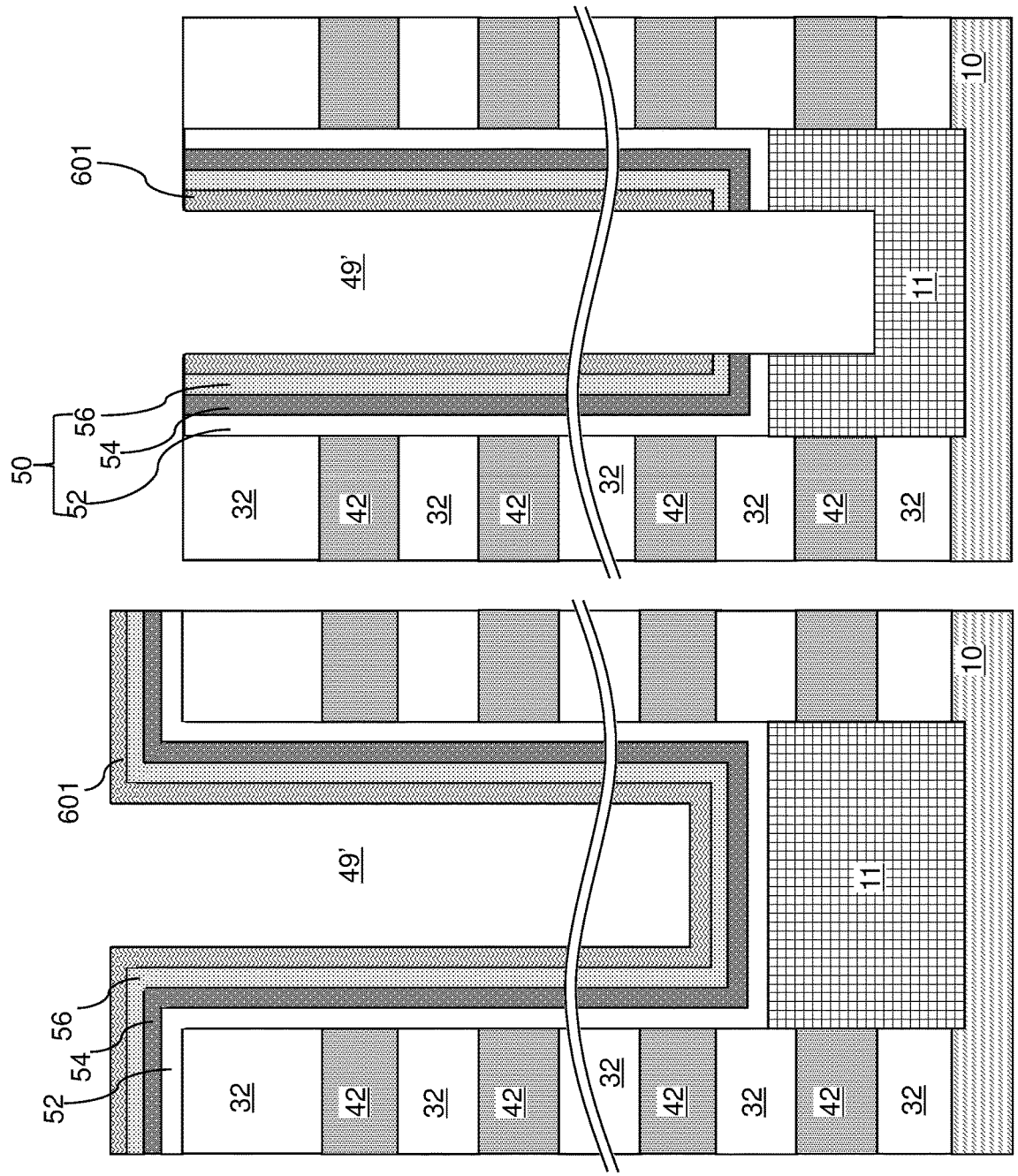

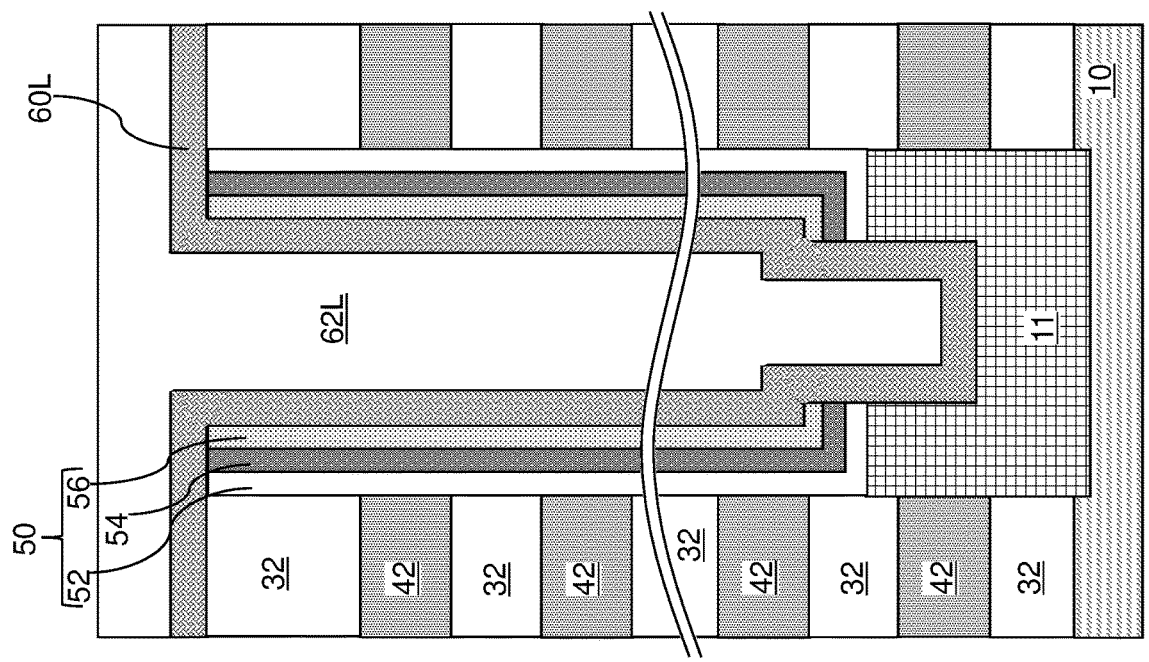
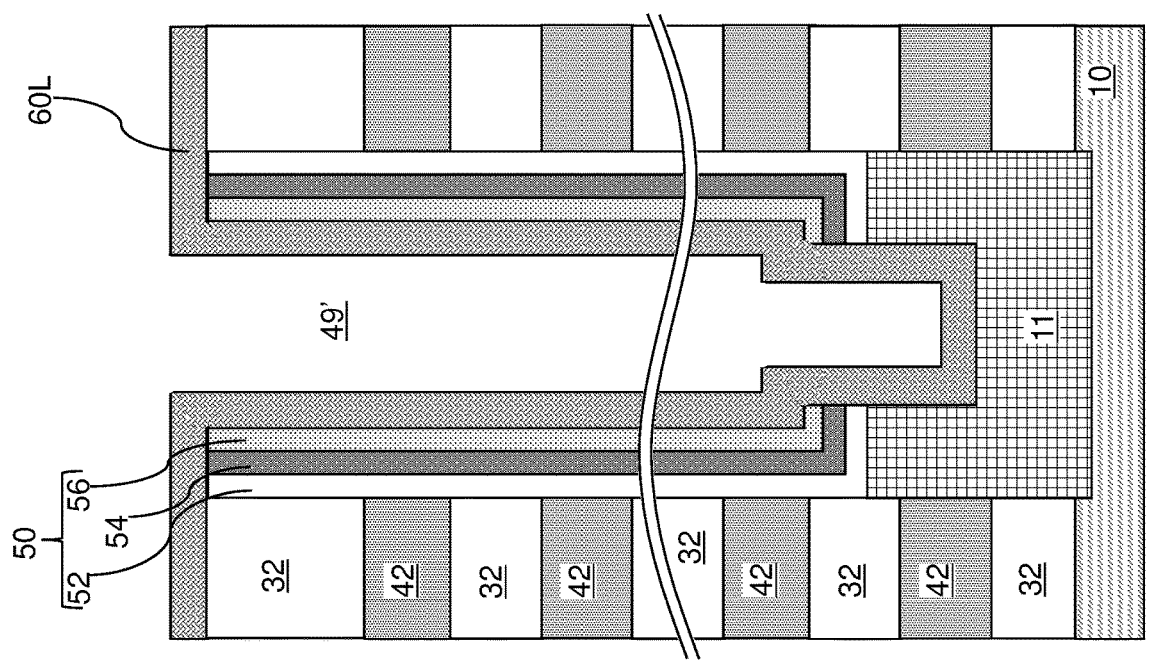

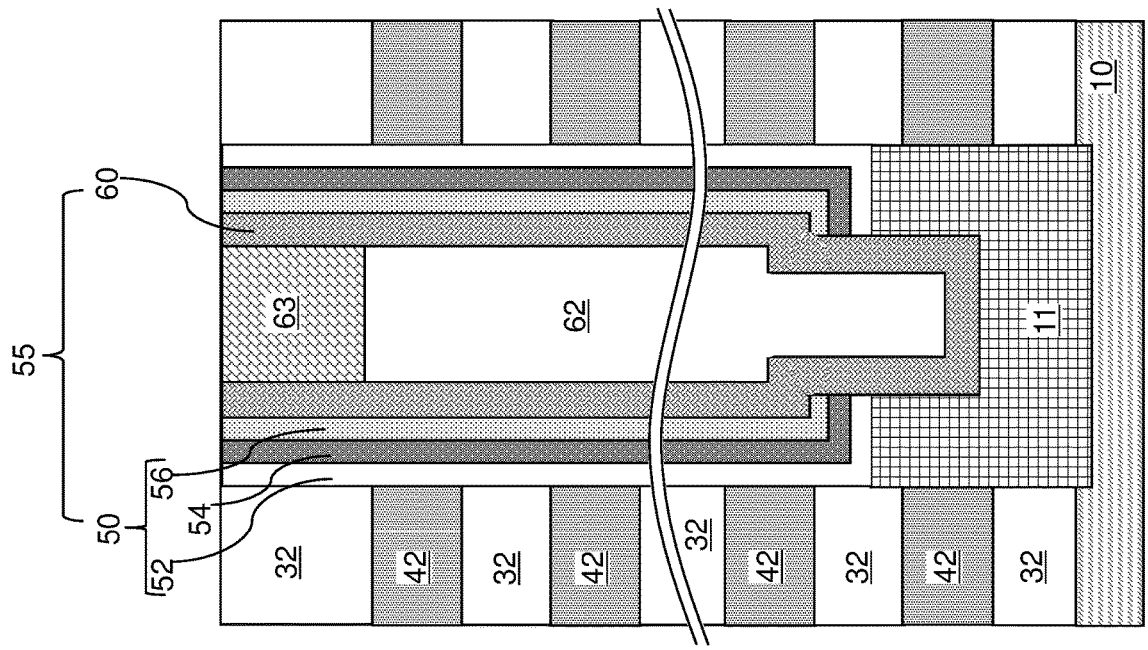
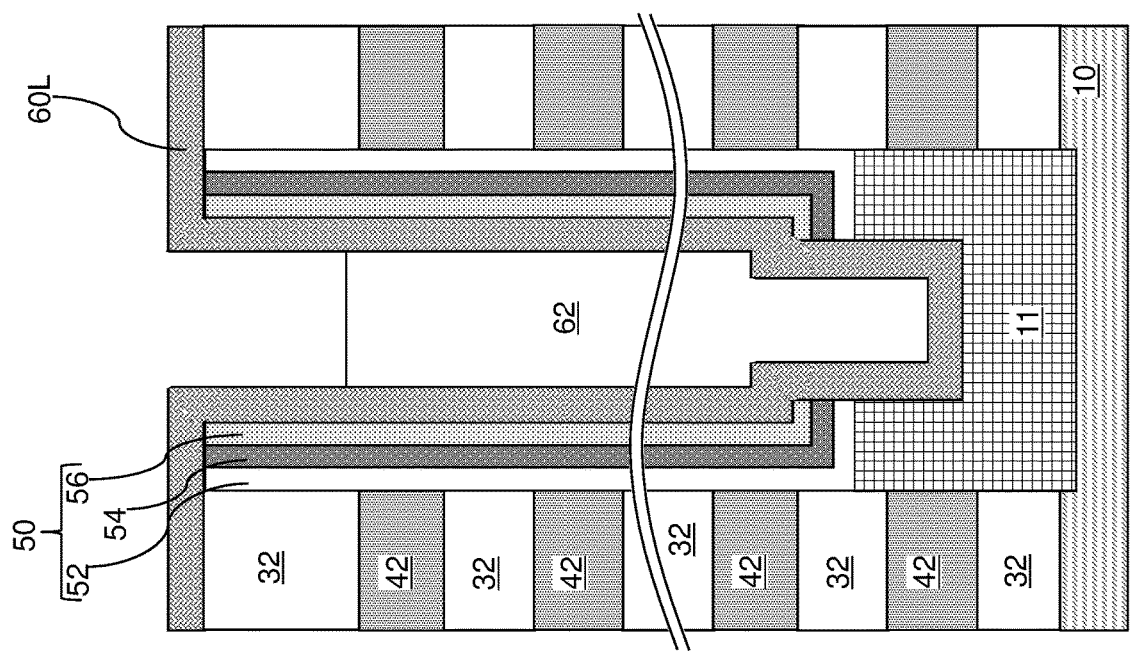

THREE-DIMENSIONAL MEMORY DEVICE INCLUDING COMPOSITE BACKSIDE METAL FILL STRUCTURES

RELATED APPLICATIONS

This application is a continuation-in-part application of U.S. application Ser. No. 17/806,406 filed on Jun. 10, 2022, the entire contents of which are incorporated herein by reference.

FIELD

The present disclosure relates generally to the field of semiconductor devices, and particularly to a three-dimensional memory device including composite backside metal fill structures and methods for forming the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three dimensional memory device is provided, which comprises: an alternating stack of insulating layers and electrically conductive layers; memory openings vertically extending through the alternating stack; memory opening fill structures located in the memory openings and comprising a respective vertical semiconductor channel and a respective vertical stack of memory elements; and a backside trench fill structure laterally extending along a first horizontal direction, wherein: the backside trench fill structure comprises a backside trench insulating spacer and a backside contact via structure that is laterally surrounded by the backside trench insulating spacer; and the backside contact via structure comprises: a first metallic nitride liner comprising a nitride of a first metal; a first metal core fill conductive material portion consisting essentially of a second metal; and a second metallic nitride liner comprising a nitride of the second metal located between an inner sidewall of the first metallic nitride liner and an outer sidewall of the first metal core fill conductive material portion.

According to another aspect of the present disclosure, a method of forming a three dimensional memory device is provided. The method comprises: forming an alternating stack of insulating layers and spacer material layers over a substrate; forming memory openings through the alternating stack; forming memory opening fill structures in the memory openings, wherein the memory opening fill structures comprise a respective vertical semiconductor channel and a respective vertical stack of memory elements; forming a backside trench through the alternating stack; forming a backside trench insulating spacer on a sidewall of the backside trench; and forming a backside contact via structure in the backside trench over the backside trench insulating spacer. The backside contact via structure comprises: a first metallic nitride liner comprising a nitride of a first metal; a first metal core fill conductive material portion consisting essentially of a second metal; and a second metallic nitride liner comprising a nitride of the second metal located between an inner sidewall of the first metallic nitride liner and an outer sidewall of the first metal core fill conductive material portion.

According to an aspect of the present disclosure, a three dimensional memory device comprises an alternating stack of insulating layers and electrically conductive layers, memory openings vertically extending through the alternating stack, memory opening fill structures located in the memory openings and comprising a respective vertical semiconductor channel and a respective vertical stack of memory elements, and a backside trench fill structure laterally extending along a first horizontal direction. The backside trench fill structure comprises a backside trench insulating spacer and a backside contact via structure that is laterally surrounded by the backside trench insulating spacer. The backside contact via structure comprises a first metal layer, a second metallic nitride liner comprising a nitride of the first metal and contacting an inner sidewall of the first metal layer, a tapered metallic nitride liner is located inside the second metallic nitride liner, and at least one core fill conductive material portion that is laterally surrounded by the second metallic nitride liner.

According to another aspect of the present disclosure, a method of forming a three dimensional memory device, comprises forming an alternating stack of insulating layers and spacer material layers over a substrate, forming memory openings through the alternating stack, forming memory opening fill structures in the memory openings, wherein the memory opening fill structures comprise a respective vertical semiconductor channel and a respective vertical stack of memory elements, forming a backside trench through the alternating stack, forming a backside trench insulating spacer on a sidewall of the backside trench, and forming a backside contact via structure in the backside trench over the backside trench insulating spacer by forming a first metal layer in the backside trench over the backside trench insulating spacer, nitriding the first metal layer to form a second metallic nitride liner, non-conformally depositing a tapered metallic nitride liner in an upper portion of the backside trench over the second metallic nitride liner, and forming at least one core fill conductive material portion in the backside trench over the tapered metallic nitride liner and over the second metallic nitride liner.

According to yet another aspect of the present disclosure, a three dimensional memory device comprises an alternating stack of insulating layers and electrically conductive layers, memory openings vertically extending through the alternating stack, memory opening fill structures located in the memory openings and comprising a respective vertical semiconductor channel and a respective vertical stack of memory elements, and a backside trench fill structure laterally extending along a first horizontal direction. The backside trench fill structure comprises a backside trench insulating spacer and a backside contact via structure that is laterally surrounded by the backside trench insulating spacer, and the backside contact via structure comprises a first metallic nitride liner in contact with the backside trench insulating spacer, a tapered metallic nitride liner having a tapered vertical profile such that a lateral thickness of the tapered metallic nitride liner decreases with a vertical distance from a horizontal plane including a topmost surface of the backside contact via structure and has a vertical extent that is less than a vertical extent of the first metallic nitride liner, and at least one core fill conductive material portion that is laterally surrounded by the first metallic nitride liner.

According to still another aspect of the present disclosure a three dimensional memory device comprises an alternating stack of insulating layers and electrically conductive layers, memory openings vertically extending through the alternating stack, memory opening fill structures located in the memory openings and comprising a respective vertical semiconductor channel and a respective vertical stack of memory elements, and a backside trench fill structure laterally extending along a first horizontal direction. The backside trench fill structure comprises a backside trench insulating spacer and a backside contact via structure that is laterally surrounded by the backside trench insulating spacer, and the backside contact via structure comprises a tungsten nitride liner in contact with at least a lower portion of an inner sidewall of the backside trench insulating spacer, a metallic nitride liner other than tungsten nitride in contact with the tungsten nitride liner and spaced from the backside trench insulating liner, a first core fill conductive material portion laterally surrounded by the metallic nitride liner, and a second core fill conductive material portion overlying the first core fill material portion.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

DETAILED DESCRIPTION

Figure 1:
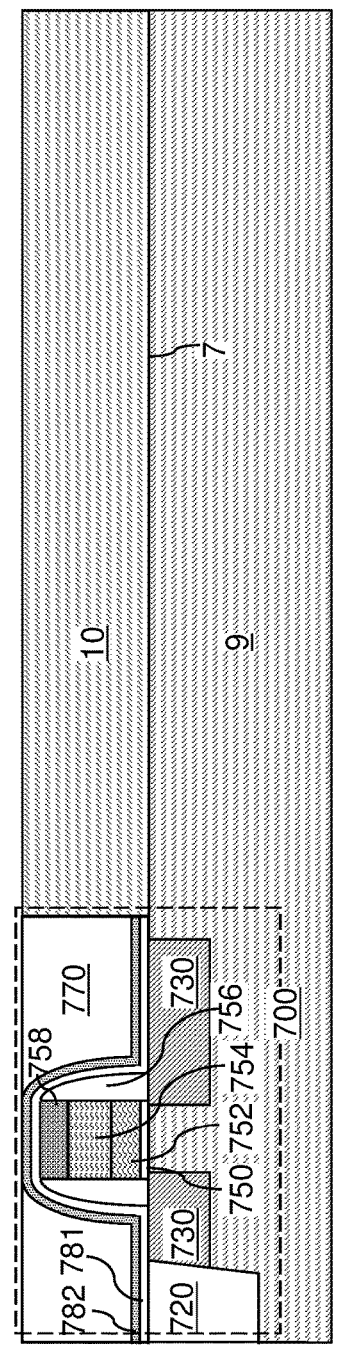
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including a three-dimensional memory device including composite backside metal fill structures and methods for forming the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9, such as a silicon wafer, and an optional semiconductor material layer 10, such as doped well in top surface of the silicon wafer or an epitaxial silicon layer on the silicon wafer. The substrate can have a major surface 7, which can be, for example, a topmost surface of the substrate semiconductor layer 9. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 781 and a second dielectric liner 782 can be optionally formed. Each of the first and second dielectric liners (781, 782) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 781 can be a silicon oxide layer, and the second dielectric liner 782 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (781, 782). Subsequently, the planarization dielectric layer 770 and the dielectric liners (781, 782) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to or after formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
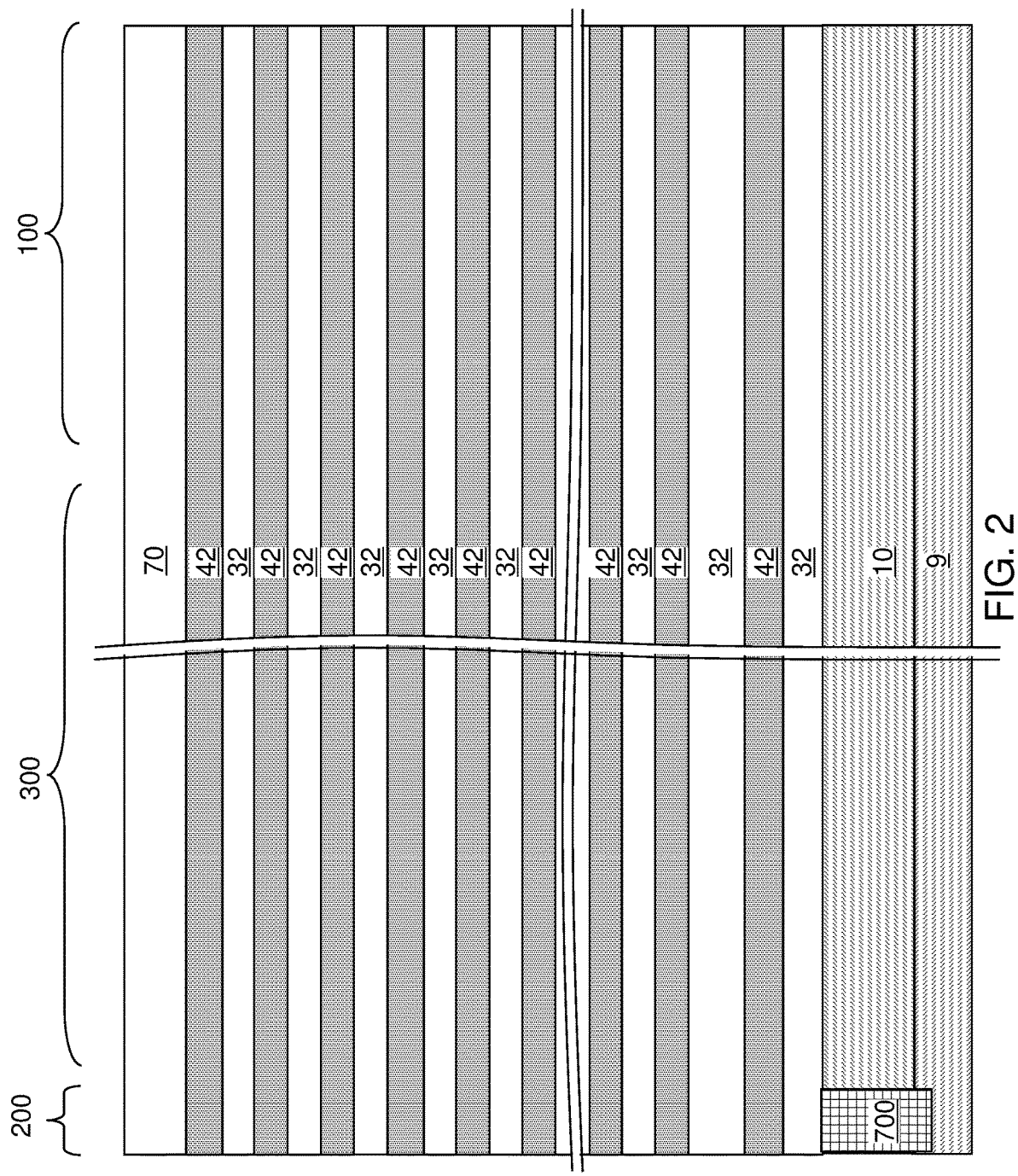
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
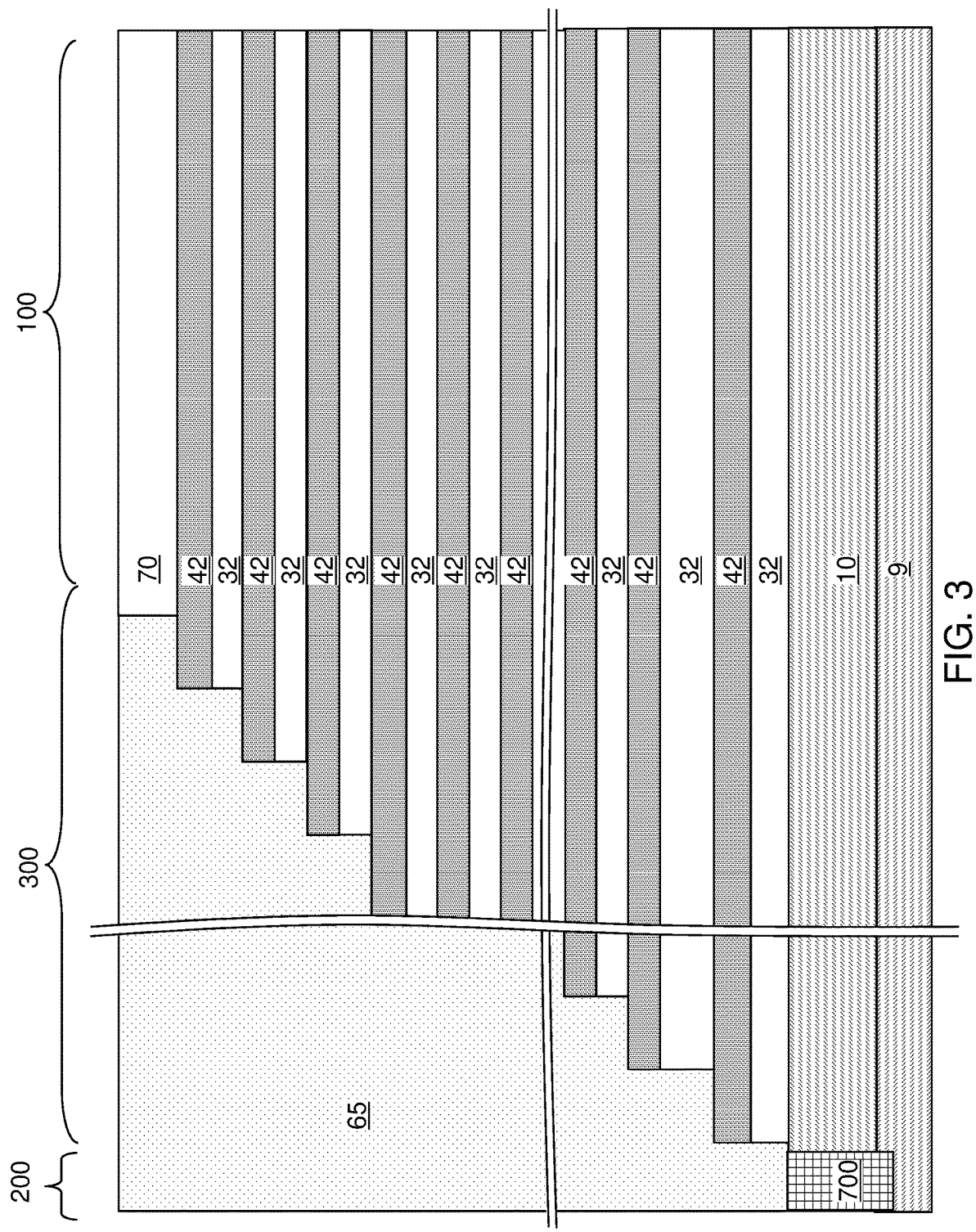
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
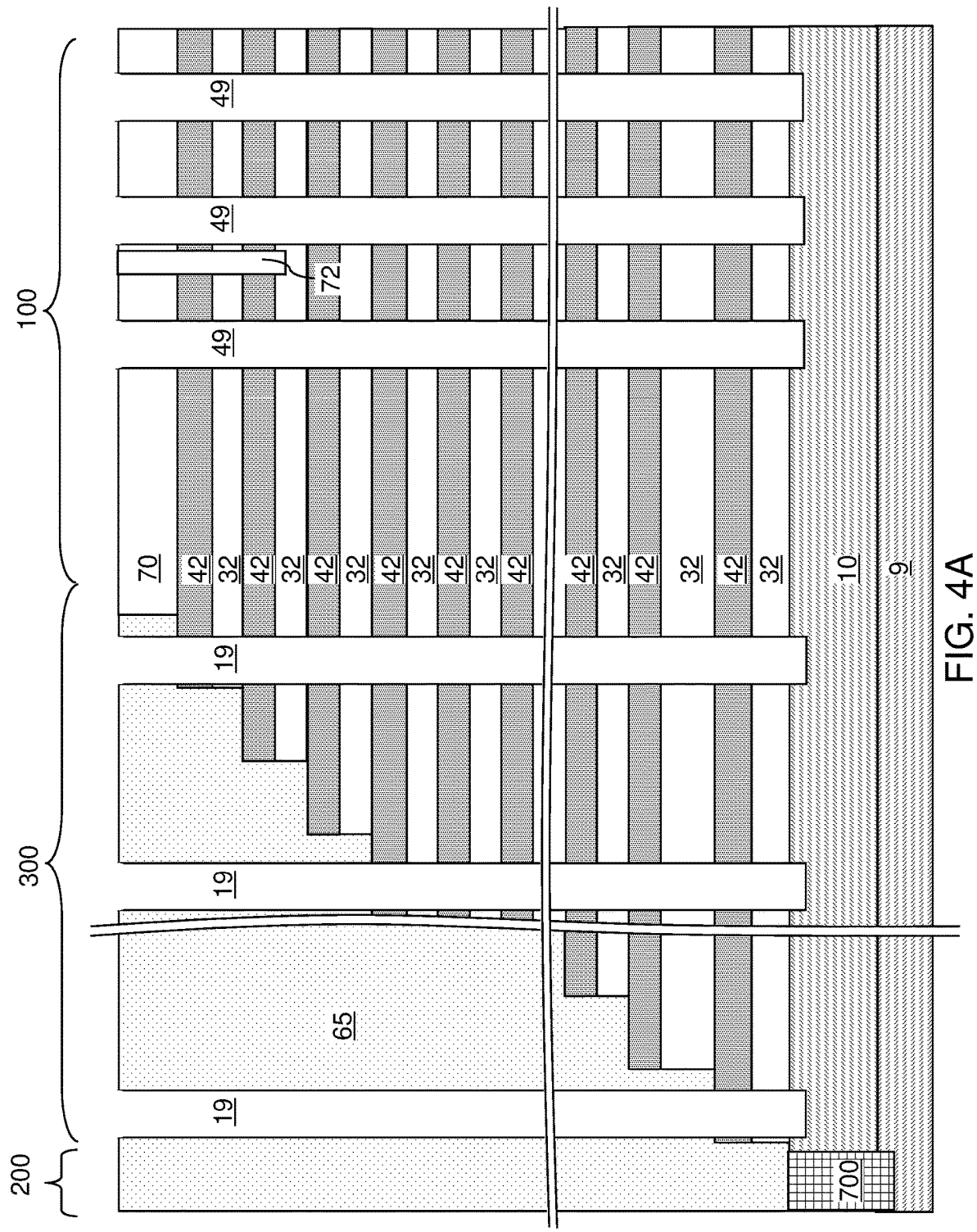
FIG. 4A is a schematic vertical cross-sectional view of the exemplary structure after formation of memory openings and support openings according to an embodiment of the present disclosure.
Figure 4B:
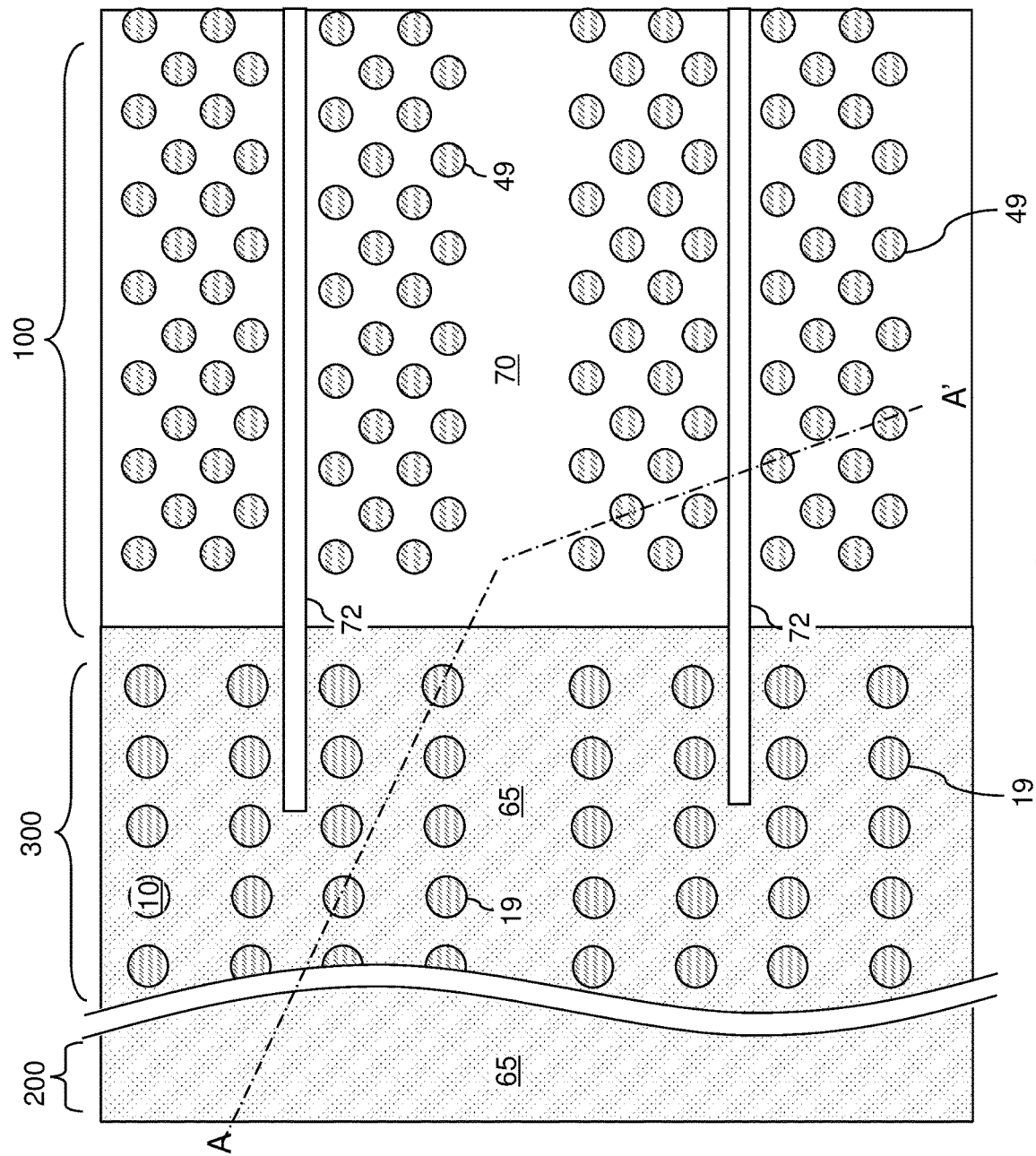
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. Generally, the memory material layer may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

In one embodiment, the dielectric material liner 56 may comprise a tunneling dielectric layer 56 which comprises dielectric material through which charge tunneling can be performed under suitable electrical bias conditions. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising portions of the memory material layer 54) located at the levels of the sacrificial material layers 42. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed through each memory opening upon subsequent replacement of the sacrificial material layers 42 with electrically conductive layers.

Figure 6:
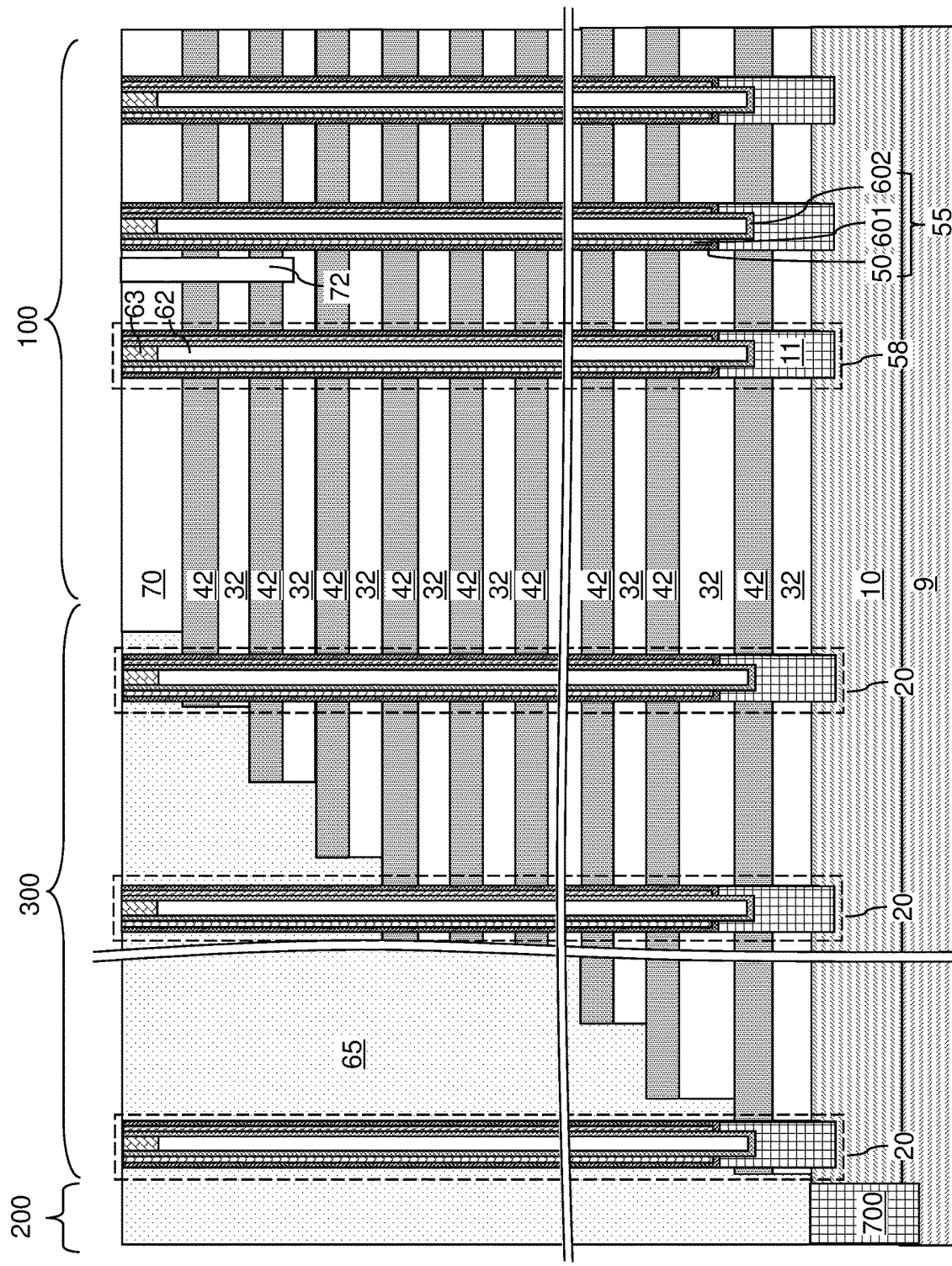
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (comprising portions of the memory material layer 54) laterally surrounding the dielectric material liner 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
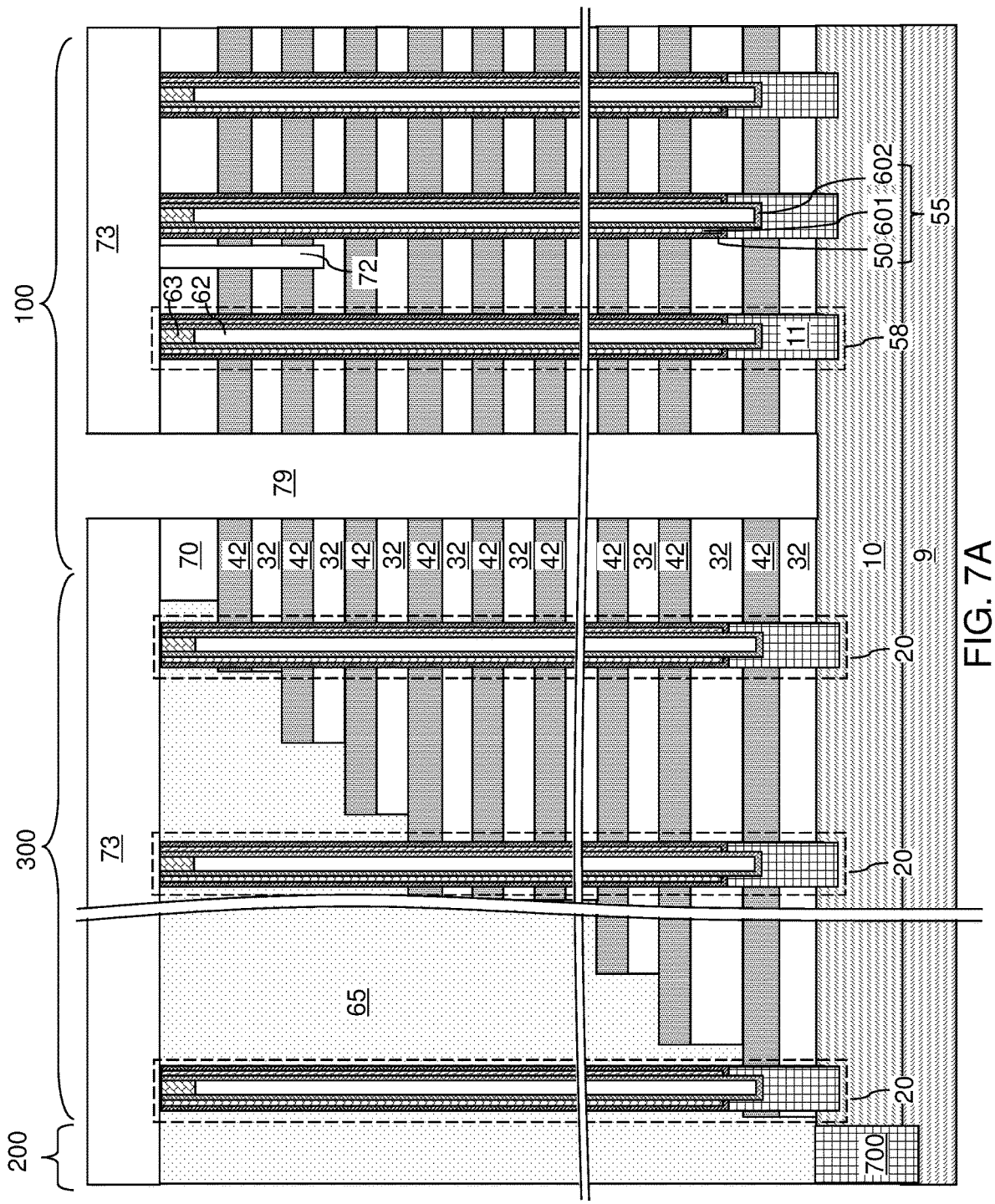
FIG. 7A is a schematic vertical cross-sectional view of the exemplary structure after formation of backside trenches according to an embodiment of the present disclosure.
Figure 7B:
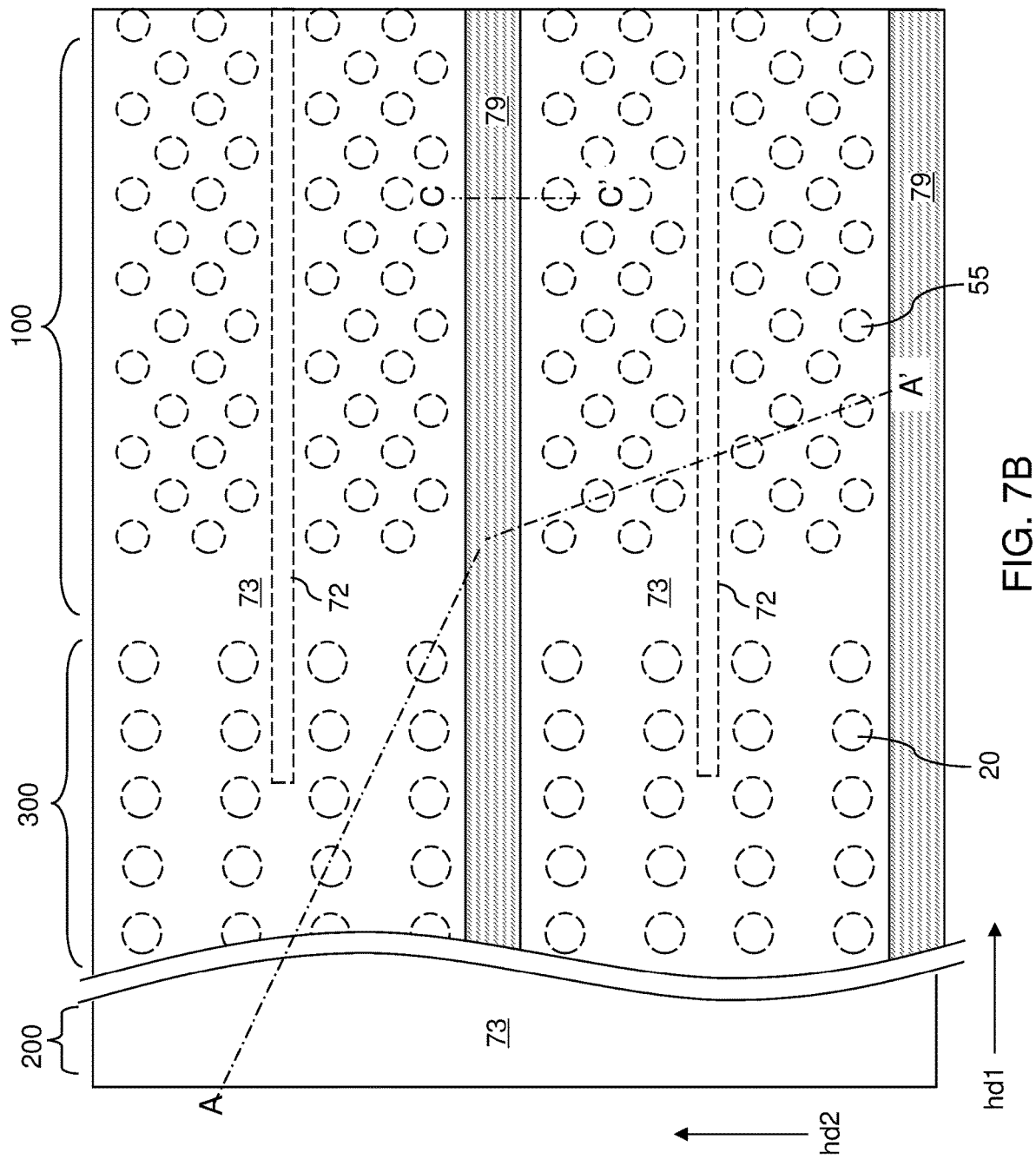
FIG. 7B is a partial see-through top-down view of the exemplary structure of FIG. 7A. The vertical plane A-A' is the plane of the schematic vertical cross-sectional view of FIG. 7A.
Figure 7C:
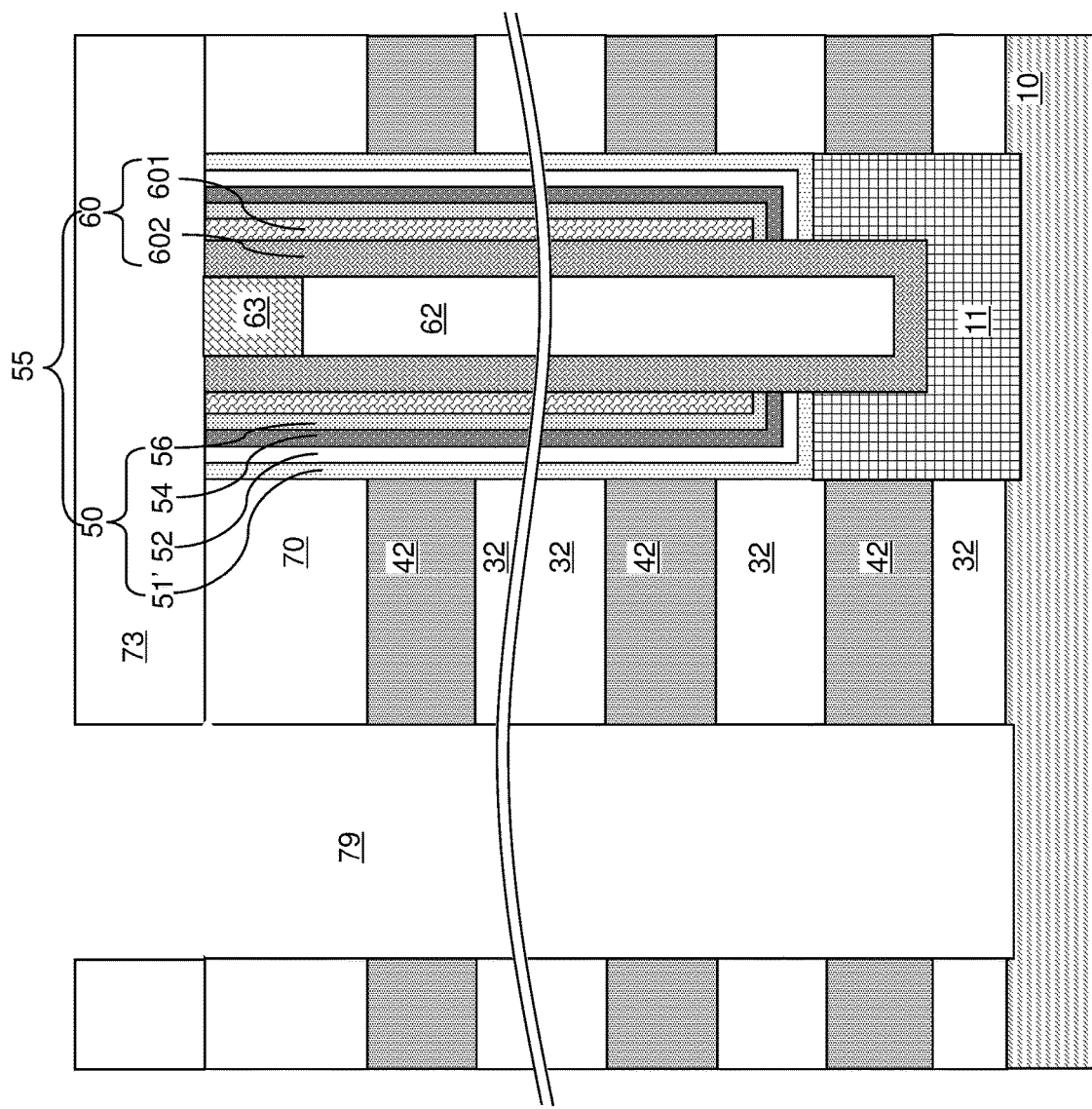
FIG. 7C is a schematic vertical cross-sectional view of the exemplary structure along the vertical plane C-C' of FIG. 7B.

Referring to FIGS. 7A-7C, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1.

Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 8:
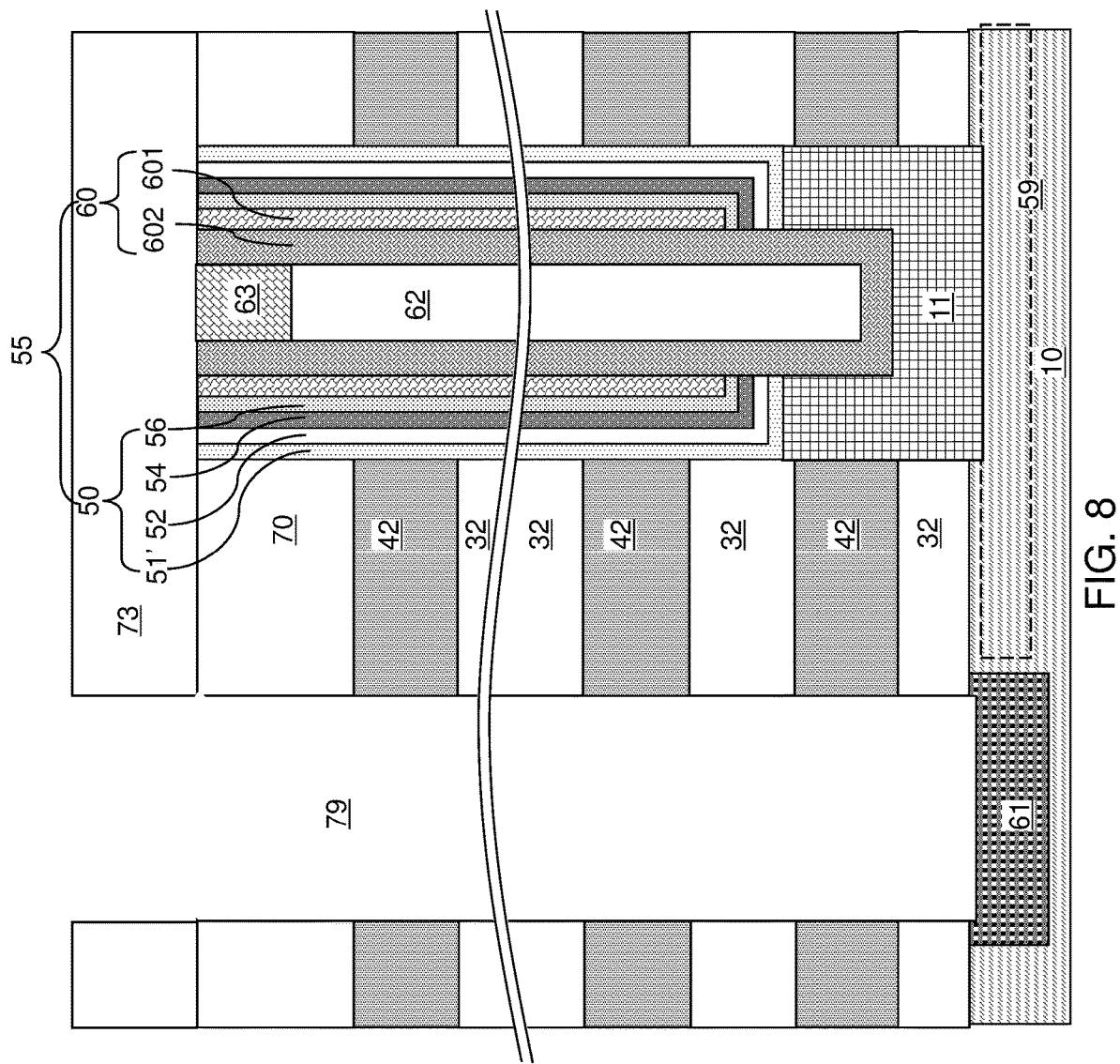
FIG. 8 is a schematic vertical cross-sectional view of a region of the exemplary structure after formation of source regions according to an embodiment of the present disclosure.

Referring to FIG. 8, a source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 9A:
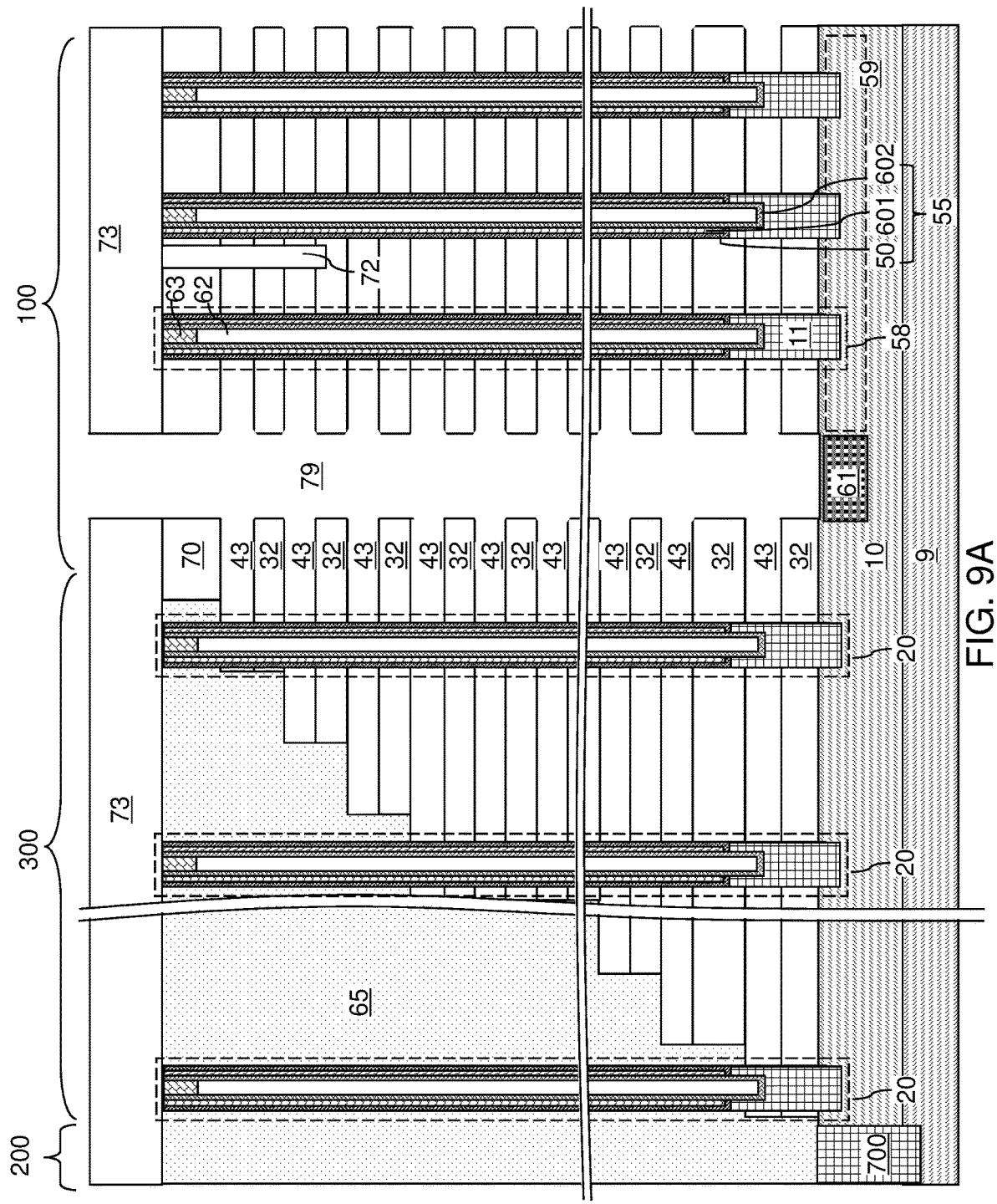
FIG. 9A is a schematic vertical cross-sectional view of the exemplary structure after formation of backside recesses according to an embodiment of the present disclosure.
Figure 9B:
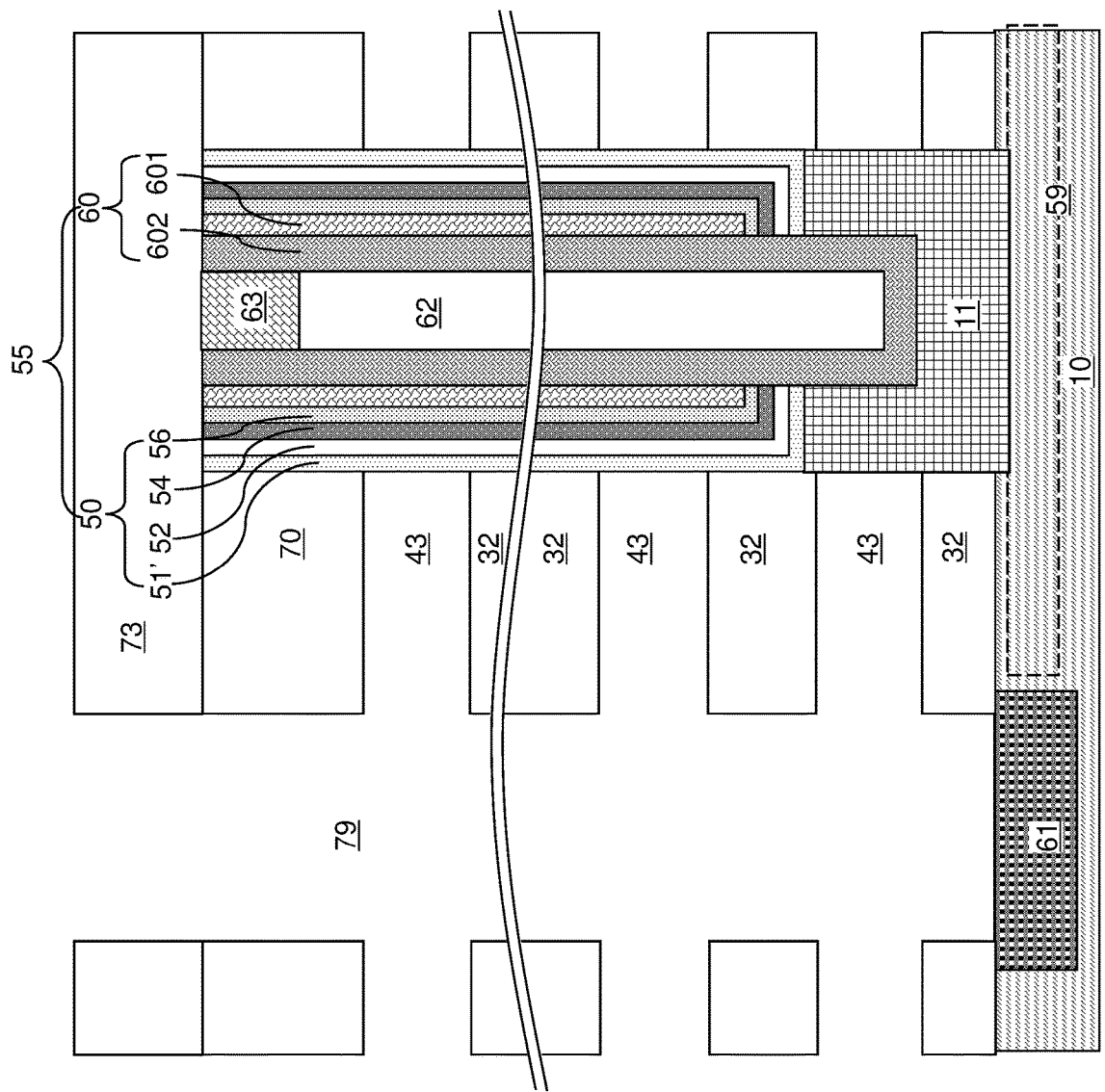
FIG. 9B is a schematic vertical cross-sectional view of a region of the exemplary structure of FIG. 9A.

Referring to FIGS. 9A and 9B, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 10A:
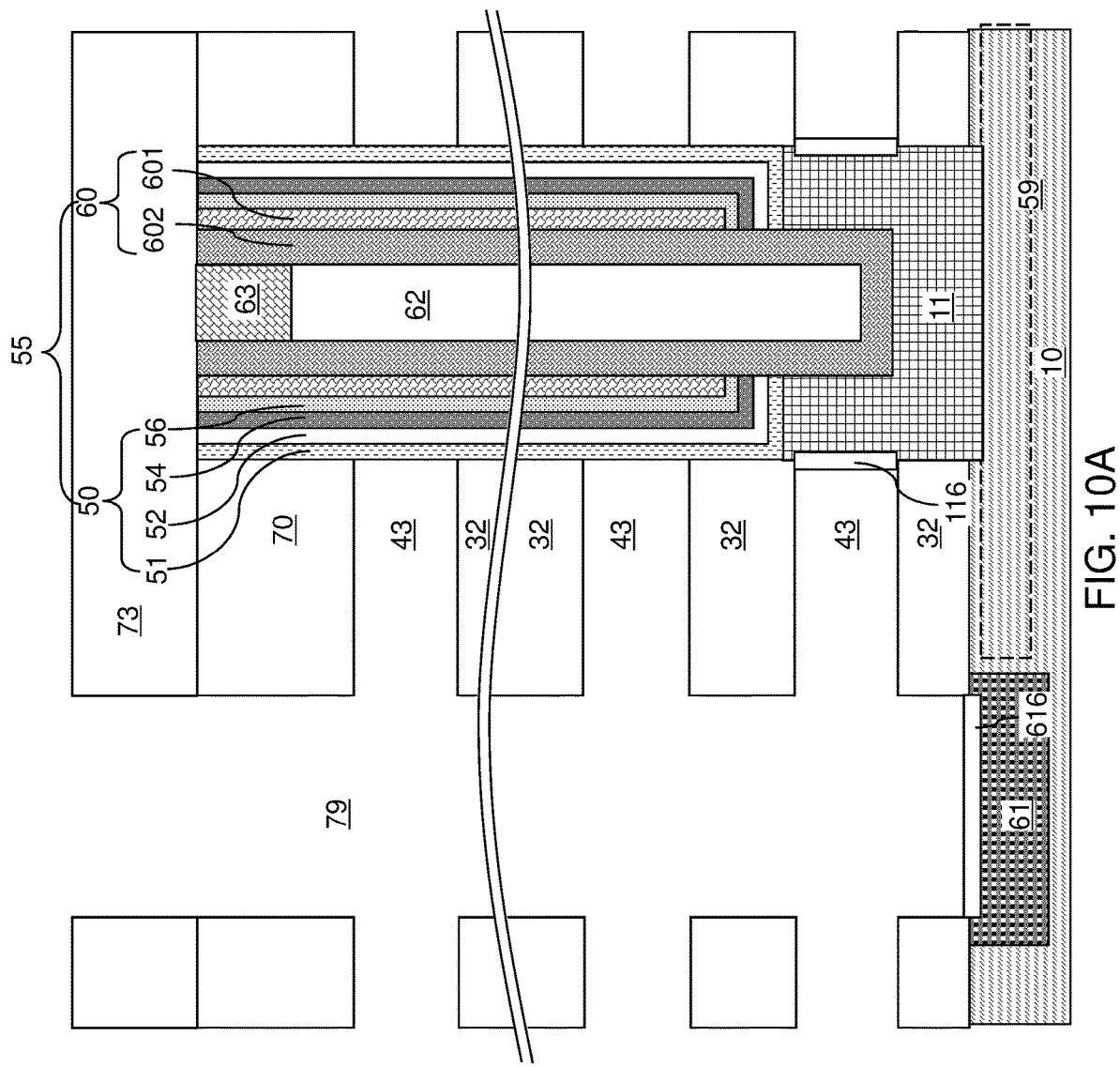
FIGS. 10A-10C are sequential vertical cross-sectional views of a region of the exemplary structure during formation of electrically conductive layers according to an embodiment of the present disclosure.

Referring to FIG. 10A, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 10B:
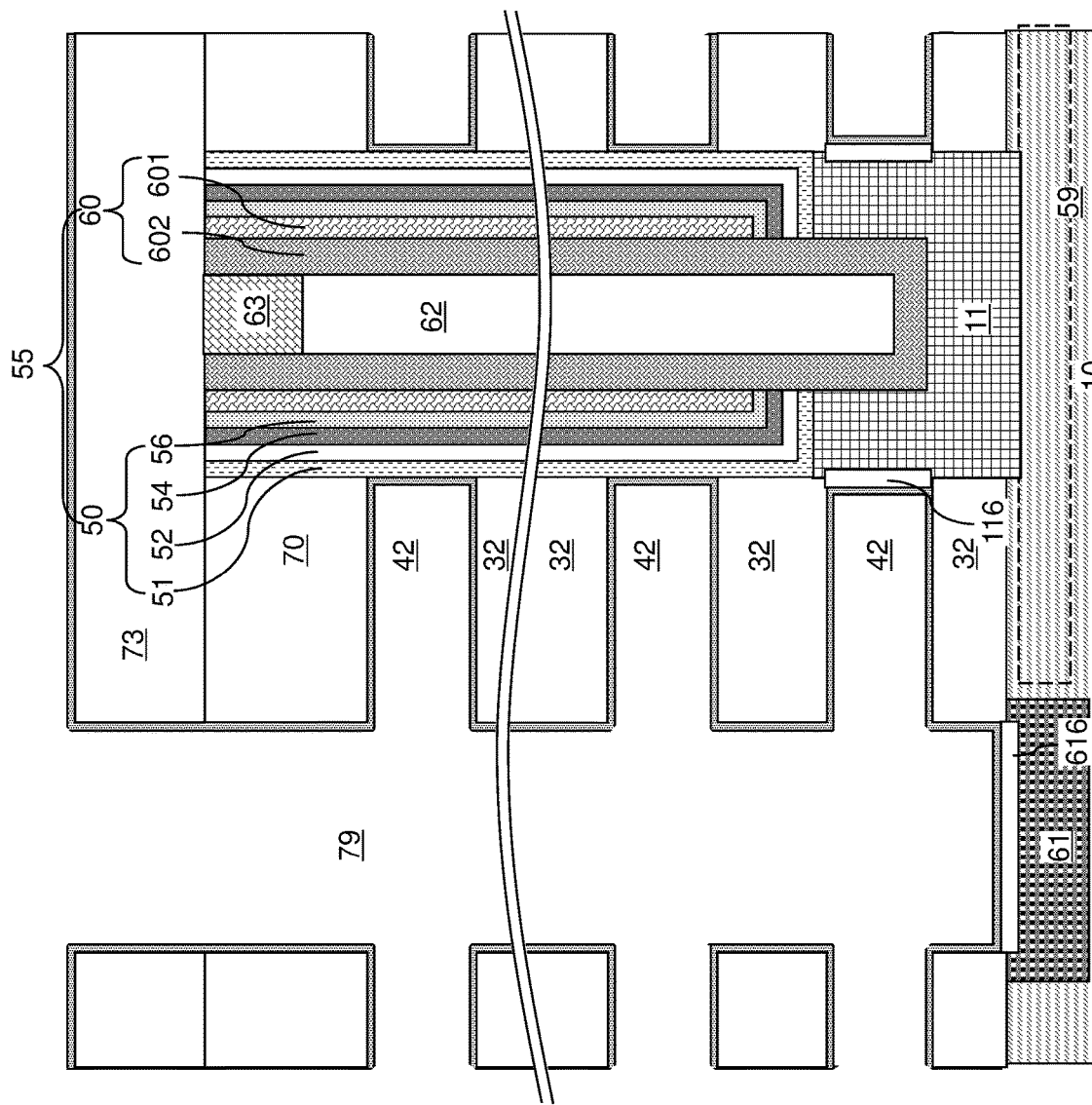

Referring to FIG. 10B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 10C:
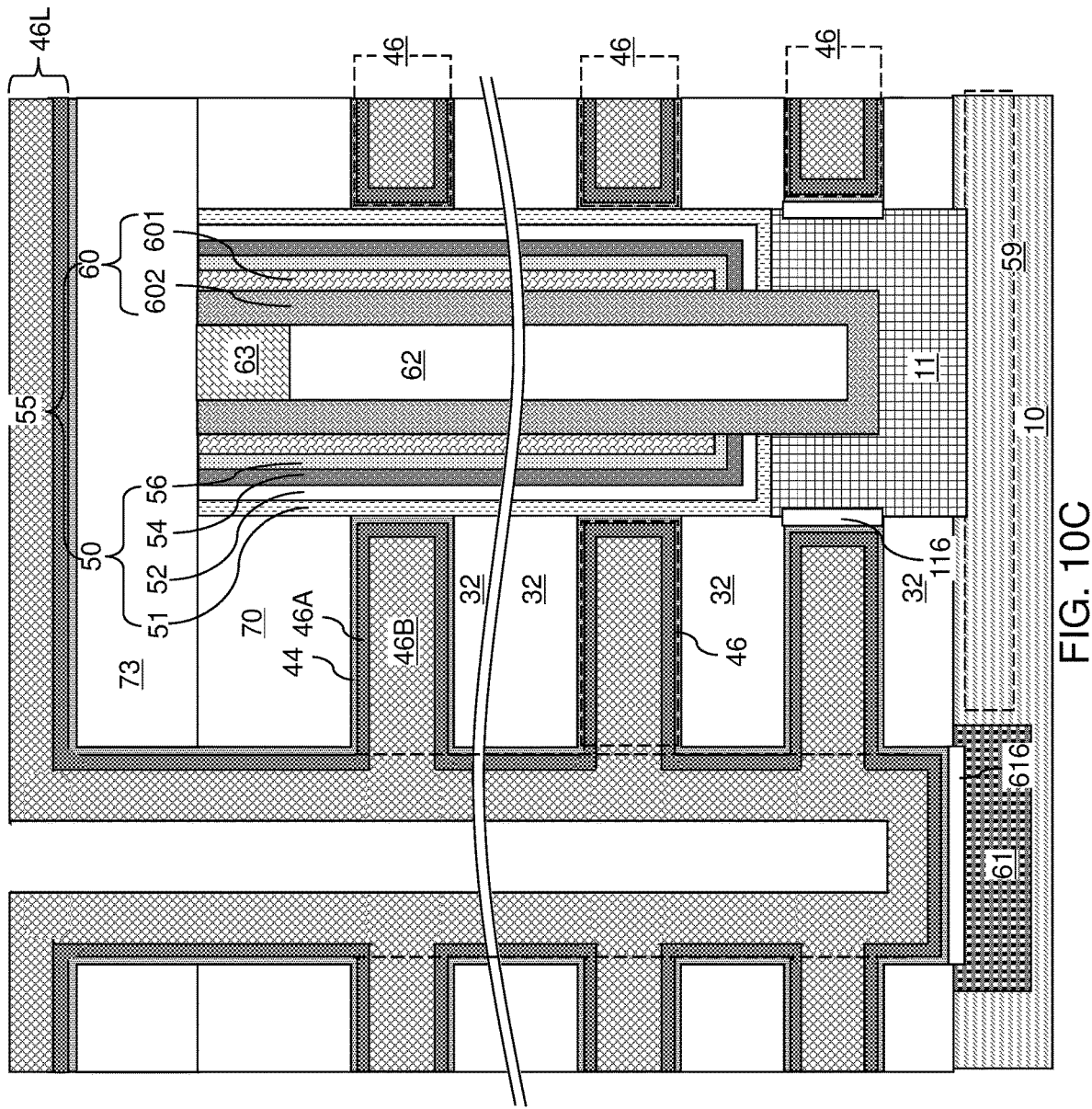

Referring to FIG. 10C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
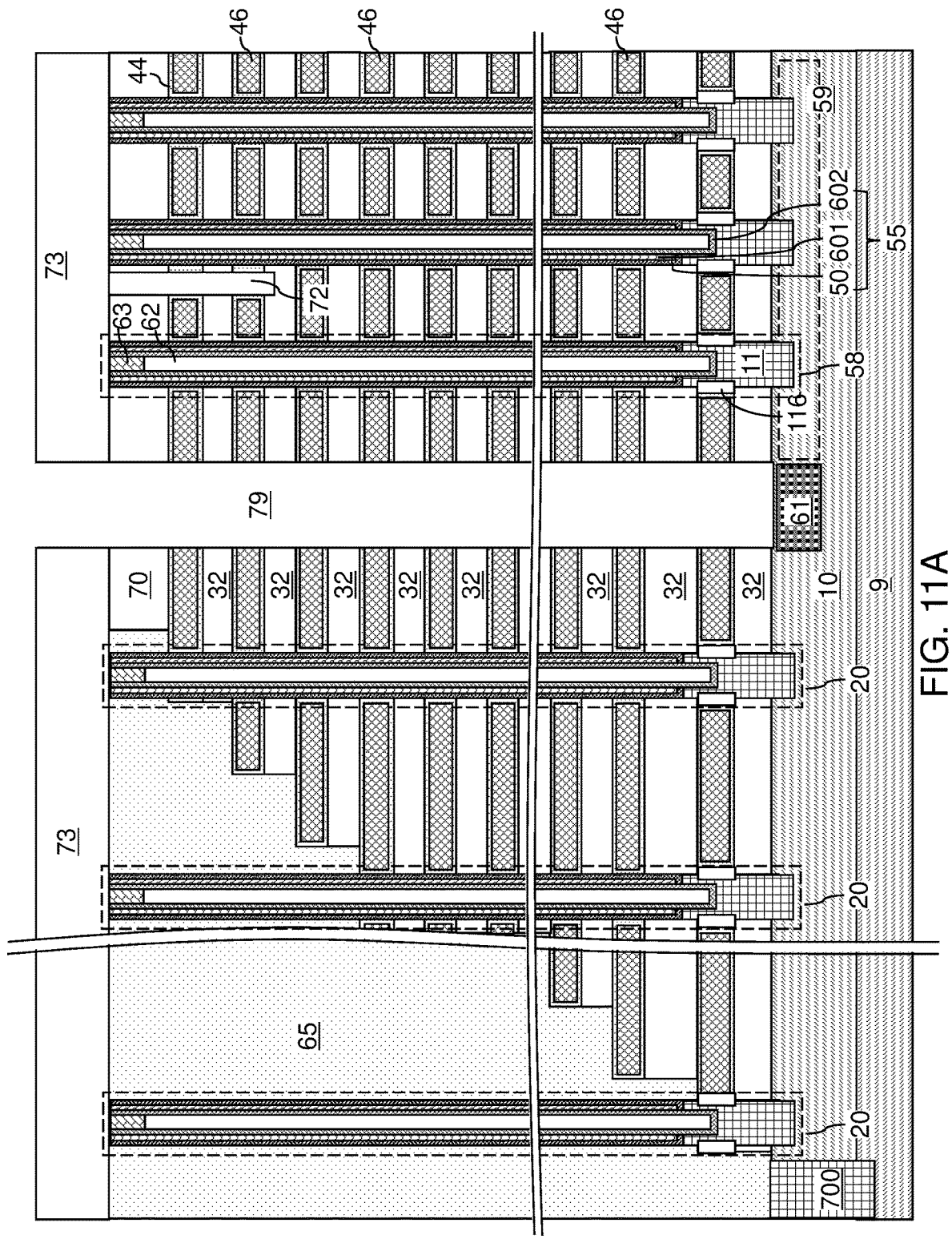
FIG. 11A is a schematic vertical cross-sectional view of the exemplary structure after removal of a continuous metallic material layer from inside backside trenches and from above a contact-level dielectric layer according to an embodiment of the present disclosure.
Figure 11B:
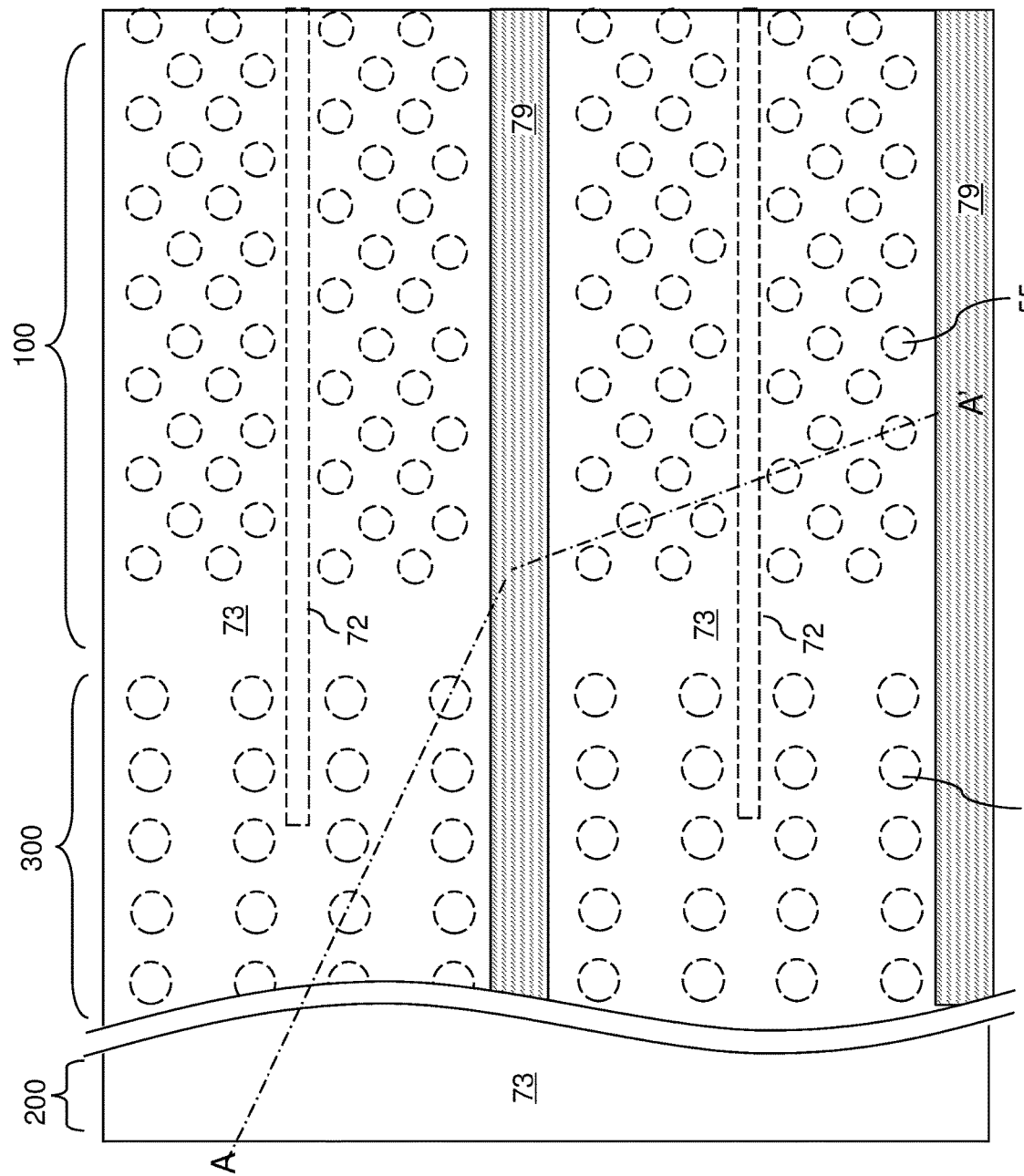
FIG. 11B is a partial see-through top-down view of the exemplary structure of FIG. 11A. The vertical plane A-A' is the plane of the schematic vertical cross-sectional view of FIG. 11A.
Figure 11C:
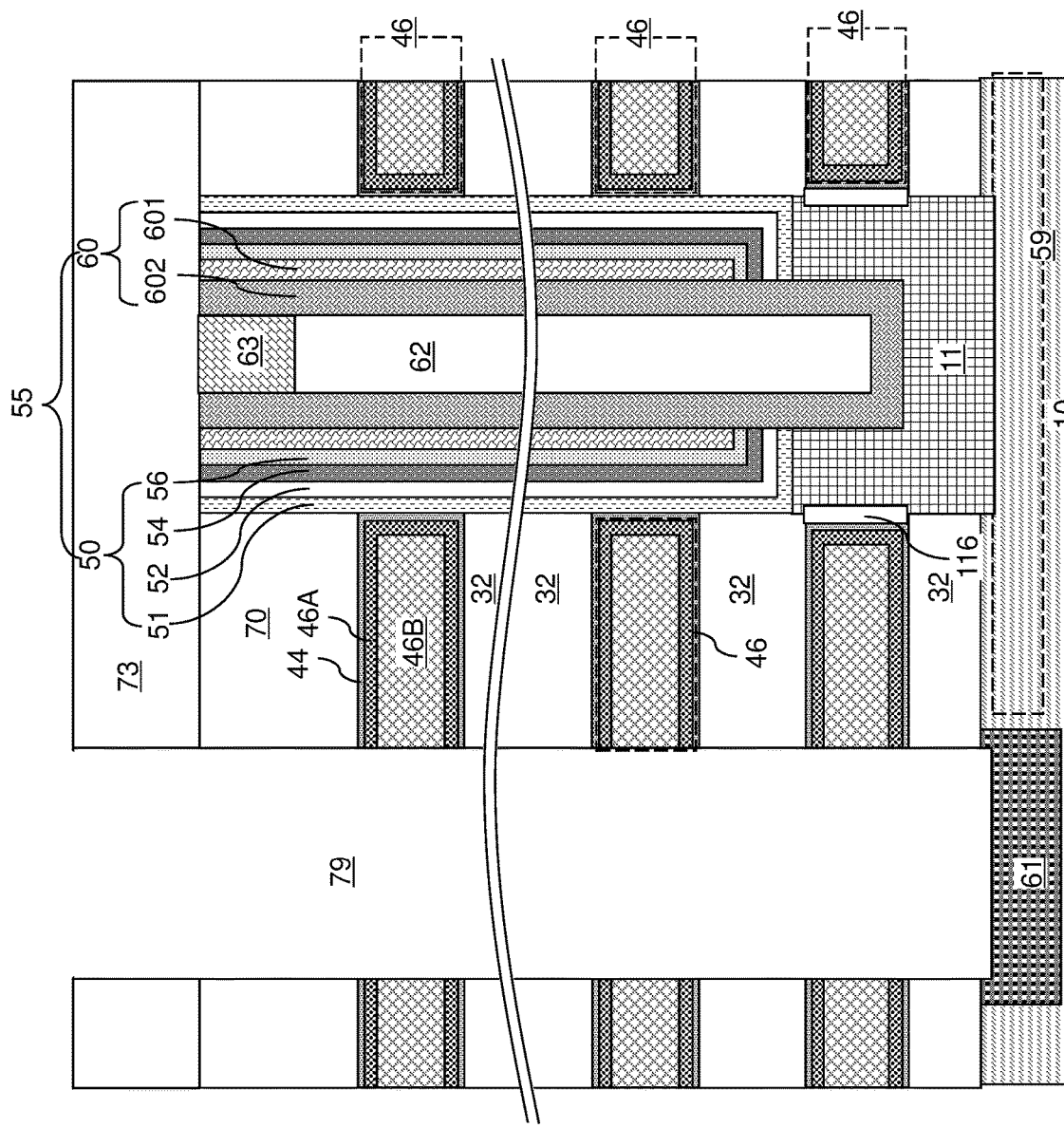
FIG. 11C is a schematic vertical cross-sectional view of the exemplary structure along the vertical plane C-C' of FIG. 11B.

Referring to FIGS. 11A-11C, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

At least one topmost electrically conductive layer 46 can comprise a drain side select gate electrode for the vertical NAND strings. At least one bottommost electrically conductive layer 46 can comprise a source side select gate electrode for the vertical NAND strings. Each source region 61 may be formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55. Each backside trench 79 vertically extends through each layer in the alternating stack (32, 46) down to a surface of the substrate (9, 10).

FIGS. 12A-12H are sequential schematic vertical cross-sectional views of a region of a first configuration of the exemplary structure during formation of a backside trench fill structure (74, 76) according to a first embodiment of the present disclosure.

Figure 12A:
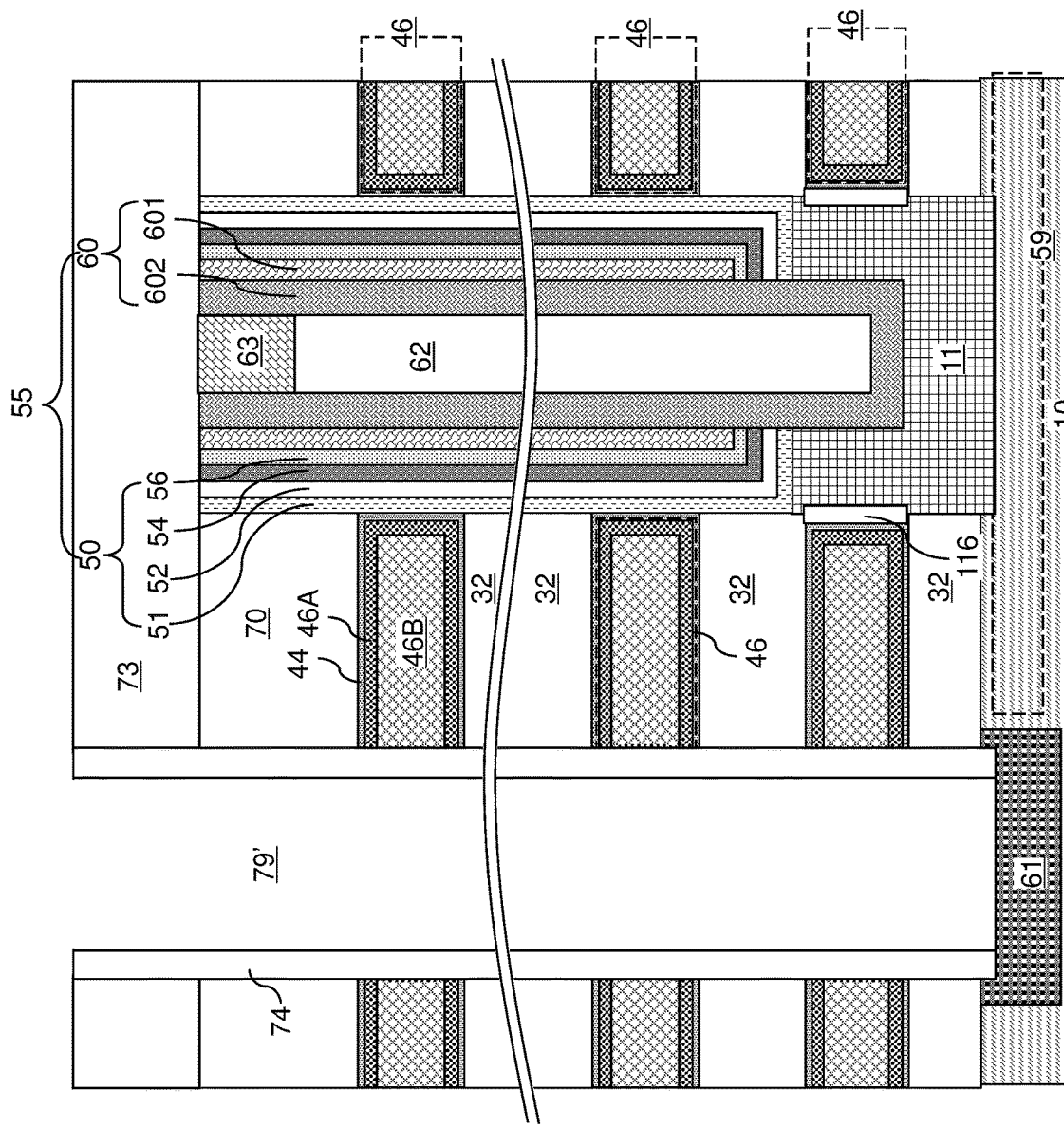
FIGS. 12A-12H are sequential schematic vertical cross-sectional views of a region of a first configuration of the exemplary structure during formation of a backside trench fill structure according to a first embodiment of the present disclosure.

Referring to FIG. 12A, an insulating material layer can be formed in the backside trenches 79 and over the contact-level dielectric layer 73 by a conformal deposition process. Exemplary conformal deposition processes include, but are not limited to, chemical vapor deposition oe atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 5 nm to 100 nm, although lesser and greater thicknesses can also be employed. In one embodiment, the insulating material layer can be formed directly on surfaces of the insulating layers 32, the electrically conductive layers 46, and the backside blocking dielectric layer 44.

An anisotropic etch is performed to remove horizontal portions of the insulating material layer from above the contact-level dielectric layer 73 and at the bottom of each backside trench 79. Each remaining portion of the insulating material layer constitutes a backside trench insulating spacer 74. Each backside trench insulating spacer 74 may be formed on a sidewall of a respective backside trench 79. A backside cavity 79' is present within a volume surrounded by each insulating spacer 74. A top surface of a source region 61 can be physically exposed at the bottom of each backside trench 79.

Figure 12B:
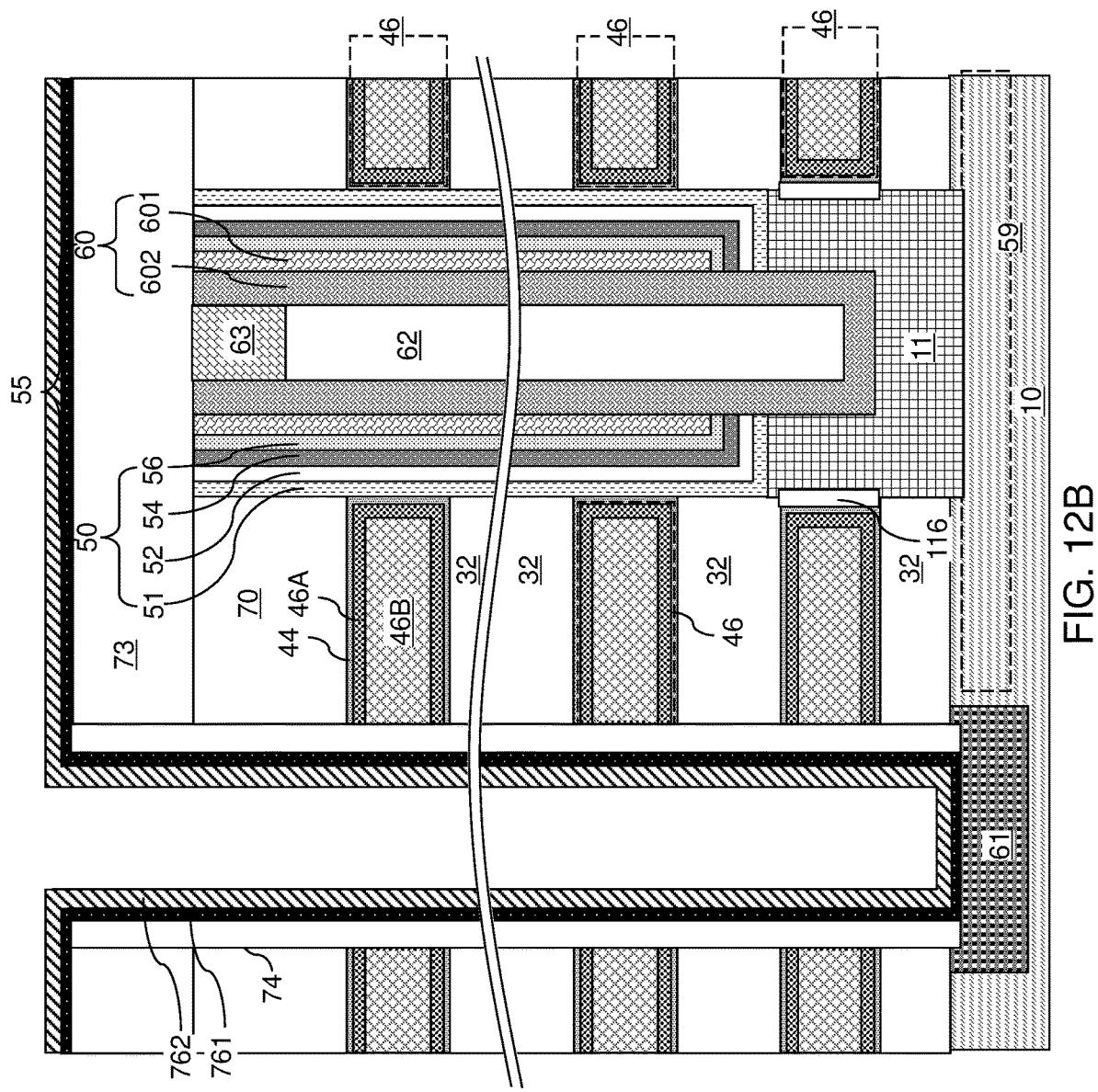

Referring to FIG. 12B, a first metallic nitride liner 761 can be formed on each backside trench insulating spacer 74 and over the contact-level dielectric layer 73. The first metallic nitride liner 761 includes a metallic material that provides a shorter incubation time for nucleation of a refractory metal, such as tungsten during a chemical vapor deposition or atomic layer deposition process than tungsten nitride. The first metallic nitride liner 761 comprises and/or consists essentially of a metal nitride other than tungsten nitride. The first metallic nitride liner 761 may comprise and/or may consist essentially of titanium nitride or tantalum nitride. In one embodiment, the first metallic nitride liner 761 may consist essentially of titanium nitride. The first metallic nitride liner 761 may be deposited by a conformal deposition process, such as a chemical vapor deposition process. The thickness of the first metallic nitride liner 761 may be in a range from 3 nm to 100 nm, such as from 6 nm to 50 nm, although lesser and greater thicknesses may also be employed.

A first metal layer 762 may be deposited by a conformal deposition process, such as a chemical vapor deposition or atomic layer deposition process. The first metal layer 762 comprises and/or consists essentially of a refractory metal which can be nitrided to form a metallic nitride material. For example, the first metal may be tungsten, titanium, tantalum, or molybdenum. In one embodiment, the first metal may be different from the metallic element within the first metallic nitride liner 761. In one embodiment, the first metal is tungsten. The first metal layer 762 can be formed directly on the inner sidewalls of the first metallic nitride liner 761 within each backside trench 79. The thickness of the first metal layer 762 may be in a range from 20 nm to 100 nm, such as from 30 nm to 80 nm, although lesser and greater thicknesses may also be employed.

Figure 12C:
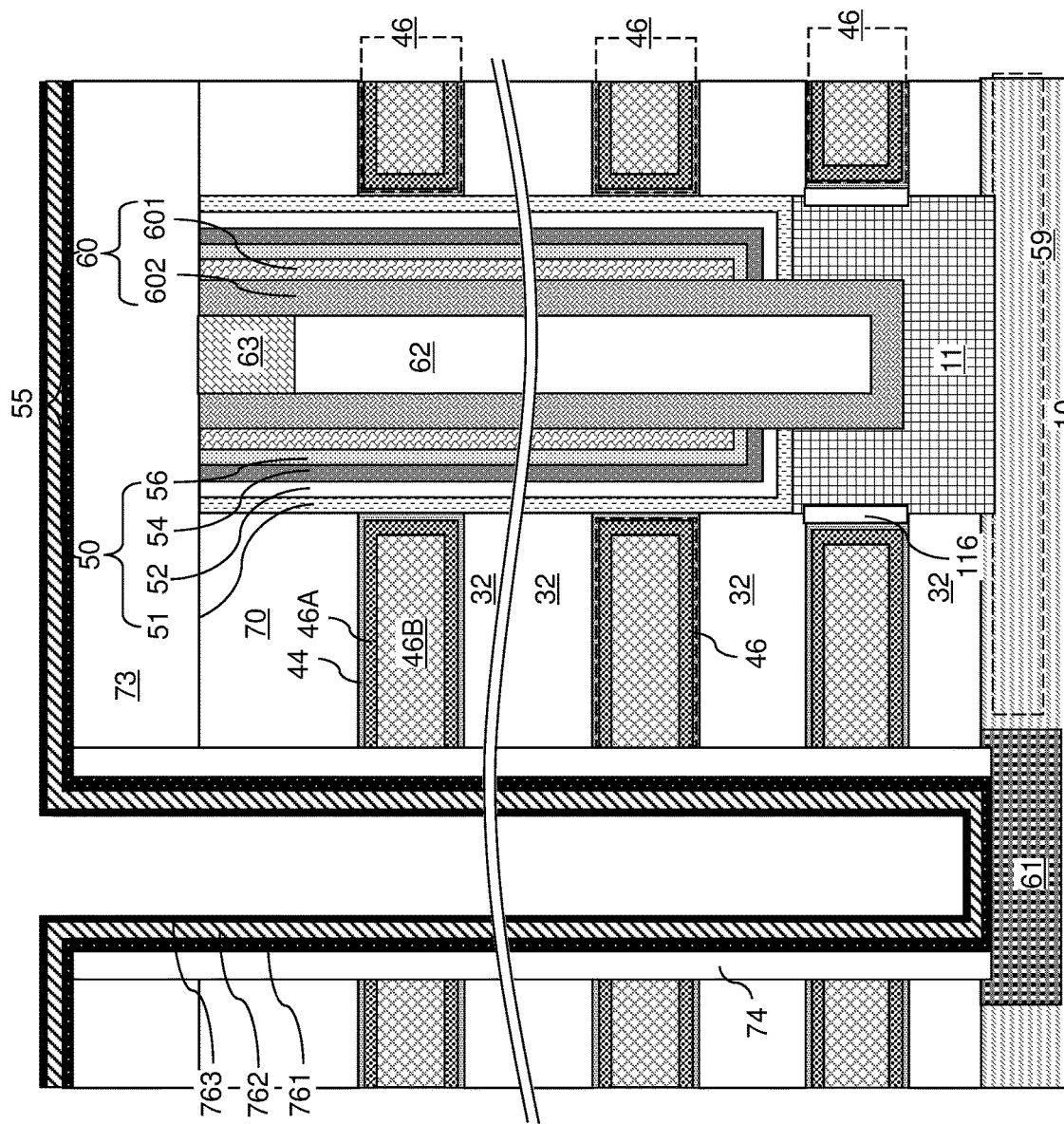

Referring to FIG. 12C, a second metallic nitride liner 763 comprising a metallic nitride of the first metal can be formed by nitriding a physically exposed surface portion of the first metal layer 762. The nitridation process may employ a plasma nitridation process or a thermal nitridation process. In one embodiment, the nitridation process may comprise a thermal nitridation process in which the exemplary structure is placed in a process chamber, and is subjected to an elevated temperature in an ammonia-containing ambient. The elevated temperature may be in a range from 400 degrees Celsius to 800 degrees Celsius, although lower and higher temperatures may also be employed. The nitridation process can form the second metallic nitride liner 763 on the first metal layer. The thickness of the second metallic nitride liner 763 may be in a range from 1 nm to 10 nm, although lesser and greater thicknesses may also be employed. Generally, the second metallic nitride liner 763 comprises a metallic nitride of the first metal of the first metal layer 762, and contacts an inner sidewall of the first metal layer 762. In one embodiment, the first metallic nitride liner 761 comprises titanium nitride, the first metal layer 762 comprises tungsten and the second metallic nitride liner 763 comprises tungsten nitride. The tungsten nitride liner is under compressive stress and induces a tensile stress on the substrate (9, 10).

Figure 12D:
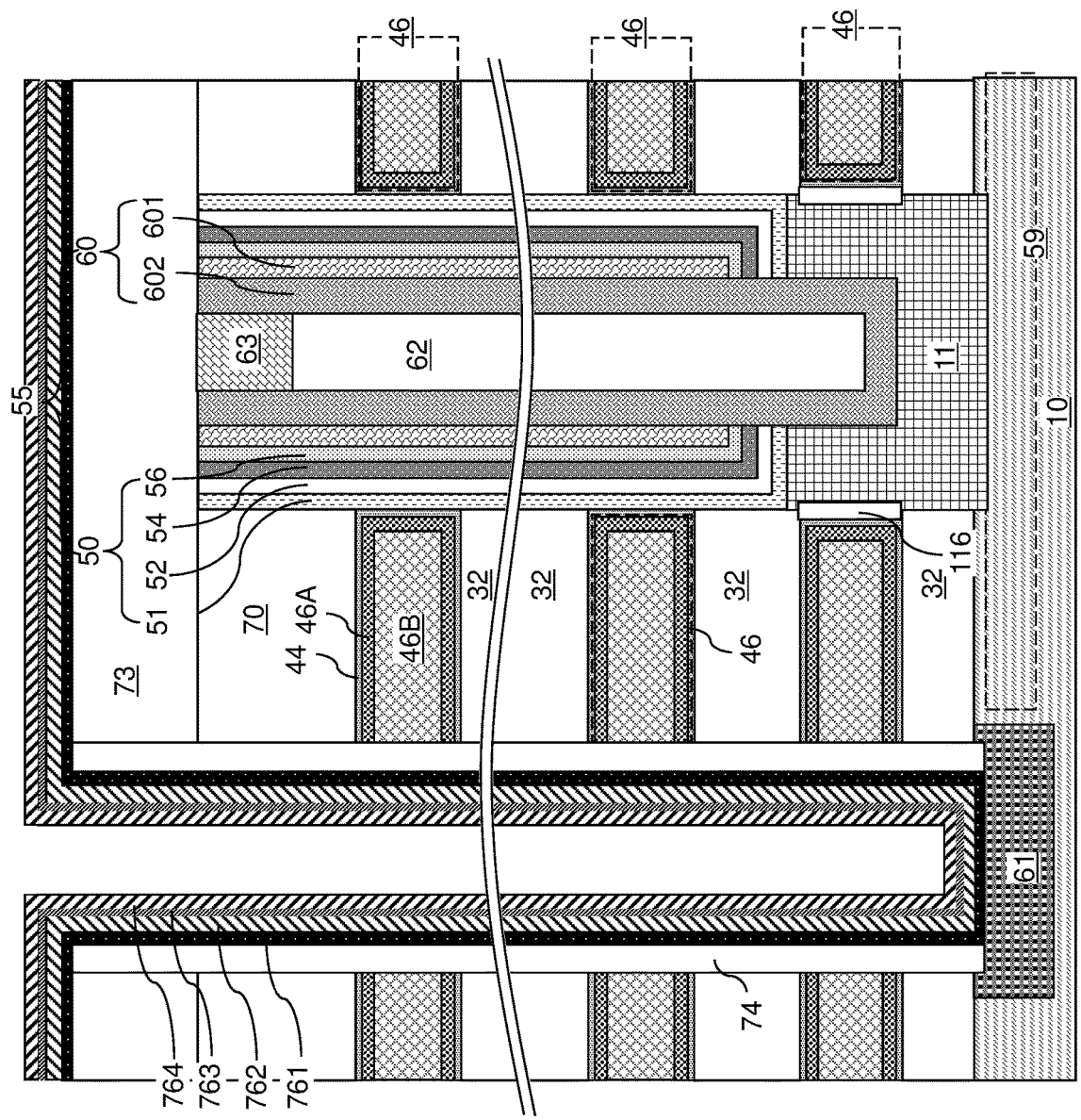

Referring to FIG. 12D, a second metal layer 764 can be deposited over the second metallic nitride liner 763. The second metal layer 764 includes a second refractory metal that can be conformally deposited over the second metallic nitride liner 763. The second metal layer 764 can be formed on the second metallic nitride liner 763 irrespective of the incubation time for a conformal deposition process (such as a chemical vapor deposition or atomic layer deposition process) by selecting a duration of the deposition process to be longer than the incubation time for the conformal deposition process. The second refractory metal may comprise tungsten, titanium, tantalum or molybdenum. In one embodiment, the second metal layer 764 comprises a second tungsten layer when the first metal layer 762 comprises a first tungsten layer. The thickness of the second metal layer 764 may be in a range from 3 nm to 200 nm, such as from 6 nm to 100 nm, although lesser and greater thicknesses may also be employed. The second metal layer 764 contacts an inner sidewall of the second metallic nitride liner 763.

Figure 12E:
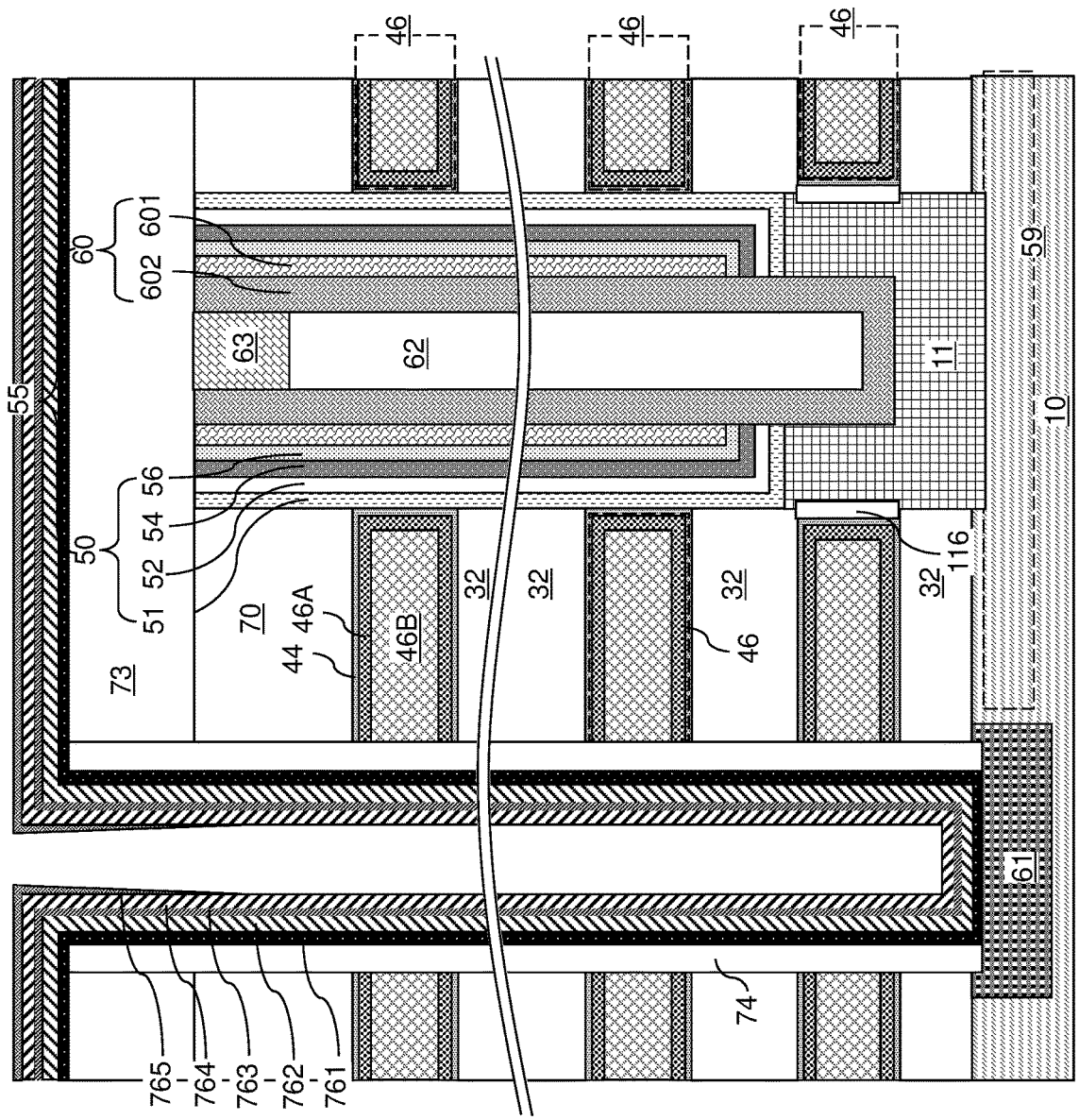

Referring to FIG. 12E, a metallic nitride material can be non-conformally deposited to form a non-conformal metallic nitride liner 765 over the second metallic nitride liner 763 and over the second metal layer 764. For example, a physical vapor deposition (PVD) process, a plasma enhanced chemical vapor deposition (PECVD) process or a diffusion limited ALD process can be employed to anisotropically deposit the metallic nitride material. Specifically, a relatively high pressure, relatively low power and pulsed plasma PECVD process may be used. The non-conformal metallic nitride liner 765 may have a horizontally-extending portion overlying the contact-level dielectric layer 73 and the alternating stack (32, 46), and tapered vertically-extending portions having a variable thickness in an upper portion of each of the backside trenches 79. Each tapered vertically-extending portion extends downward from a periphery of the horizontally-extending portion into a respective backside cavity located within a respective backside trench 79. The lateral thickness of the tapered vertically-extending portions of the non-conformal metallic nitride liner 765 decreases with a vertical distance from a horizontal plane including the bottom surface of the non-conformal metallic nitride liner 765.

In one embodiment, each tapered vertically-extending portion of the non-conformal metallic nitride liner 765 extends to 50% or less of the height of the backside trenches. In other words, the vertical extent of each tapered vertically-extending portion of the non-conformal metallic nitride liner 765 located below the horizontal plane including the top surface of the contact-level dielectric layer 73 is 50% or less, such as 5 to 20% of the height of the backside trenches 79. In one embodiment, the height of the backside trenches 79 equals the vertical distance between the horizontal plane including the top surface of the contact-level dielectric layer 73 and the horizontal plane including top surfaces of the source regions 61. In one embodiment, the maximum lateral thickness of the tapered vertically-extending portions of the non-conformal metallic nitride liner 765, as measured between an inner sidewall and an outer sidewall of a respective tapered vertically-extending portion, may be in a range from 3 nm to 60 nm, such as from 6 nm to 30 nm, although lesser and greater dimensions may also be employed.

The non-conformal metallic nitride liner 765 comprise a metallic nitride material, which generally provides a longer incubation time than an elemental metal during a chemical vapor deposition or atomic layer deposition process for depositing a refractory metal, such as tungsten. In one embodiment, the non-conformal metallic nitride liner 765 comprises a metallic nitride material, such as tungsten nitride. In one embodiment, the non-conformal metallic nitride liner 765 includes tungsten nitride, which provides a longer incubation time for a chemical vapor deposition or atomic layer deposition of tungsten than titanium nitride, tantalum nitride, or molybdenum nitride. In one embodiment, the non-conformal metallic nitride liner 765 consists essentially of tungsten nitride.

Figure 12F:
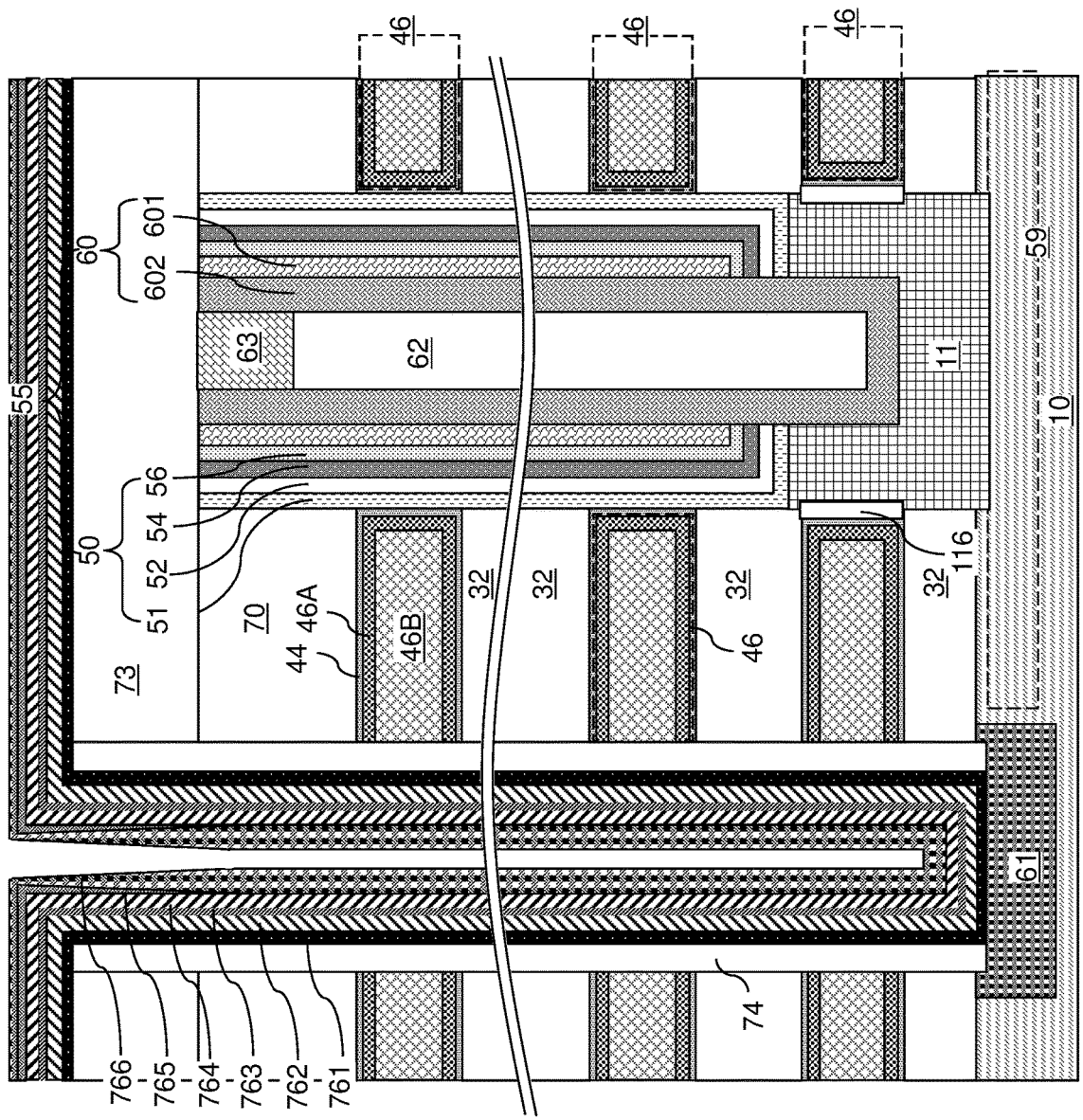

Referring to FIG. 12F, a core fill conductive material portion 766 can be formed by performing a deposition process having a surface-dependent incubation time that grows a core fill conductive material from surfaces of the second metal layer 764 (which include metallic surfaces located within the backside trenches 79 other than surfaces of the non-conformal metallic nitride liner 765) while suppressing growth of the core fill conductive material from the surfaces of the non-conformal metallic nitride liner 765. For example, the core fill conductive material portion 766 may comprise and/or may consist essentially of a refractory metal, such as tungsten, tantalum, titanium or molybdenum. In this case, the deposition process having a surface-dependent incubation time may comprise a chemical vapor deposition or atomic layer deposition process employing a metal-containing precursor gas such as a metal fluoride gas. In an illustrative example, the metal-containing precursor gas may be tungsten hexafluoride and core fill conductive material portion 766 consists essentially of tungsten. Thus, in one embodiment, the core fill conductive material portion 766 comprises a third tungsten layer.

Generally, the incubation time for deposition of the core fill conductive material on the surfaces of the non-conformal metallic nitride liner 765 is longer than the incubation time for deposition of the core fill conductive material on the surfaces of the second metal layer 764. During the deposition process, the lateral thickness (as measured between a growth surface and an outer sidewall) of the core fill conductive material portion 766 formed below the bottom edge of the non-conformal metallic nitride liner 765 within each backside trench 79 can be greater than the lateral thickness of the core fill conductive material portion 766 formed above the bottom edge of the non-conformal metallic nitride liner 765. In one embodiment, the laterally separated refractory metal layers (e.g., tungsten layers separated by tungsten nitride layers) result in a smaller metal (e.g., tungsten) grain size, which reduces the substrate (9, 10) warpage due to the stress imposed on the substrate by the core fill conductive material portion 766.

In one embodiment, the non-conformal metallic nitride liner 765 consists essentially of tungsten nitride, and the second metal layer 764 consists essentially of tungsten, titanium, tantalum or molybdenum. The core fill conductive material portion 766 may comprise, and/or may consist essentially of, a metal selected from tungsten, titanium, tantalum or molybdenum. In one embodiment, the second metal layer 764 consists essentially of tungsten, and the core fill conductive material portion 766 consists essentially of tungsten.

Figure 12G:
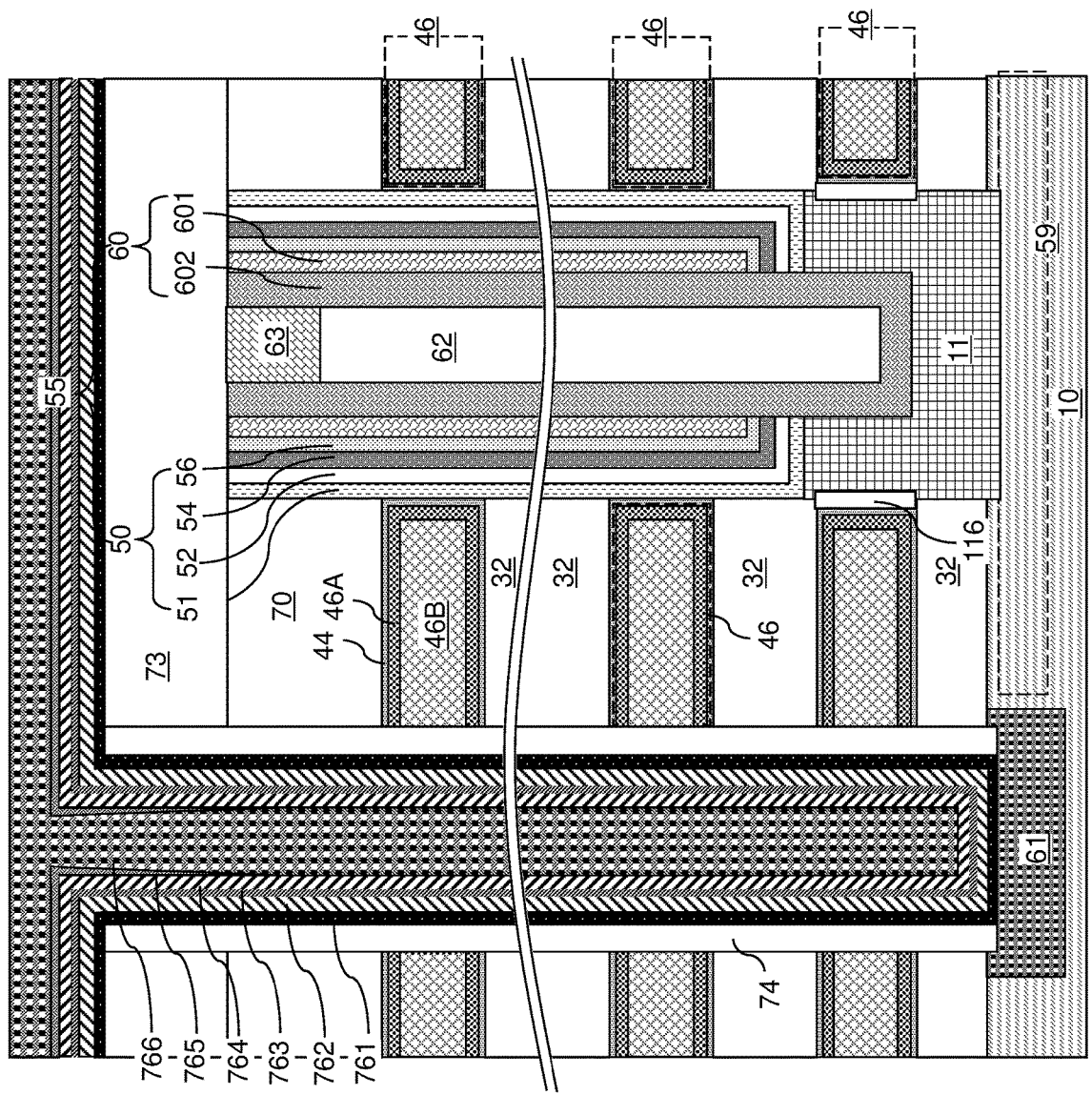

Referring to FIG. 12G, the deposition process that deposits the core fill conductive material portion 766 is continued until the backside trenches 79 are filled with the deposited conductive material portions. The difference in the incubation time for deposition of the core fill conductive material between the surfaces of the second metal layers 764 and the surfaces of the non-conformal metallic nitride liner 765 induces an increase in the amount of the deposited core fill conductive material at lower portions of the backside trenches 79 prior to formation of a seal at an upper portion of each backside trench 79. Thus, voids in a seam in the core fill conductive material portion 766 can be reduced or eliminated. The compressive stress induced on the substrate by the core fill conductive material portion 766 under tensile stress can be offset by the tensile stress induced on the substrate by the second metallic nitride liner 763, which further reduces substrate (9, 10) warping.

Figure 12H:
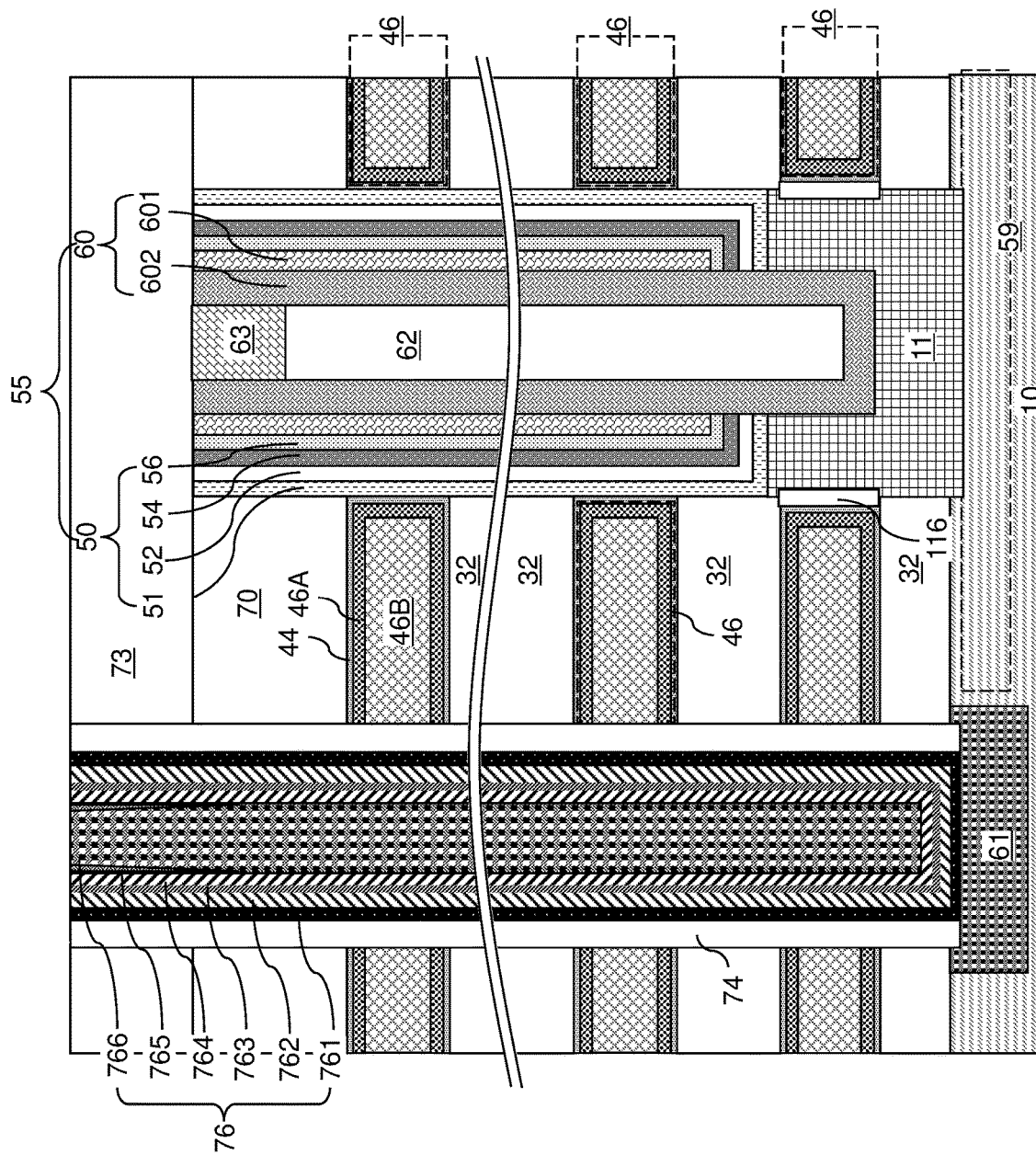

Referring to FIG. 12H, a planarization process can be performed to remove horizontally-extending portions of the conductive materials of the core fill conductive material portion 766, the non-conformal metallic nitride liner 765, the second metal layer 764, the second metallic nitride liner 763, the first metal layer 762, and the first metallic nitride liner 761 from above the horizontal plane including the top surface of the contact-level dielectric layer 73. The planarization process may employ a chemical mechanical polishing (CMP) process and/or a recess etch process. Generally, conductive material portions can be removed from above a horizontal plane that is located at, or above, a topmost surface of the alternating stack (32, 46). Remaining conductive material portions that fill the backside cavities constitute backside contact via structures 76.

Each remaining portion of the non-conformal metallic nitride liner 765 within a respective backside contact via structure 76 comprises a tapered vertically-extending liner, which is hereafter referred to as a tapered metallic nitride liner 765. Each tapered metallic nitride liner 765 has a tapered vertical profile such that a lateral thickness of the tapered metallic nitride liner 765 decreases with a vertical distance from a horizontal plane including a topmost surface of the backside contact via structure 76. Each tapered metallic nitride liner 765 has a vertical extent that is less than the vertical extent of the first and the second metallic nitride liners 761 and 763. Each tapered metallic nitride liner 765 is located inside the second metallic nitride liner 763 of the respective backside contact via structure 76. Each tapered metallic nitride liner 765 contacts an upper portion of an inner sidewall of the second metal layer 764 of the respective backside contact via structure 76. In one embodiment, the vertical extent of each tapered metallic nitride liner 765 is 50% or less, such as 20% or less of the height of the backside contact via structures 76.

Figure 12I:
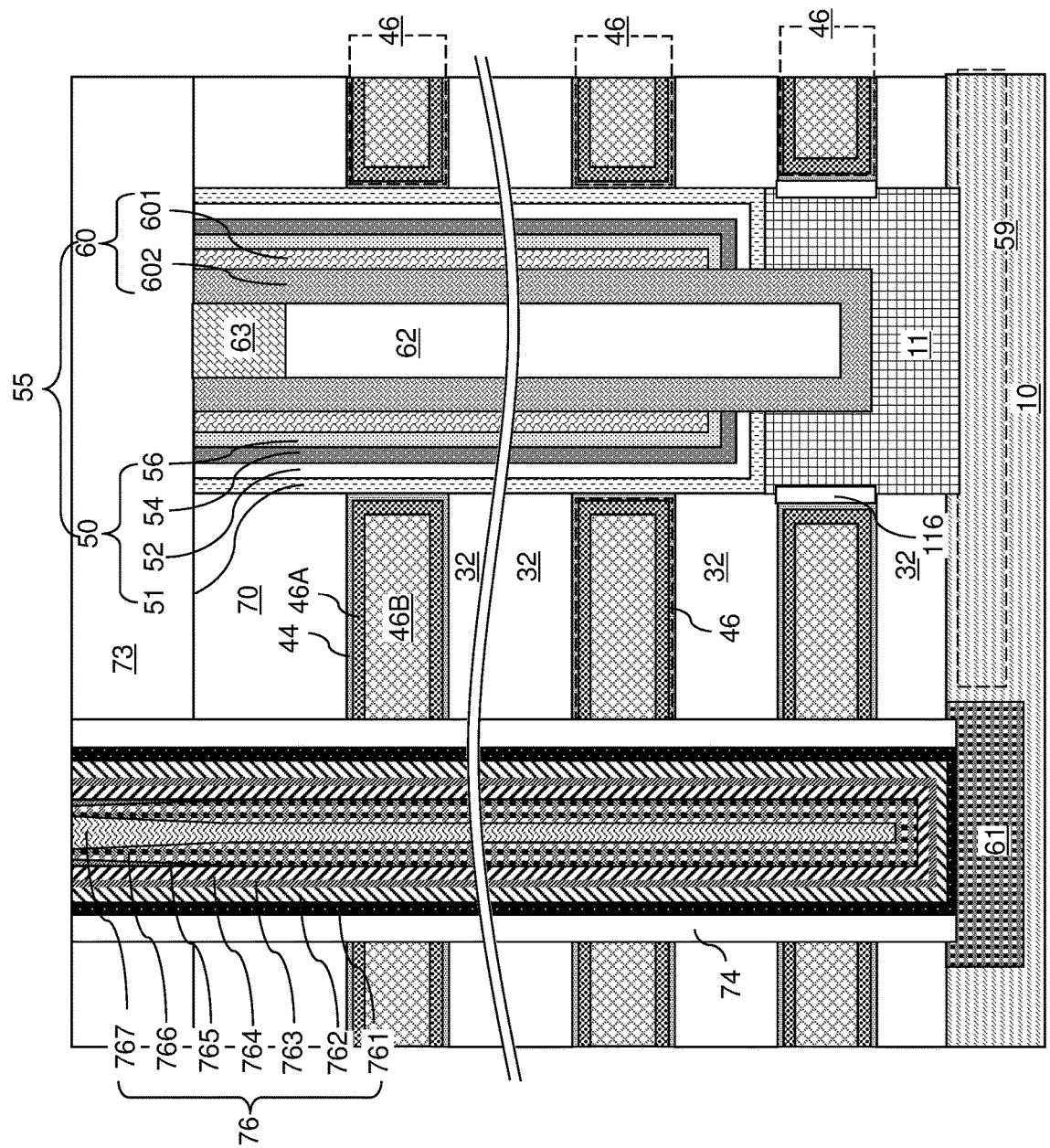
FIG. 12I is a schematic vertical cross-sectional view of a region of an alternative configuration of the exemplary structure after formation of a backside trench fill structure according to the first embodiment of the present disclosure.

Referring to FIG. 12I, an alternative configuration of the exemplary structure can be derived from the first configuration of the exemplary structure illustrated in FIG. 12G by depositing two different core fill conductive materials in unfilled volumes of the backside trenches 79. In this case, the core fill conductive material portion 766 as illustrated in FIG. 12G is hereafter referred to as a first core fill conductive material portion 766. The additional core fill conductive material portion that is subsequently deposited on the first core fill conductive material portion 766 is herein referred to as a second core fill conductive material portion 767.

Subsequently, the processing steps of FIG. 12H can be performed to remove horizontally-extending portions of the conductive materials of the second core fill conductive material portion 767, the first core fill conductive material portion 766, the non-conformal metallic nitride liner 765, the second metal layer 764, the second metallic nitride liner 763, the first metal layer 762, and the first metallic nitride liner 761 from above the horizontal plane including the top surface of the contact-level dielectric layer 73.

Each backside contact via structure 76 comprises a first core fill conductive material portion 766 contacting a tapered metallic nitride liner 765, and a second core fill conductive material portion 767 embedded within the first core fill conductive material portion 766 and laterally spaced from the tapered metallic nitride liner 765 by the first core fill conductive material portion 766. In one embodiment, the first core fill conductive material portion 766 has a variable lateral thickness in a region that is laterally surrounded by the tapered metallic nitride liner 765. In one embodiment, a lateral distance between an inner sidewall and an outer sidewall of the first core fill conductive material portion 766 is greater in a region that underlies the tapered metallic nitride liner 765 than at a horizontal plane including a top surface of the tapered metallic nitride liner 765.

FIGS. 13A-13D are sequential vertical cross-sectional views of a region of a second configuration of the exemplary structure during formation of a backside trench fill structure (74, 76) according to a second embodiment of the present disclosure. In the second embodiment, the second metal layer 764 is omitted.

Figure 13A:
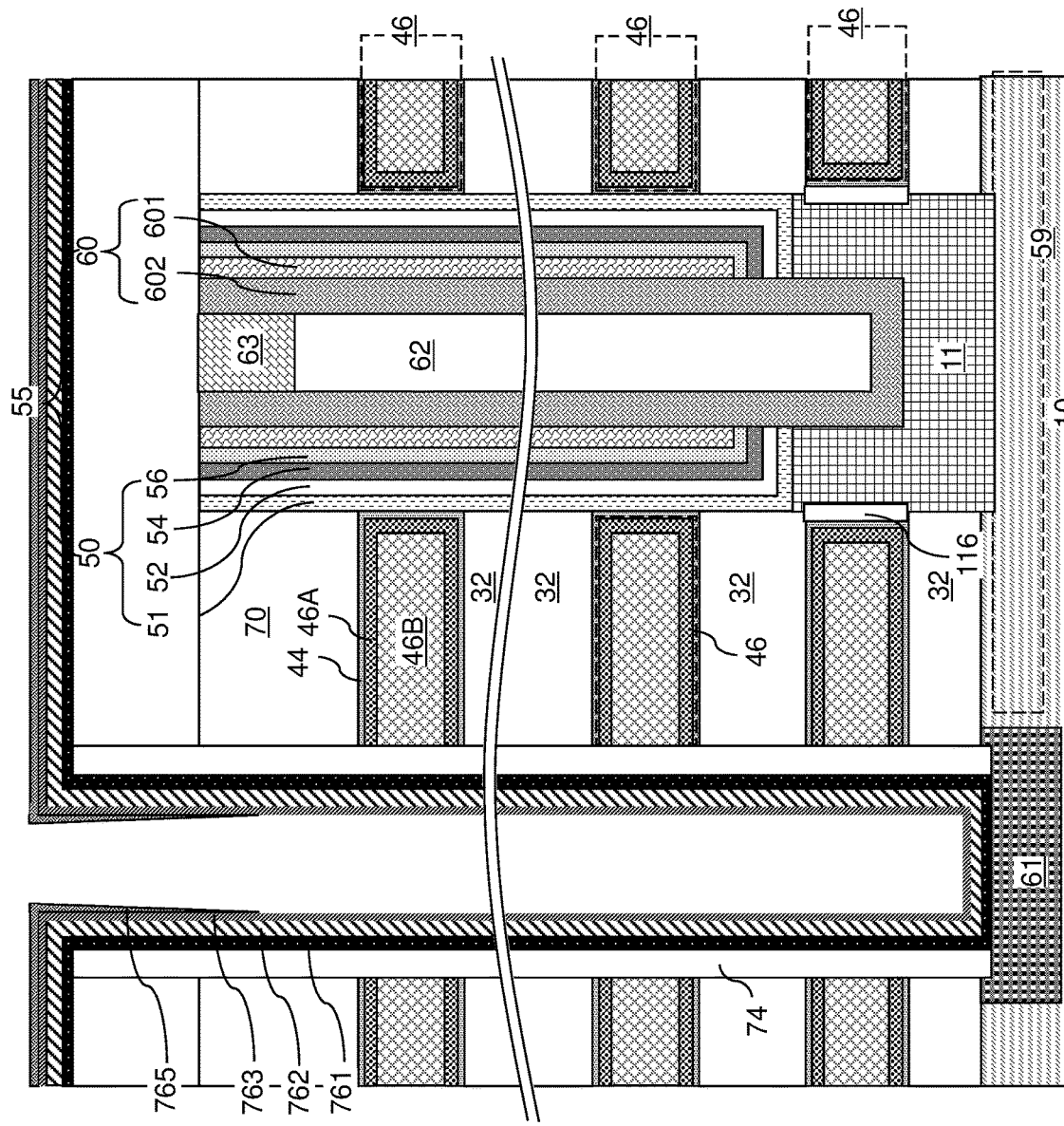
FIGS. 13A-13C are sequential vertical cross-sectional views of a region of a second configuration of the exemplary structure during formation of a backside trench fill structure according to a second embodiment of the present disclosure.

Referring to FIG. 13A, the second configuration of the exemplary structure can be derived from the first configuration of the exemplary structure illustrated in FIG. 12C by omitting the second metal layer 764 deposition of FIG. 12D and by performing the processing steps of FIG. 12E after the step shown in FIG. 12C. In other word, the non-conformal metallic nitride liner 765 can be formed directly on an upper portion of an inner sidewall of the second metallic nitride liner 763 and over the top surface of the horizontally-extending portion of the second metallic nitride liner 763.

Figure 13B:
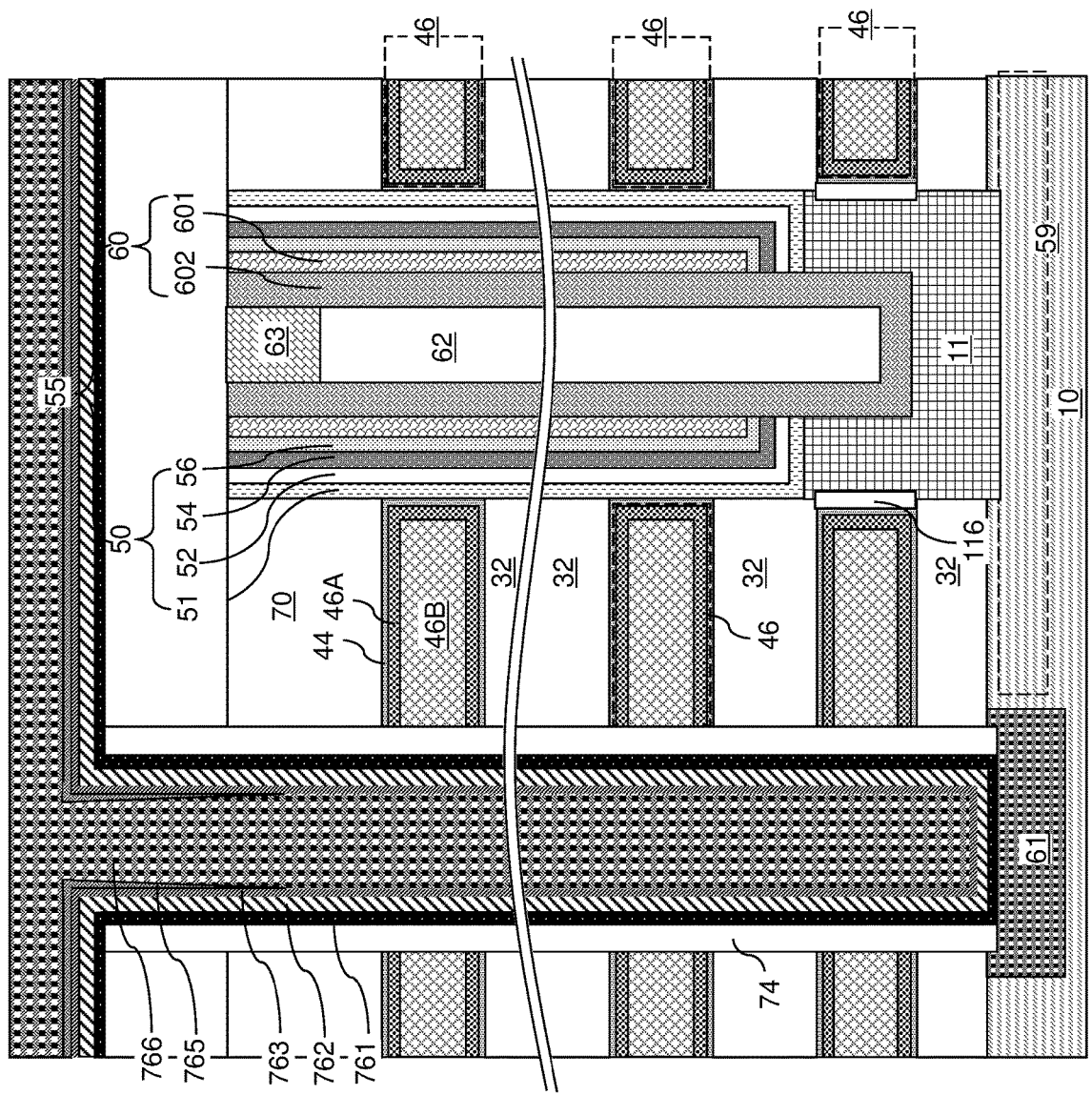

Referring to FIG. 13B, the core fill conductive material portion 766 can be formed by CVD or ALD, as described above. The core fill conductive material portion 766 can comprise tungsten, which has a relatively small grain size as described above.

Figure 13C:
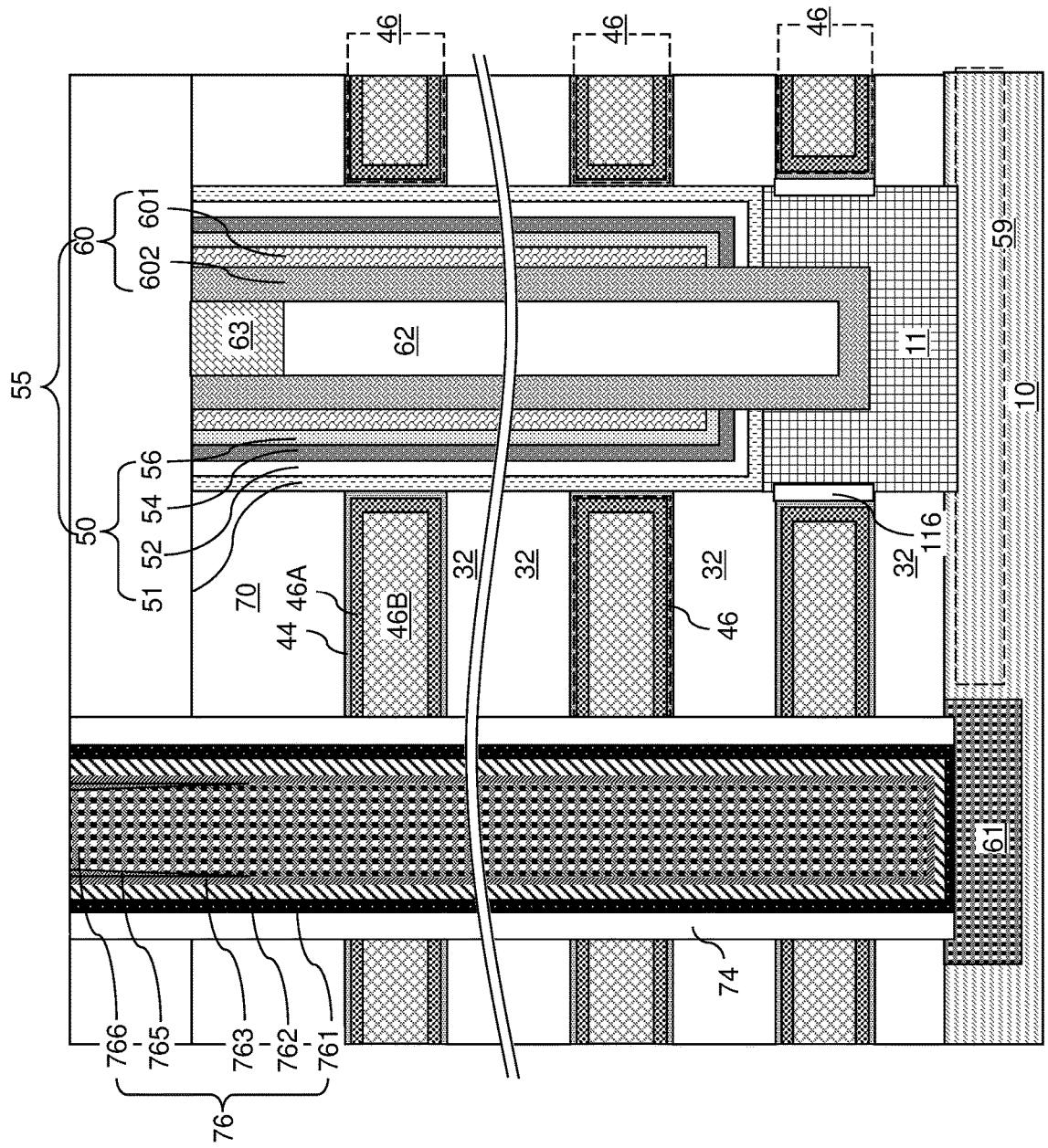

Referring to FIG. 13C, a planarization process can be performed to remove horizontally-extending portions of the conductive materials of the core fill conductive material portion 766, the non-conformal metallic nitride liner 765, the second metallic nitride liner 763, the first metal layer 762, and the first metallic nitride liner 761 from above the horizontal plane including the top surface of the contact-level dielectric layer 73. The planarization process may employ a chemical mechanical polishing (CMP) process and/or a recess etch process. Generally, conductive material portions can be removed from above a horizontal plane that is located at, or above, a topmost surface of the alternating stack (32, 46). Remaining conductive material portions that fill the backside cavities constitute backside contact via structures 76.

Figure 13D:
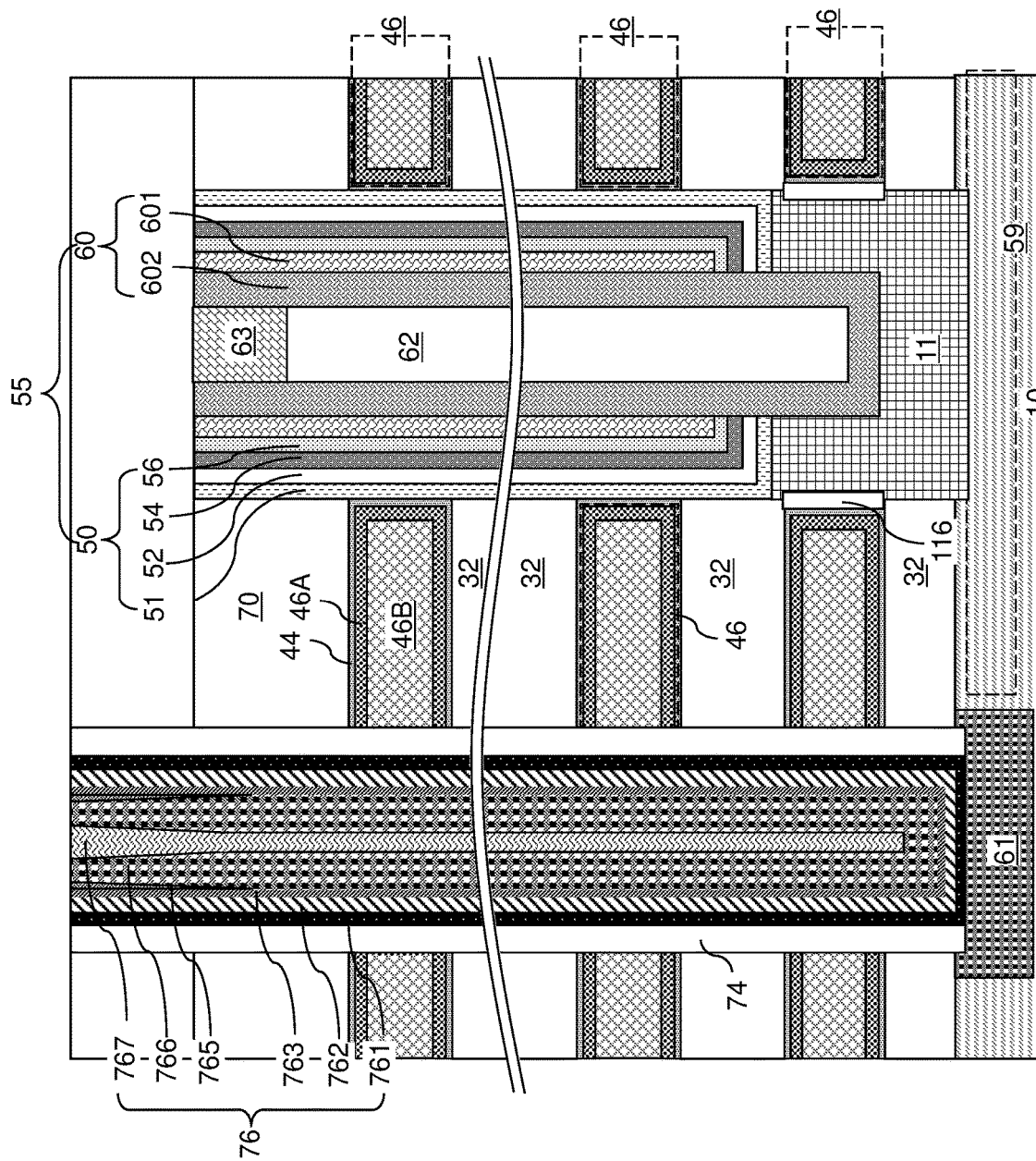
FIG. 13D is a schematic vertical cross-sectional view of a region of an alternative configuration of the exemplary structure after formation of a backside trench fill structure according to the second embodiment of the present disclosure.

Referring to FIG. 13D, an alternative configuration of the exemplary structure can be derived from the second configuration of the exemplary structure illustrated in FIG. 13B by depositing two different core fill conductive material portions in the backside trenches 79. In this case, the core fill conductive material portion 766 as illustrated in FIG. 13B is hereafter referred to as a first core fill conductive material portion 766. The additional core fill conductive material portion that is subsequently deposited on the first core fill conductive material portion 766 is herein referred to as a second core fill conductive material portion 767.

Subsequently, the processing steps of FIG. 13C can be performed to remove horizontally-extending portions of the conductive materials of the second core fill conductive material portion 767, the first core fill conductive material portion 766, the non-conformal metallic nitride liner 765, the second metal layer 764, the second metallic nitride liner 763, the first metal layer 762, and the first metallic nitride liner 761 from above the horizontal plane including the top surface of the contact-level dielectric layer 73.

Figure 14:
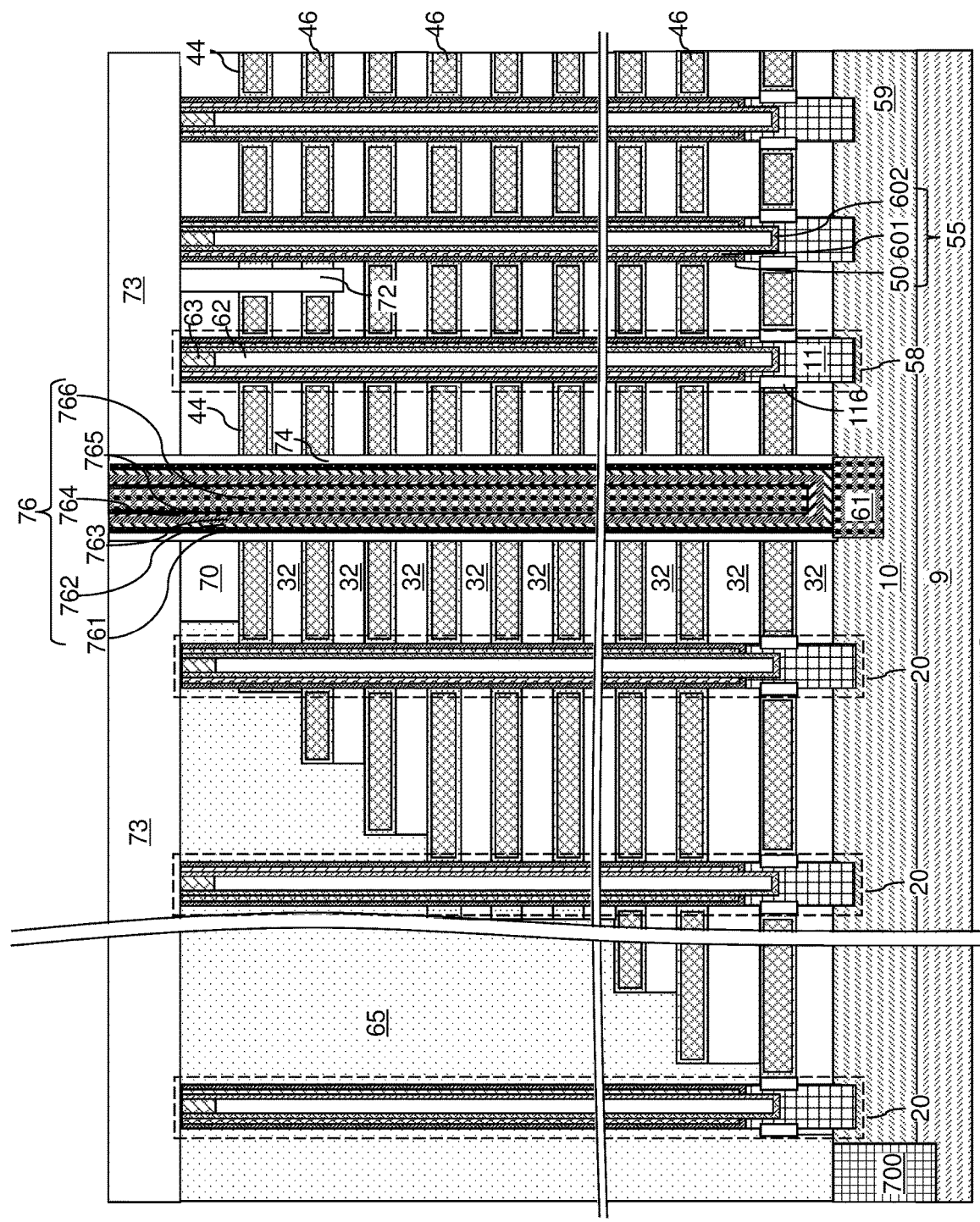
FIG. 14 is a schematic vertical cross-sectional view of the exemplary structure after formation of the backside trench fill structures according to the first embodiment of the present disclosure.

Referring to FIG. 14, the exemplary structure is illustrated after formation of backside trench fill structures (74, 76). The backside trench fill structures (74, 76) may have any configuration illustrated in FIG. 12H, 12I, 13C, 13D, or any of the alternative configurations to be described hereafter.

Figure 15A:
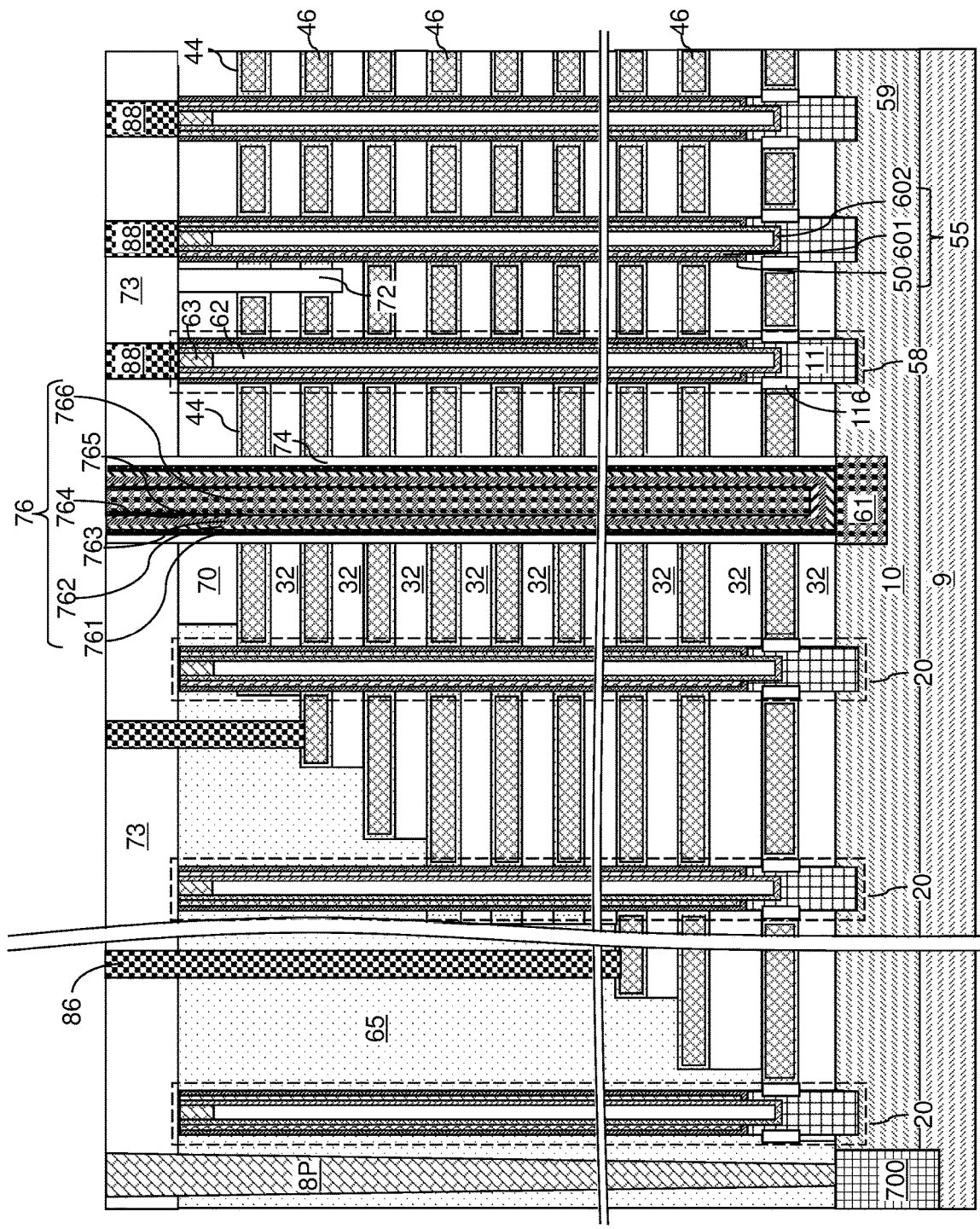
FIG. 15A is a schematic vertical cross-sectional view of the exemplary structure after formation of the various contact via structures according to the first embodiment of the present disclosure.
Figure 15B:
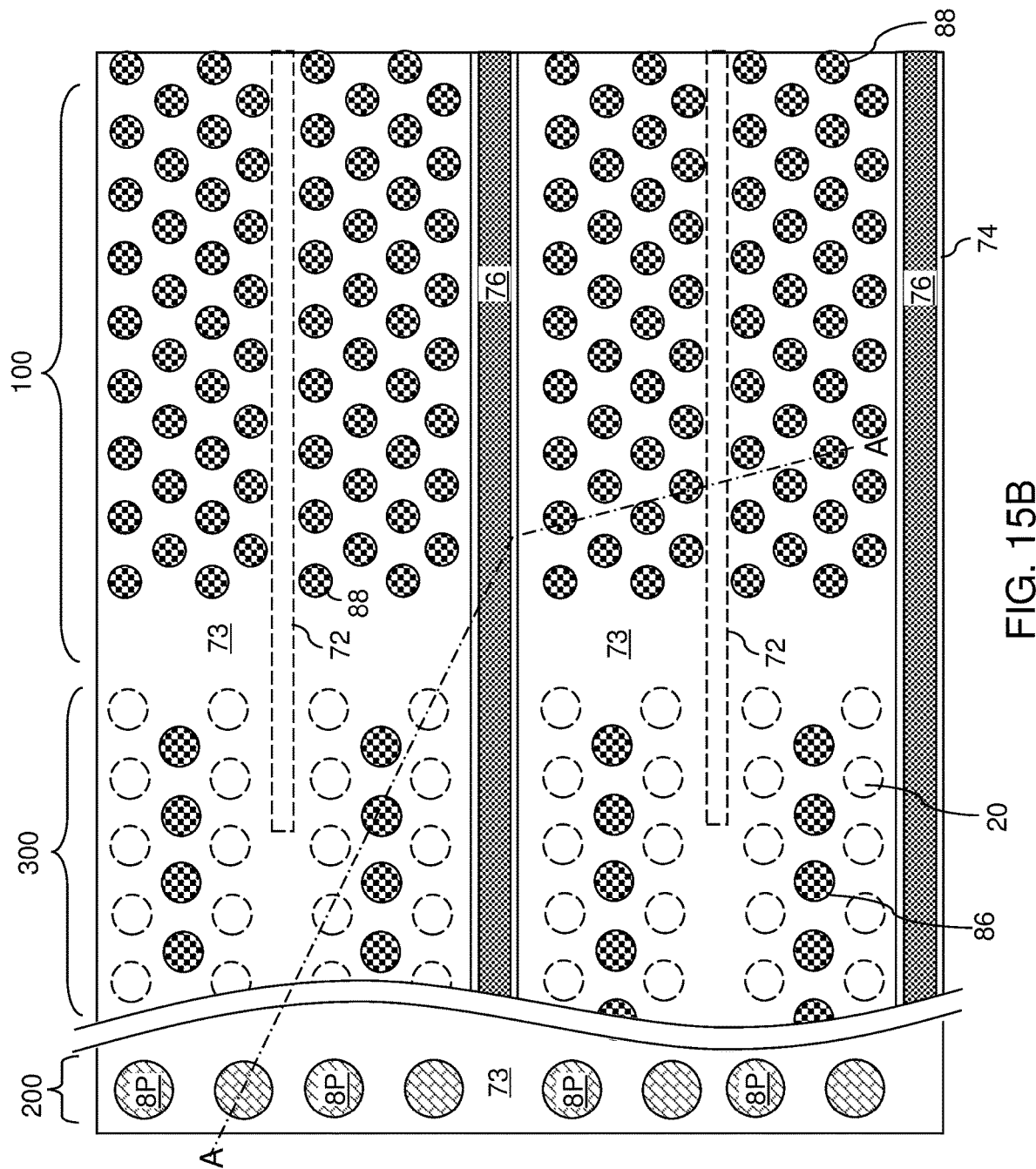
FIG. 15B is a partial see-through top-down view of the exemplary structure of FIG. 15A. The vertical plane A-A' is the plane of the schematic vertical cross-sectional view of FIG. 15A.

Referring to FIGS. 15A and 15B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

The sidewalls of the backside trenches 79 may be formed with a straight profile or with a contoured profile at the processing steps of FIGS. 7A and 7B. While the first and second embodiments are described employing backside trenches 79 having straight sidewalls, the third embodiment includes backside trenches 79 having contoured sidewalls.

Figure 16:
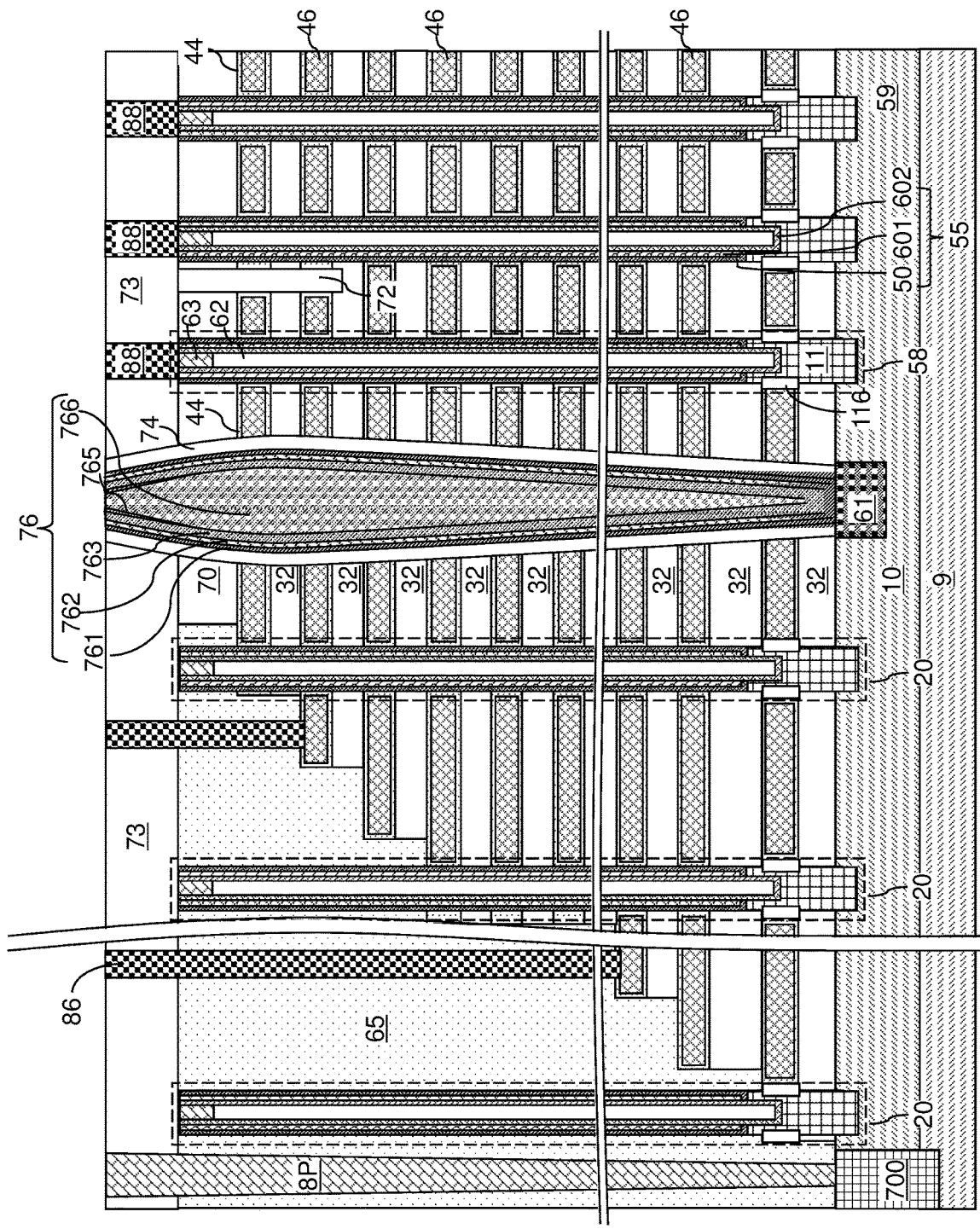
FIG. 16 is a schematic vertical cross-sectional view of a third configuration of the exemplary structure after formation of the various contact via structures according to a third embodiment of the present disclosure.

Referring to FIG. 16, a third configuration of the exemplary structure according to the third embodiment of the present disclosure may be derived from the first or second embodiments by forming backside trenches 79 having contoured sidewalls. In this case, the sidewalls of the backside trenches 79 may be formed with a respective profile, such as a concave profile in which a middle portion of each backside trench 79 has a width that is greater than a width of a top portion and is greater than a width of a bottom portion. In some embodiments, voids (i.e., unfilled cavities) may be present within a core fill conductive material portion 766 or within a second core fill conductive material portion 767 (if present). FIG. 16 shows the exemplary structure with contoured backside trench sidewalls which omits the second metal layer 764 of the first embodiment for clarity. However, it should be understood that the second metal layer 764 may be located on the second metallic nitride liner 763 in the exemplary structure with contoured backside trench sidewalls, as described above with respect to the first embodiment.

FIGS. 17A-17F are sequential schematic vertical cross-sectional view of a fourth configuration of the exemplary structure during formation of backside trench fill structures (74, 76) and contact via structures (88, 86, 8P) according to a fourth embodiment of the present disclosure.

Figure 17A:
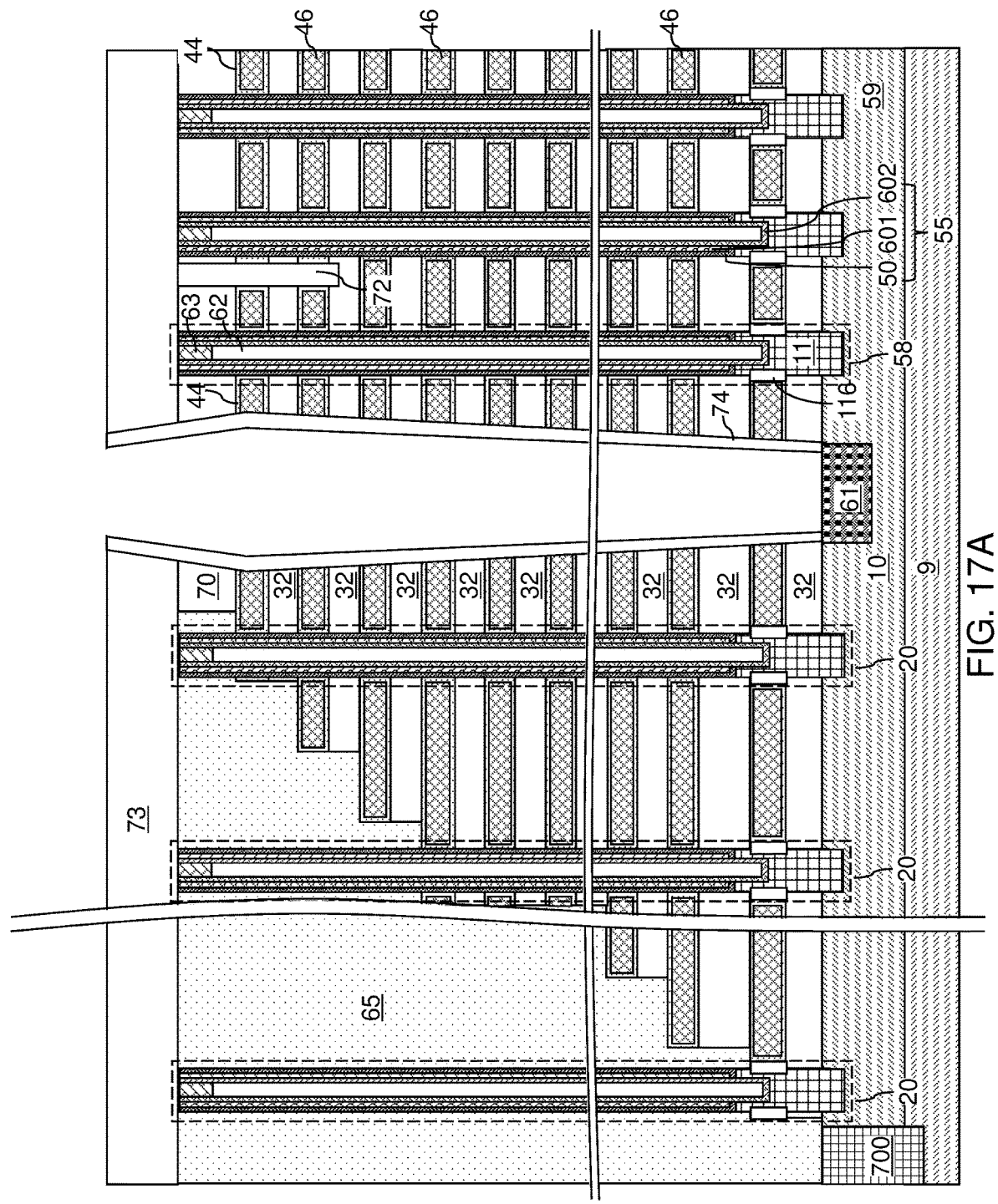
FIGS. 17A-17F are sequential schematic vertical cross-sectional view of a fourth configuration of the exemplary structure during formation of backside trench fill structures and contact via structures according to fourth embodiment of the present disclosure.

Referring to FIG. 17A, the fourth configuration of the exemplary structure is illustrated after formation of a backside trench insulating spacer 74 within each backside trench 79. The processing steps of FIG. 17A corresponds to the processing steps of FIG. 12A. While the sidewalls of the backside trenches 79 illustrated in FIG. 17A have concave profiles, embodiments are expressly contemplated herein in which the sidewalls of the backside trenches 79 have different profiles, which include, but are not limited to, straight vertical profiles, straight tapered profiles, and other types of vertical cross-sectional profiles.

Figure 17B:
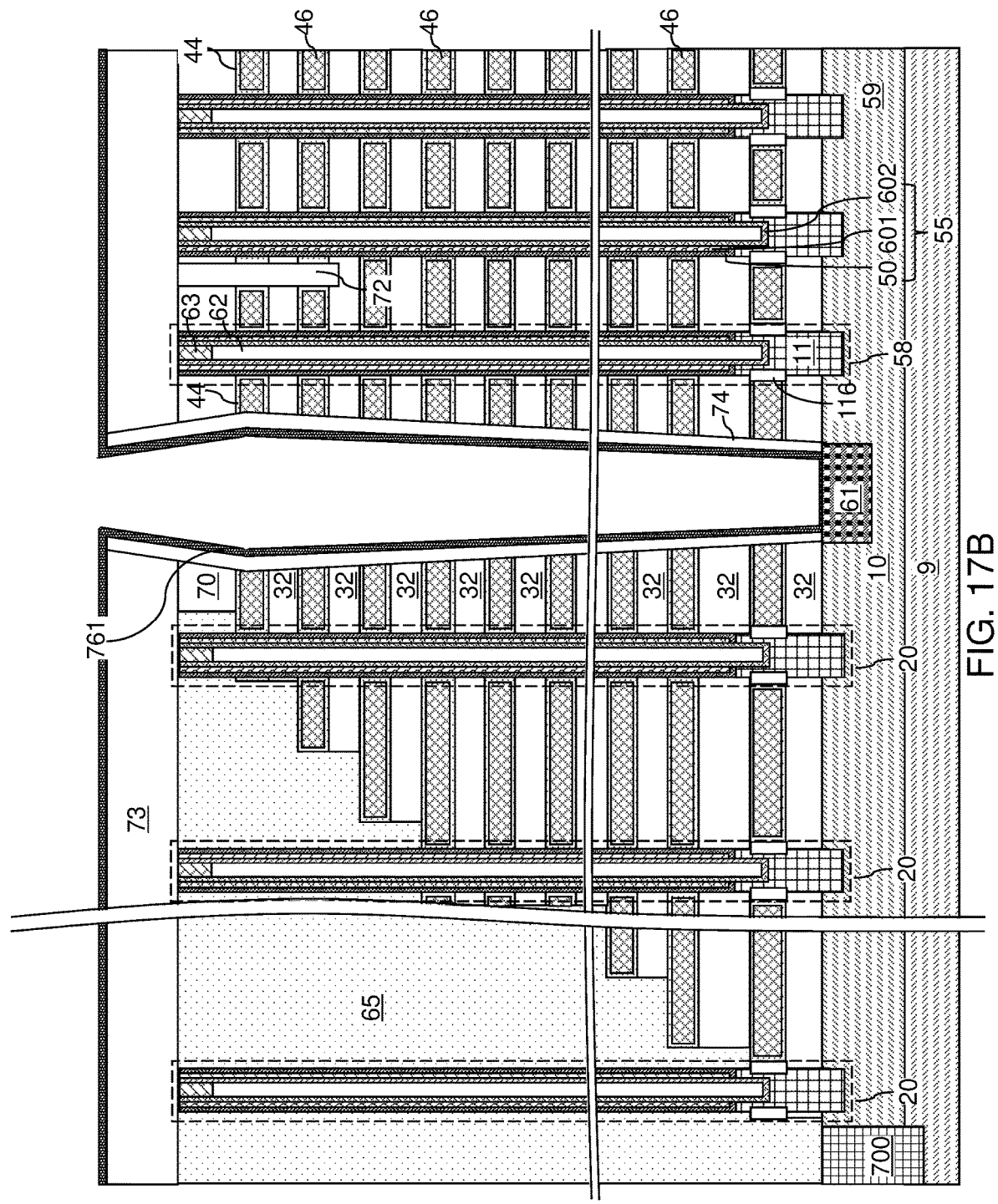

Referring to FIG. 17B, a first metallic nitride liner 761 can be deposited in the backside cavities and over the contact-level dielectric layer 73. The processing steps of FIG. 12B may be performed. In one embodiment, the first metallic nitride liner 761 comprises and/or consists essentially of a metallic nitride material providing a shorter incubation time for a refractory metal (such as tungsten) than tungsten nitride. In one embodiment, the first metallic nitride liner 761 comprises a metallic nitride material such as titanium nitride, tantalum nitride or molybdenum nitride. In one embodiment, the first metallic nitride liner 761 comprises and/or consists essentially of titanium nitride. The thickness of the first metallic nitride liner 761 may be in a range from 3 nm to 100 nm, such as from 6 nm to 50 nm, although lesser and greater thicknesses may also be employed.

Figure 17C:
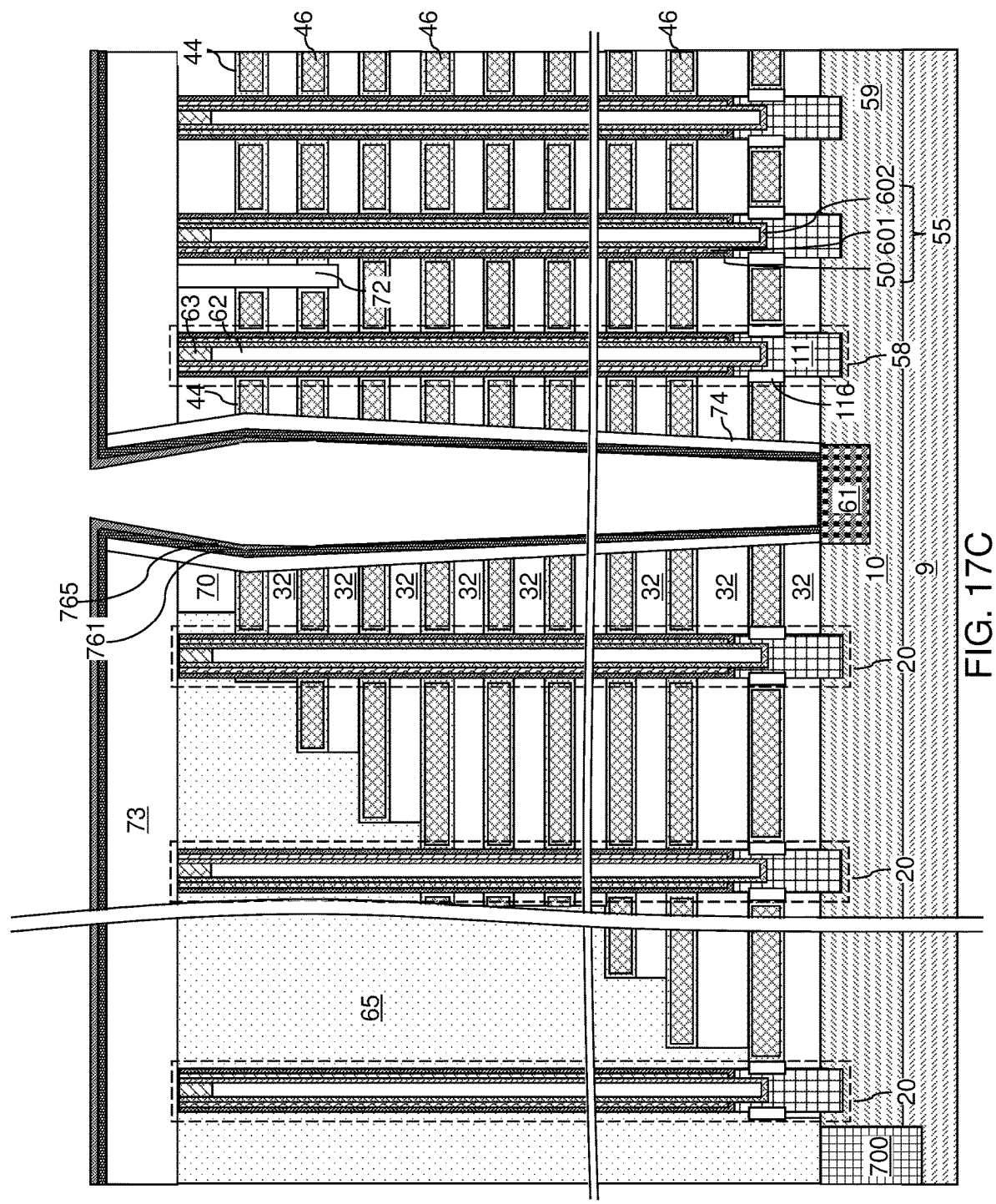

Referring to FIG. 17C, a metallic nitride material can be non-conformally deposited to form a non-conformal metallic nitride liner 765 over first metallic nitride liner 761. For example, a physical vapor deposition (PVD) process, a PECVD process or a diffusion limited ALD process can be employed to anisotropically deposit the metallic nitride material. The non-conformal metallic nitride liner 765 may have a horizontally-extending portion having a uniform thickness and overlying the contact-level dielectric layer 73 and the alternating stack (32, 46), and tapered vertically-extending portions having a variable thickness in an upper portion of each of the backside trenches 79. Each tapered vertically-extending portion extends downward from a periphery of the horizontally-extending portion into a respective backside cavity located within a respective backside trench 79. The lateral thickness of the tapered vertically-extending portions of the non-conformal metallic nitride liner 765 decreases with a vertical distance from a horizontal plane including the bottom surface of the horizontally-extending portion of the non-conformal metallic nitride liner 765.

In one embodiment, the vertical extent of each tapered vertically-extending portion of the non-conformal metallic nitride liner 765 located below the horizontal plane including the top surface of the contact-level dielectric layer 73 is 50% or less, such as 20% or less of the height of the backside trenches 79. In one embodiment, the maximum lateral thickness of the tapered vertically-extending portions of the non-conformal metallic nitride liner 765, as measured between an inner sidewall and an outer sidewall of a respective tapered vertically-extending portion, may be in a range from 3 nm to 60 nm, such as from 6 nm to 30 nm, although lesser and greater dimensions may also be employed.

The non-conformal metallic nitride liner 765 comprise a metallic nitride material, which generally provides a longer incubation time than the first metallic nitride liner 761 during a chemical vapor deposition or atomic layer deposition process for depositing a refractory metal, such as tungsten. In one embodiment, the non-conformal metallic nitride liner 765 comprises or consists essentially of tungsten nitride, which provides a longer incubation time for a chemical vapor deposition or atomic layer deposition of a metal such as tungsten than titanium nitride.

Figure 17D:
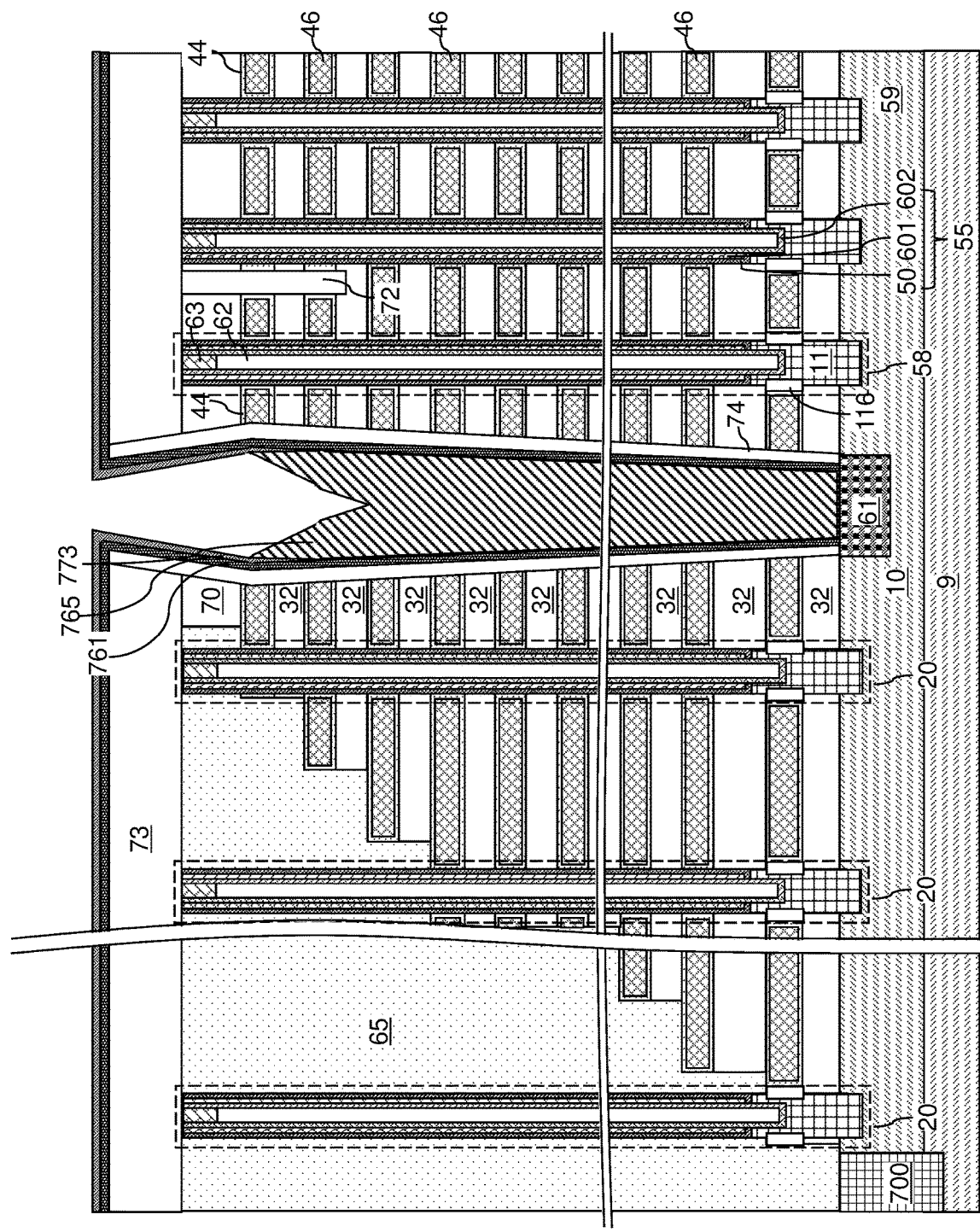

Referring to FIG. 17D, a first core fill conductive material portion 773 can be formed within each backside trench 79 by performing a deposition process having a surface-dependent incubation time that grows a first core fill conductive material from surfaces of the first metallic nitride liner 761 while suppressing growth of the core fill conductive material from the surfaces of the non-conformal metallic nitride liner 765. For example, the first core fill conductive material portion 773 may comprise and/or may consist essentially of a refractory metal such as tungsten, tantalum, tungsten or molybdenum. In this case, the deposition process having a surface-dependent incubation time may comprise a chemical vapor deposition or atomic layer deposition process employing a metal-containing precursor gas, such as a metal fluoride gas. In an illustrative example, if the first core fill conductive material portion 773 consists essentially of tungsten, then the metal-containing precursor comprises tungsten hexafluoride.

Generally, the incubation time for deposition of the first core fill conductive material on the surfaces of the non-conformal metallic nitride liner 765 is longer than the incubation time for deposition of the first core fill conductive material on the surfaces of the first metallic nitride liner 761. In one embodiment, the initial growth of the first core fill conductive material portion 773 may occur only from the surfaces of the first metallic nitride liner 761, and may be suppressed over the surfaces of the non-conformal metallic nitride liner 765 within each backside trench 79. In this case, the first core fill conductive material is deposited only in a lower portion of the each backside trench 79 without or with limited growth of the first core fill conductive material in an upper portion of each backside trench 79. In one embodiment, each backside trench 79 may have a tapered lower portion in which the width of the backside trench 79 increases with a vertical distance from the substrate (9, 10), and the material of the first core fill conductive material portion 773 may grow from the inner sidewalls of the first metallic nitride liner 761 with an unfilled cavity having a variable width that increases with the vertical distance from the substrate (9, 10).

In one embodiment, the non-conformal metallic nitride liner 765 consists essentially of tungsten nitride, and the first metallic nitride liner 761 consists essentially of titanium nitride. The first core fill conductive material portion 773 may comprise, and/or may consist essentially of, a metal selected from tungsten, titanium, tantalum or molybdenum. In one embodiment, the first core fill conductive material portion 773 consists essentially of tungsten.

Figure 17E:
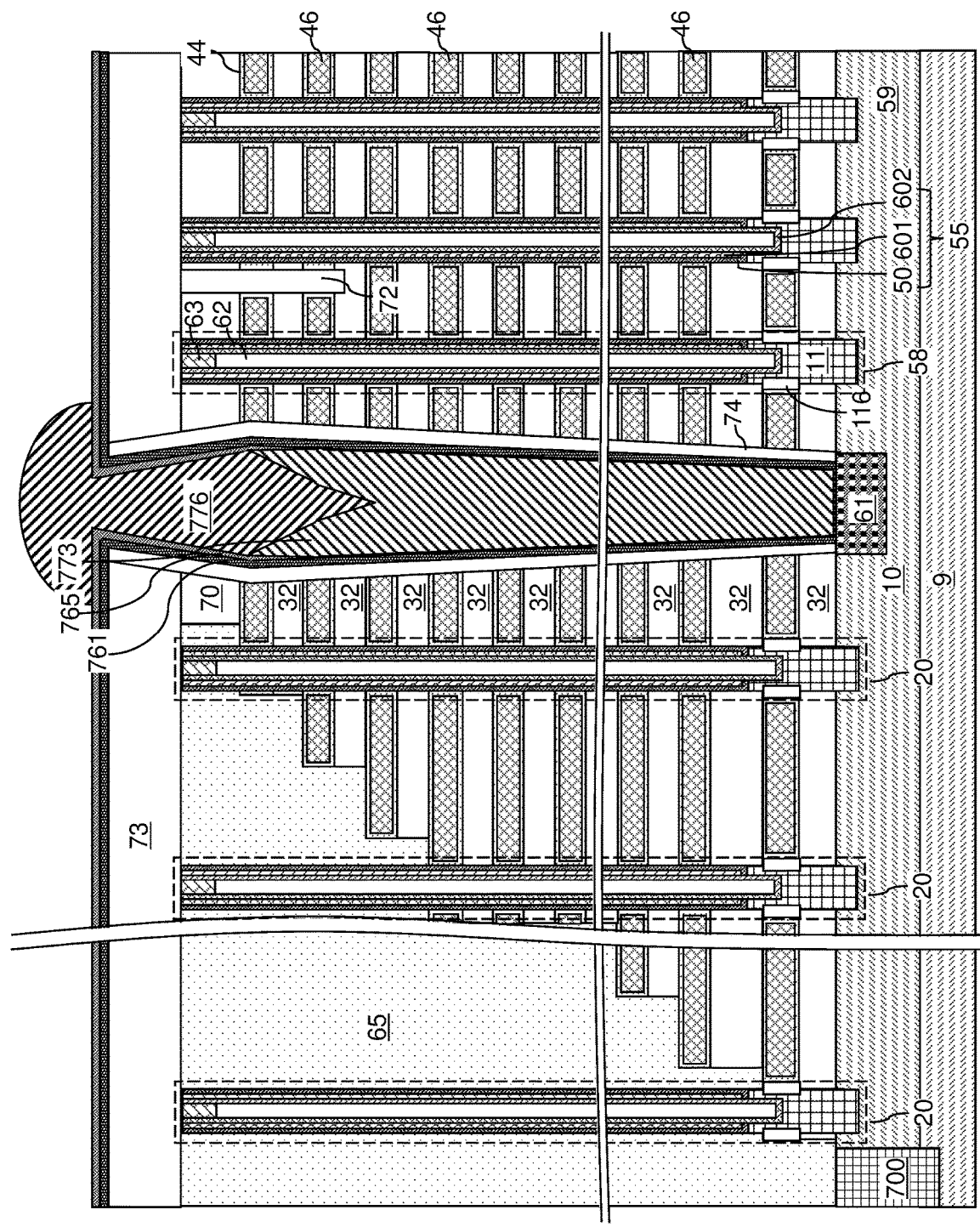

Referring to FIG. 17E, an additional conductive material can be deposited in remaining unfilled volumes of the backside trenches 79 to form a second core fill conductive material portion 776 in each backside trench 79. The additional conductive material is herein referred to as a second core fill conductive material. The second core fill conductive material can be deposited by performing a selective deposition process that deposits a second core fill conductive material from physically exposed surfaces of the first core fill conductive material portions 773 while suppressing growth of the second core fill conductive material from physically exposed surfaces of the non-conformal metallic nitride liner 765. A second core fill conductive material portion 776 grows from the physically exposed surfaces of the first core fill conductive material portion 773 within each backside trench 79, and fills an upper portion of the respective backside trench 79. In one embodiment, the first core fill conductive material portions 773 comprise and/or consist essentially of tungsten, In one embodiment, the second core fill conductive material portions 776 comprise and/or consist essentially of a metal other than tungsten selected from titanium, tantalum, molybdenum, cobalt, or ruthenium. In another embodiment, the second core fill conductive material portions 776 comprise and/or consist essentially of an electrically conductive material comprising a metal alloy or a heavily doped semiconductor. For example, the second core fill conductive material portions 776 may comprise titanium nitride or heavily doped polysilicon. In yet another embodiment, the second core fill conductive material portions 776 also comprise and/or consist essentially of tungsten.

For example, tungsten core fill conductive material portions 773 may have a smaller lattice parameter than the titanium nitride liner 761. Thus, tungsten first portions 773 may be in tensile stress and impose a compressive stress on the substrate (9, 10). In contrast, the second core fill conductive material portions 776, such as Ru, TiN or polysilicon portions, may be in compressive stress and impose an offsetting tensile stress on the substrate (9, 10). Thus, the total stress on the substrate (9, 10) is reduced or eliminated.

Referring to FIG. 17E, a planarization process can be performed to remove horizontally-extending portions of the conductive materials of the second core fill conductive material portion 776, the non-conformal metallic nitride liner 765, and the first metallic nitride liner 761 from above the horizontal plane including the top surface of the contact-level dielectric layer 73. The planarization process may employ a chemical mechanical polishing (CMP) process and/or a recess etch process. Generally, conductive material portions can be removed from above a horizontal plane that is located at, or above, a topmost surface of the alternating stack (32, 46). Remaining conductive material portions that fill the backside cavities constitute backside contact via structures 76.

Each remaining portion of the non-conformal metallic nitride liner 765 within a respective backside contact via structure 76 comprises a tapered vertically-extending portion, which is hereafter referred to as a tapered metallic nitride liner 765. Each tapered metallic nitride liner 765 has a tapered vertical profile such that a lateral thickness of the tapered metallic nitride liner 765 decreases with a vertical distance from the top of the backside contact via structure 76 (i.e., from a horizontal plane including a topmost surface of the backside contact via structure 76). Each tapered metallic nitride liner 765 has a vertical extent that is less than the vertical extent of the first metallic nitride liner 761. Each tapered metallic nitride liner 765 is located inside the first metallic nitride liner 761 of the respective backside contact via structure 76. Each tapered metallic nitride liner 765 contacts an upper portion of an inner sidewall of the first metallic nitride liner 761 of the respective backside contact via structure 76. In one embodiment, the vertical extent of each tapered metallic nitride liner 765 is 50% or less, such as 20% or less (e.g., 5 to 50%, such as 5 to 20%) of the height of the backside contact via structures 76.

Each backside contact via structure 76 comprises a first core fill conductive material portion 773 and a second core fill conductive material portion 776. The first core fill conductive material portion 773 is in direct contact with a lower portion of an inner sidewall of the first metallic nitride liner 761. The second core fill conductive material portion 776 overlies and contacts the first core fill conductive material portion 773. In one embodiment, the first core fill conductive material portion 773 comprises a tungsten fill material portion, while the second core fill conductive material portion 776 may comprise tungsten or another metal, such as Ti, Ta, Mo, Co or Ru. In one embodiment, the second core fill conductive material portion 776 contacts an inner sidewall of the tapered metallic nitride liner 765.

Figure 17F:
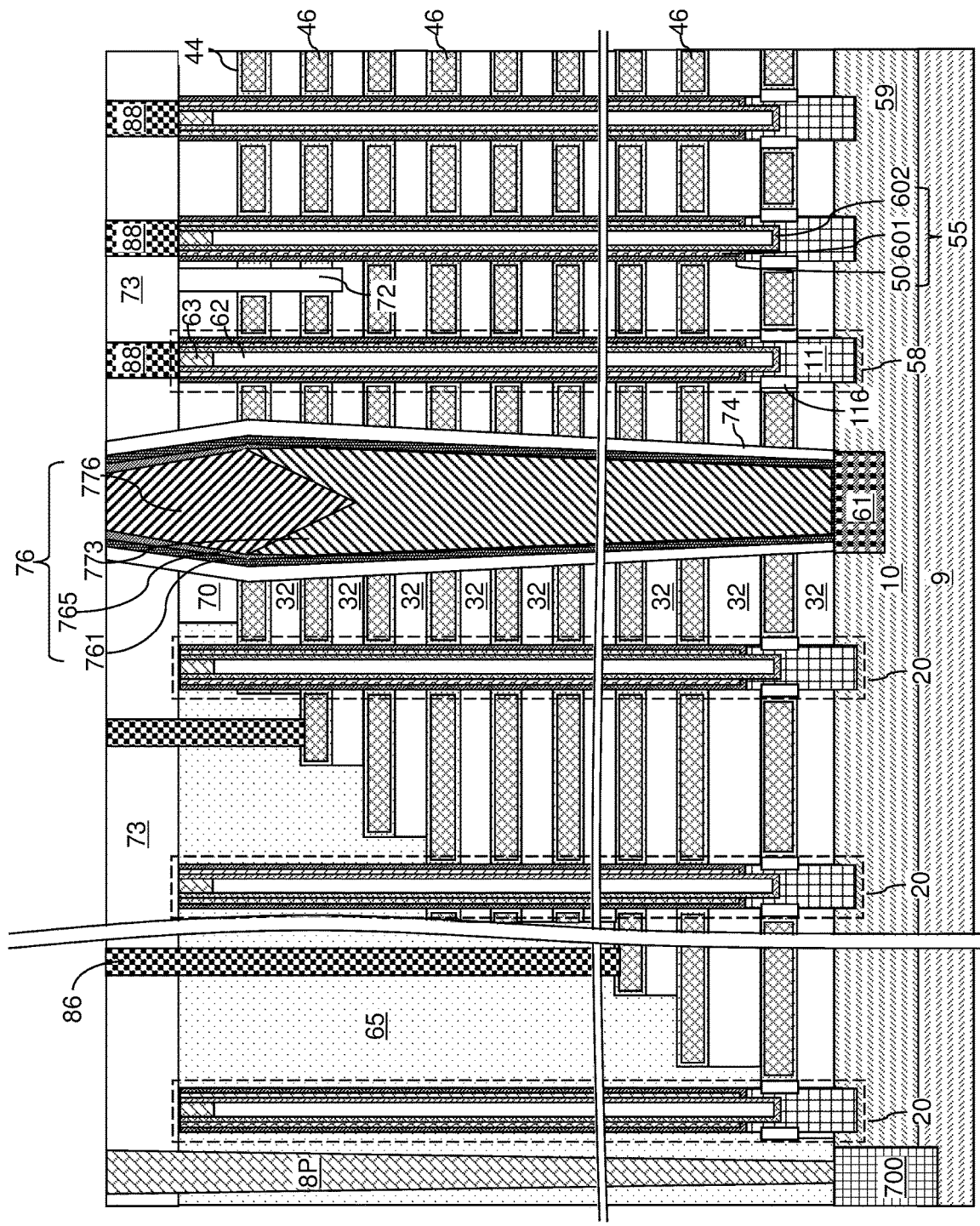

Referring to FIG. 17F, the processing steps of FIGS. 15A and 15B may be performed to form various contact via structures (88, 86, 8P).

Figure 18A:
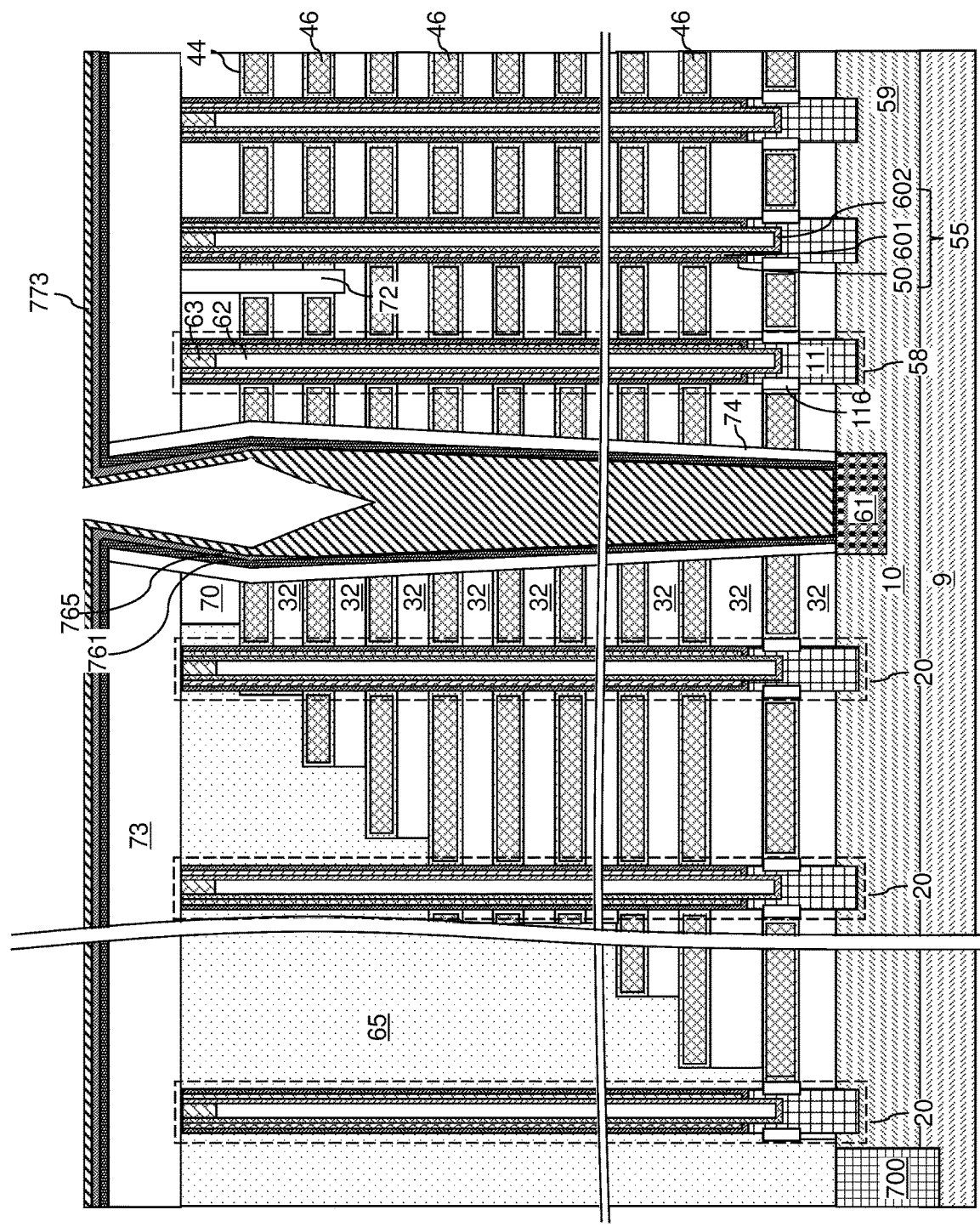
FIGS. 18A-18C are sequential schematic vertical cross-sectional view of a fifth configuration of the exemplary structure during formation of backside trench fill structures and contact via structures according to a fifth embodiment of the present disclosure.
Figure 18B:
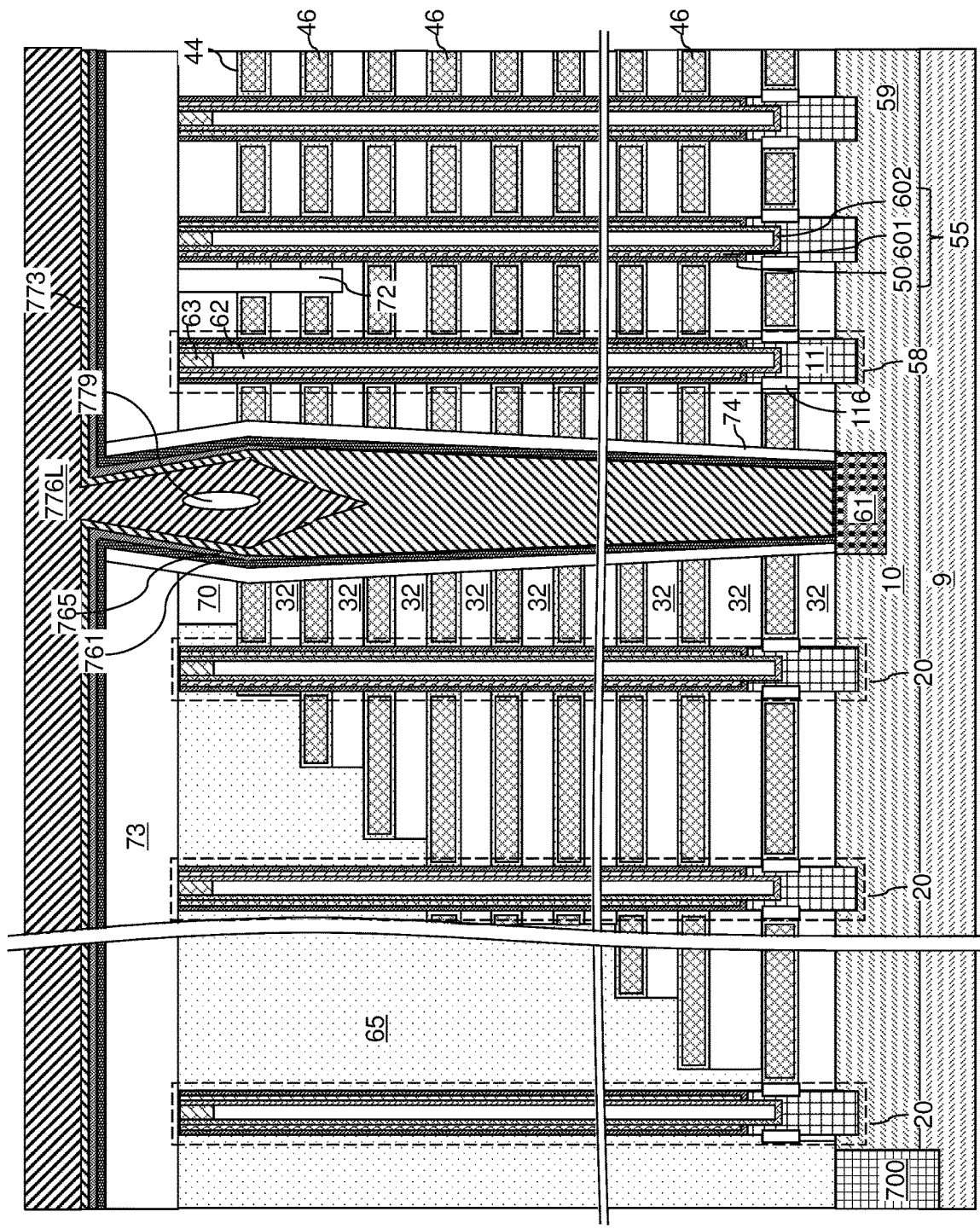
Figure 18C:
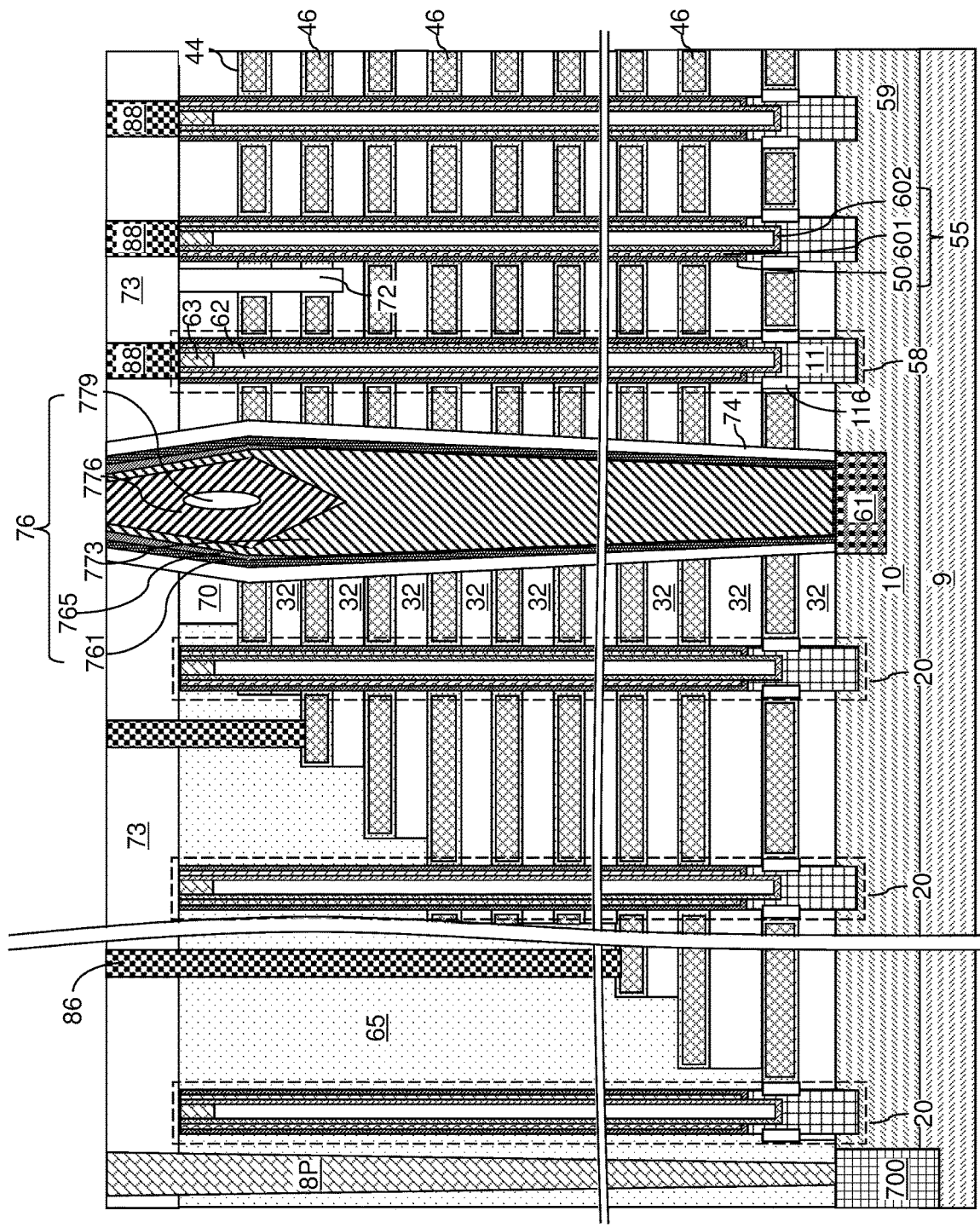

FIGS. 18A-18C are sequential schematic vertical cross-sectional view of a fifth configuration of the exemplary structure during formation of backside trench fill structures (74, 76) and contact via structures (88, 86, 8P) according to fifth embodiment of the present disclosure.

Referring to FIG. 18A, the fifth configuration of the exemplary structure may be derived from the fourth configuration of the exemplary structure illustrated in FIG. 17C by performing the processing steps of FIG. 17D under a processing condition in which some nucleation of the first core fill conductive material occurs on the physically exposed surfaces of the non-conformal metallic nitride liner 765. This may occur in case parameters of the deposition process that forms the first core fill conductive material portion 773 as described with reference to FIG. 17D are modified such that the difference in the incubation times for the metallic precursor gas in the deposition process is less than the deposition time of the deposition process. Parameters that affect the differences in the incubation time may include pressure, temperature, reactant species, and surface treatment prior to the deposition process. Alternatively or additionally, the duration of the deposition process may be increased to induce some deposition of the first core fill conductive material on the physically exposed surfaces of the non-conformal metallic nitride liner 765.

In one embodiment, the first core fill conductive material portion 773 may comprise and/or may consist essentially of a refractory metal such as tungsten. In this case, the deposition process having a surface-dependent incubation time may comprise a chemical vapor deposition or atomic layer deposition process employing a metal-containing precursor gas, such as a metal fluoride gas (e.g., tungsten hexafluoride if the first core fill conductive material portion 773 consists essentially of tungsten).

Generally, the incubation time for deposition of the first core fill conductive material on the surfaces of the non-conformal metallic nitride liner 765 is longer than the incubation time for deposition of the core fill conductive material on the surfaces of the first metallic nitride liner 761. The thickness of the deposited the first core fill conductive material is greater over surfaces of the first metallic nitride liner 761 than over the surfaces of the non-conformal metallic nitride liner 765 within each backside trench 79. In one embodiment, each backside trench 79 may have a tapered lower portion in which the width of the backside trench 79 increases with a vertical distance from the substrate (9, 10), and the material of the first core fill conductive material portion 773 has a greater thickness in a lower portion of each backside trench 79 than in an upper portion of each backside trench 79 or over the contact-level dielectric layer 73.

In one embodiment, the non-conformal metallic nitride liner 765 consists essentially of tungsten nitride, the first metallic nitride liner 761 consists essentially of titanium nitride and the first core fill conductive material portion 733 may comprise and/or may consist essentially of tungsten.

Referring to FIG. 18B, an additional conductive material can be deposited in remaining unfilled volumes of the backside trenches 79 to form a second core fill conductive material layer 776L. The additional conductive material is herein referred to as a second core fill conductive material. The second core fill conductive material can be deposited on physically exposed surfaces of the first core fill conductive material portions 773. In one embodiment, the first core fill conductive material portions 773 comprise and/or consist essentially of tungsten, and the second core fill conductive material layer 776L comprises and/or consists essentially of a metal other than tungsten, such as a metal selected from titanium, tantalum, molybdenum, cobalt, or ruthenium. In one embodiment, an optional airgap 779 may be formed within each of the backside trenches 79 in the second core fill conductive material layer 776L.

Referring to FIG. 18C, a planarization process can be performed to remove horizontally-extending portions of the conductive materials of the second core fill conductive material layer 776L, the first core fill conductive material portion 773, the non-conformal metallic nitride liner 765, and the first metallic nitride liner 761 from above the horizontal plane including the top surface of the contact-level dielectric layer 73. The planarization process may employ a chemical mechanical polishing (CMP) process and/or a recess etch process. Generally, conductive material portions can be removed from above a horizontal plane that is located at, or above, a topmost surface of the alternating stack (32, 46). Remaining conductive material portions that fill the backside cavities constitute backside contact via structures 76.

Each remaining portion of the non-conformal metallic nitride liner 765 within a respective backside contact via structure 76 comprises a tapered vertically-extending portion, which is hereafter referred to as a tapered metallic nitride liner 765, as described above. Each backside contact via structure 76 comprises a first core fill conductive material portion 773 and a second core fill conductive material portion 776 (which is a remaining portion of the second core fill conductive material layer 776L). The first core fill conductive material portion 773 is in direct contact with an inner sidewall of the first metallic nitride liner 761. The second core fill conductive material portion 776 overlies and contacts the first core fill conductive material portion 773. In one embodiment, the first core fill conductive material portion 773 comprises a tungsten fill material portion and second core fill conductive material portion 776 comprises a conductive material other than tungsten. In one embodiment, the first core fill conductive material portion 773 vertically extends to a topmost surface of the backside contact via structure 76. The second core fill conductive material portion 776 is laterally spaced from the tapered metallic nitride liner 765 by a tubular portion of the first core fill conductive material portion 773. The top surface of each backside contact via structure 76 may be located within the horizontal plane including the top surface of the contact-level dielectric layer 73.

Subsequently, the processing steps of FIGS. 15A and 15B may be performed to form various contact via structures (88, 86, 8P).

Figure 19A:
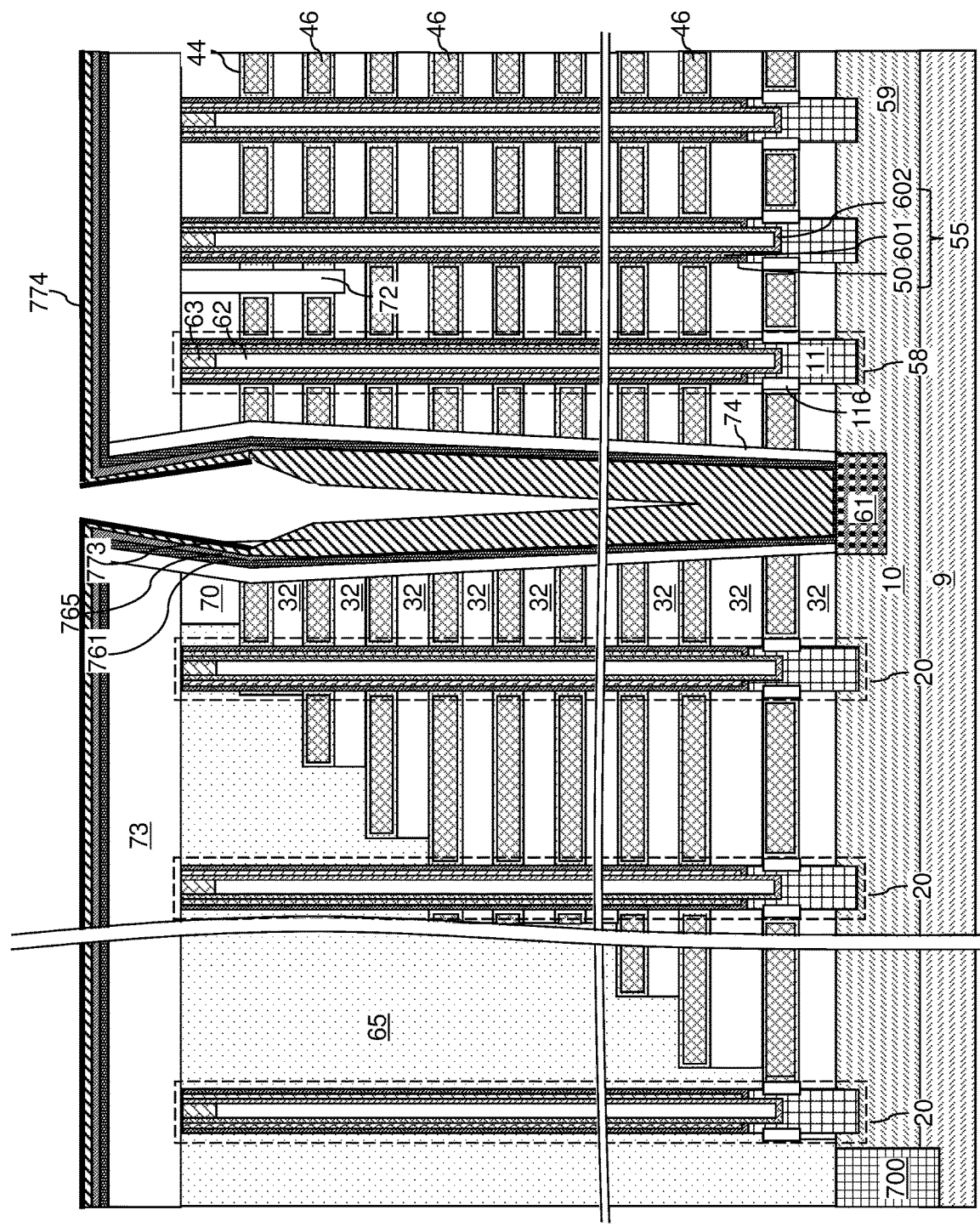
FIGS. 19A-19C are sequential schematic vertical cross-sectional view of a sixth configuration of the exemplary structure during formation of backside trench fill structures and contact via structures according to a sixth embodiment of the present disclosure.
Figure 19B:
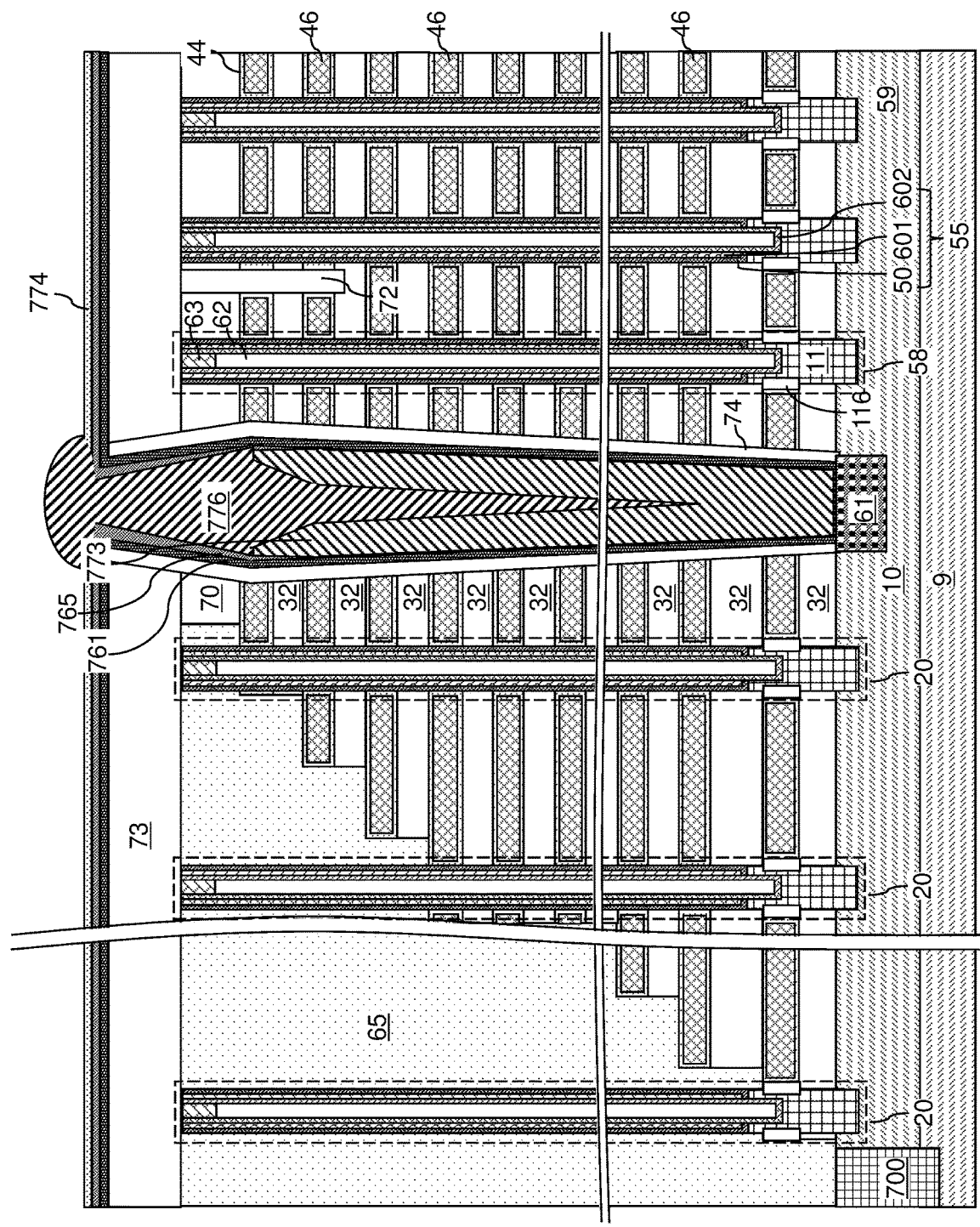
Figure 19C:
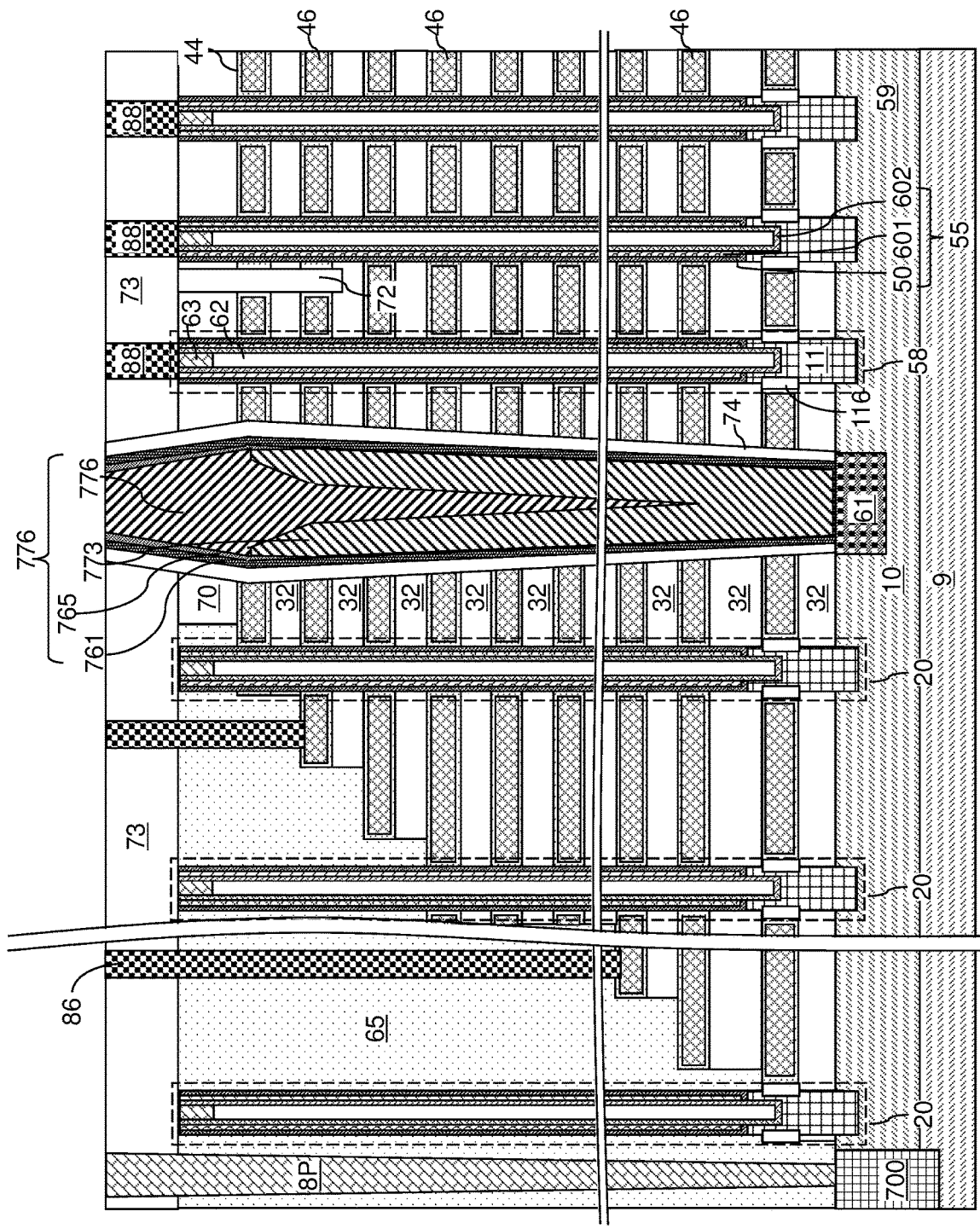

FIGS. 19A-19C are sequential schematic vertical cross-sectional view of a sixth configuration of the exemplary structure during formation of backside trench fill structures (74, 76) and contact via structures (88, 86, 8P) according to a seventh embodiment of the present disclosure.

Referring to FIG. 19A, the sixth configuration of the exemplary structure can be derived from the fifth exemplary structure illustrated in FIG. 18A by stopping the deposition of the first core fill conductive material portion 773 earlier than in FIG. 18A and then performing a deposition inhibitor surface treatment (e.g., an organic surface coating which inhibits sidewall nucleation) on the upper portion of the first core fill conductive material portion 773. For example, a surface coating 774 of a deposition inhibitor may be formed on the upper portion of the first core fill conductive material portion 773 using an ICEfill® ALD process available from Lam Research.

Referring to FIG. 19B, an additional conductive material can be deposited in remaining unfilled volumes of the backside trenches 79 to form a second core fill conductive material portion 776 in each backside trench 79. The additional conductive material is herein referred to as a second core fill conductive material. The second core fill conductive material can be deposited by performing a selective deposition process that deposits a second core fill conductive material from physically exposed surfaces of the first core fill conductive material portions 773 while suppressing growth of the second core fill conductive material from physically exposed surfaces of the surface coating 774. A second core fill conductive material portion 776 grows from the physically exposed surfaces of the first core fill conductive material portion 773 within each backside trench 79, and fills an upper portion of the respective backside trench 79. The second core fill conductive material portion 776 may be deposited using the ICEfill® ALD process available from Lam Research. In one embodiment, the first core fill conductive material portions 773 comprise, and/or consist essentially of tungsten and the second core fill conductive material portions 776 comprise and/or consist essentially of a metal other than tungsten selected from titanium, tantalum, molybdenum, cobalt, or ruthenium. The surface coating 774 may be consumed during the deposition of the second core fill conductive material portions 776.

Referring to FIG. 19C, a planarization process can be performed to remove horizontally-extending portions of the conductive materials of the second core fill conductive material portion 776, the surface coating 774, the non-conformal metallic nitride liner 765, and the first metallic nitride liner 761 from above the horizontal plane including the top surface of the contact-level dielectric layer 73. The planarization process may employ a chemical mechanical polishing (CMP) process and/or a recess etch process. Remaining conductive material portions that fill the backside cavities constitute backside contact via structures 76.

Each remaining portion of the non-conformal metallic nitride liner 765 within a respective backside contact via structure 76 comprises a tapered vertically-extending portion, which is hereafter referred to as a tapered metallic nitride liner 765, as described above.

The processing steps of FIGS. 15A and 15B may be performed to form various contact via structures (88, 86, 8P).

FIGS. 20A-20D are sequential schematic vertical cross-sectional view of a seventh configuration of the exemplary structure during formation of backside trench fill structures 76 and contact via structures (88, 86, 8P) according to a seventh embodiment of the present disclosure.

Figure 20A:
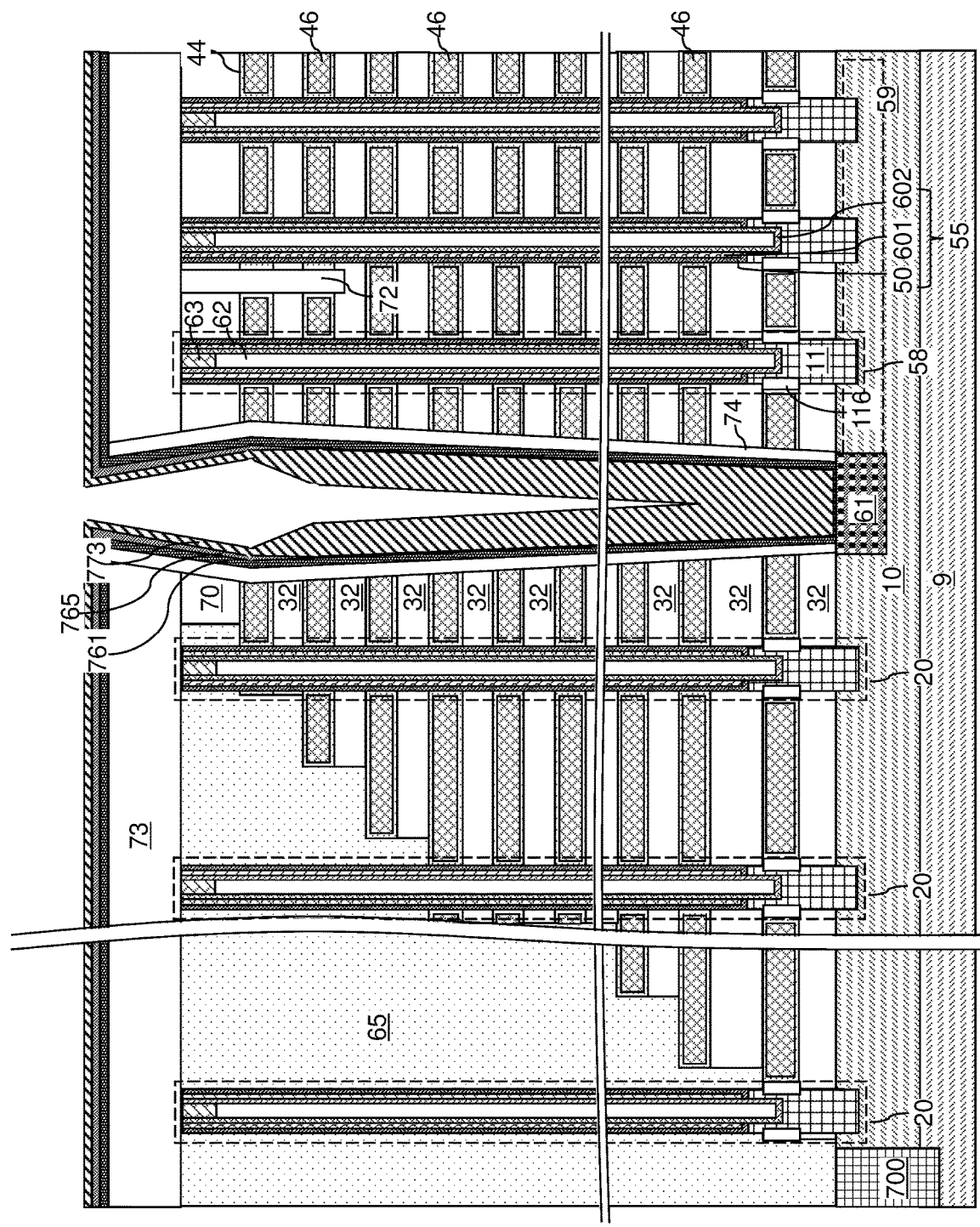
FIGS. 20A-20D are sequential schematic vertical cross-sectional view of a seventh configuration of the exemplary structure during formation of backside trench fill structures and contact via structures according to a seventh embodiment of the present disclosure.

Referring to FIG. 20A, the seventh configuration of the exemplary structure may be derived from the fifth exemplary structure illustrated in FIG. 18A by stopping the deposition of the first core fill conductive material portion 773 earlier than in FIG. 18A.

Figure 20B:
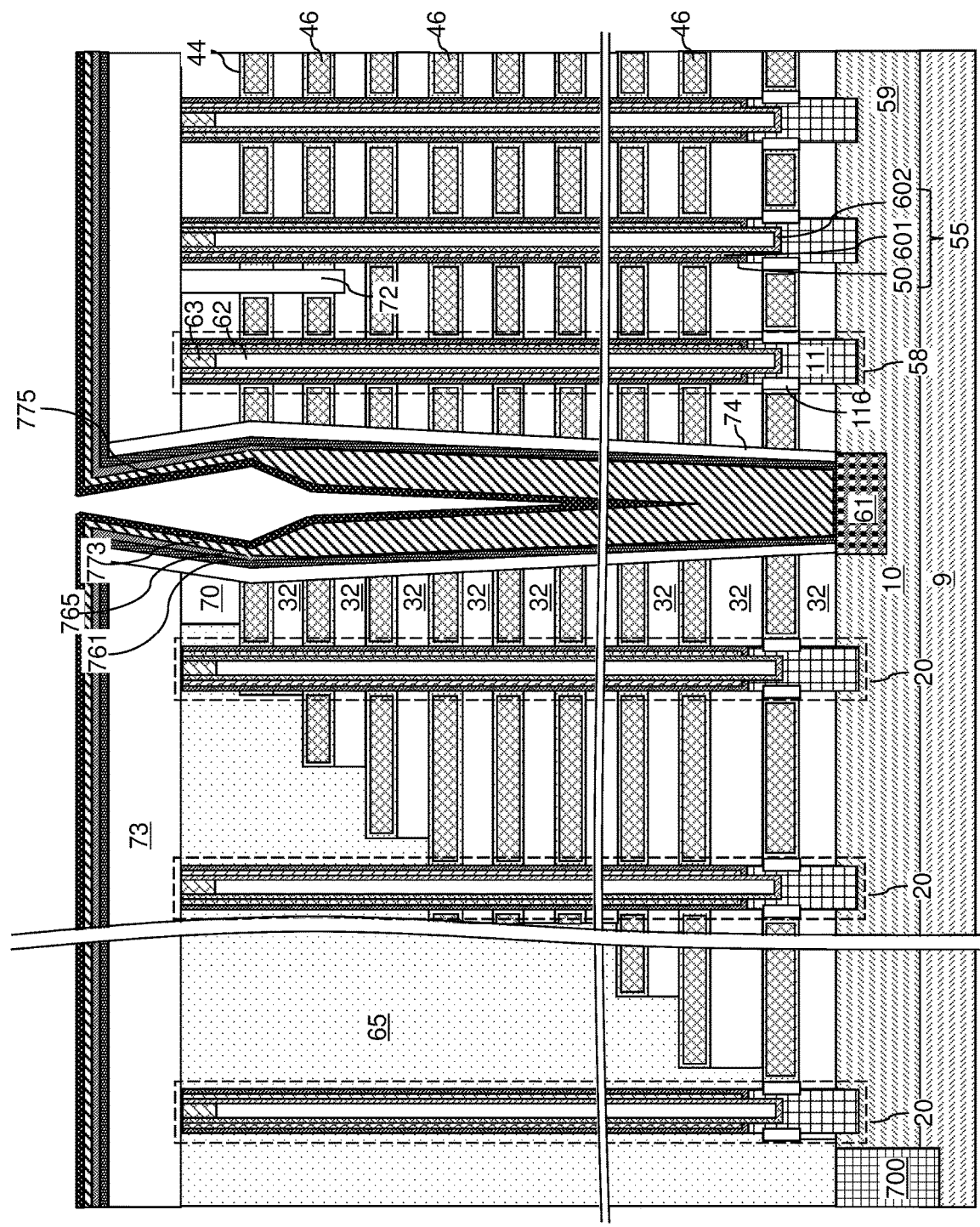

Referring to FIG. 20B, a metal liner 775 may be conformally deposited on the physically exposed surfaces of the first core fill conductive material portion 773. The metal liner 775 comprises and/or consists essentially of a metal that is different from the metal within the first core fill conductive material portion 773. For example, the first core fill conductive material portion 773 may comprise and/or consist essentially of tungsten, and the metal liner 775 may comprise and/or may consist essentially of a second metal different from tungsten, such as molybdenum, cobalt or ruthenium. The second metal may be in an opposite stress type (e.g., in compressive stress) than tungsten (which may be in tensile stress). The metal liner 775 may be deposited by a conformal deposition process such as a chemical vapor deposition or atomic layer deposition process, and may have a thickness in a range from 0.6 nm to 6 nm, such as from 1 nm and 3 nm, although lesser and greater thicknesses may also be employed.

Figure 20C:
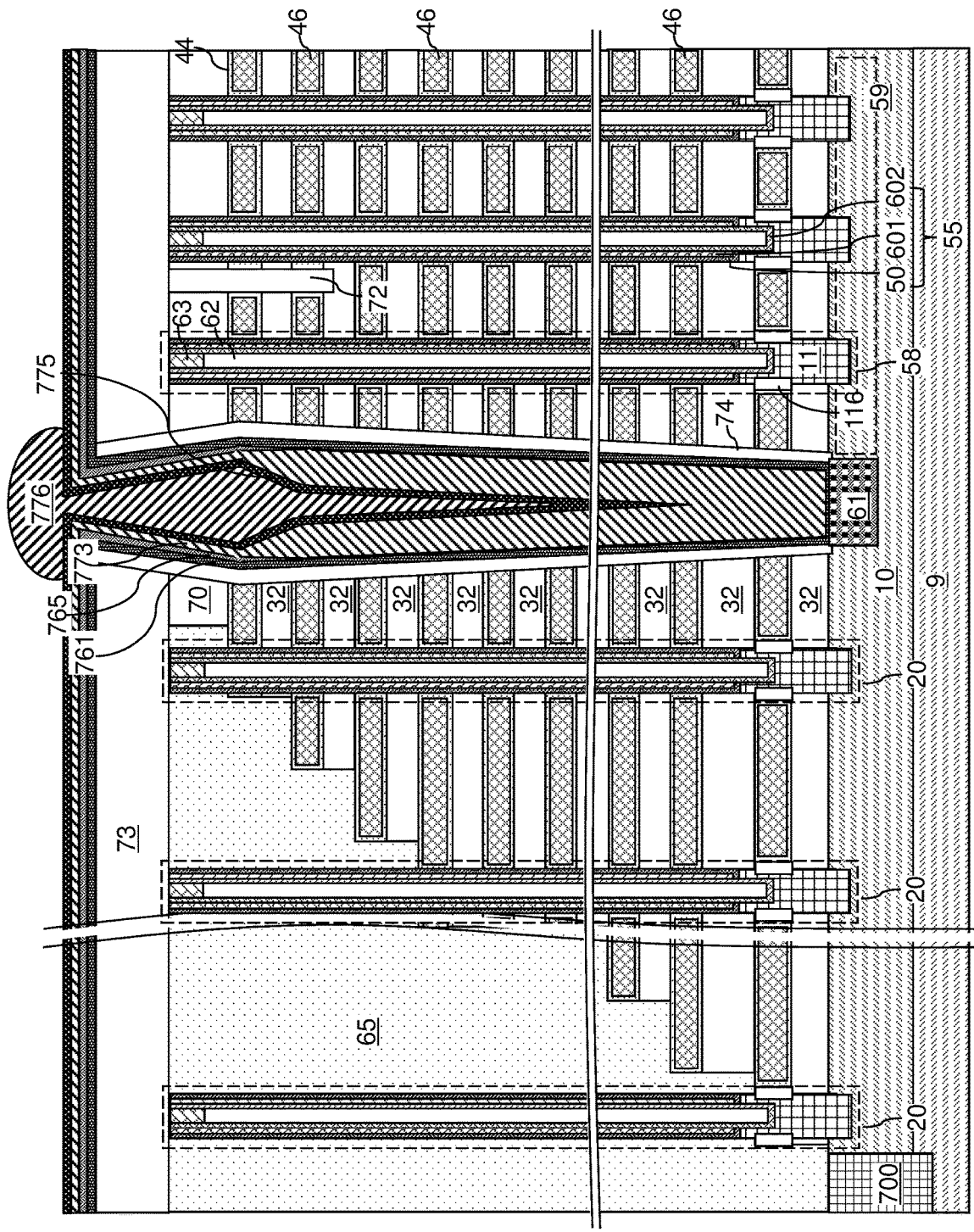

Referring to FIG. 20C, deposition inhibitor surface treatment (e.g., an organic surface coating which inhibits sidewall nucleation described above) is performed on the upper portion of the metal liner 775. An additional conductive material can be deposited in remaining unfilled volumes of the backside trenches 79 to form a second core fill conductive material portion 776 in each backside trench 79, as described above. The additional conductive material is herein referred to as a second core fill conductive material. The second core fill conductive material can be deposited by performing a selective deposition process that deposits a second core fill conductive material from physically exposed surfaces of the metal liner 775 while suppressing growth of the second core fill conductive material from the surface treated upper portion of the metal liner 775. The second core fill conductive material portion 776 may be deposited using the ICEfill® ALD process available from Lam Research. In one embodiment, the first and the second core fill conductive material portions 773 and 776 comprise and/or consist essentially of tungsten.

Figure 20D:
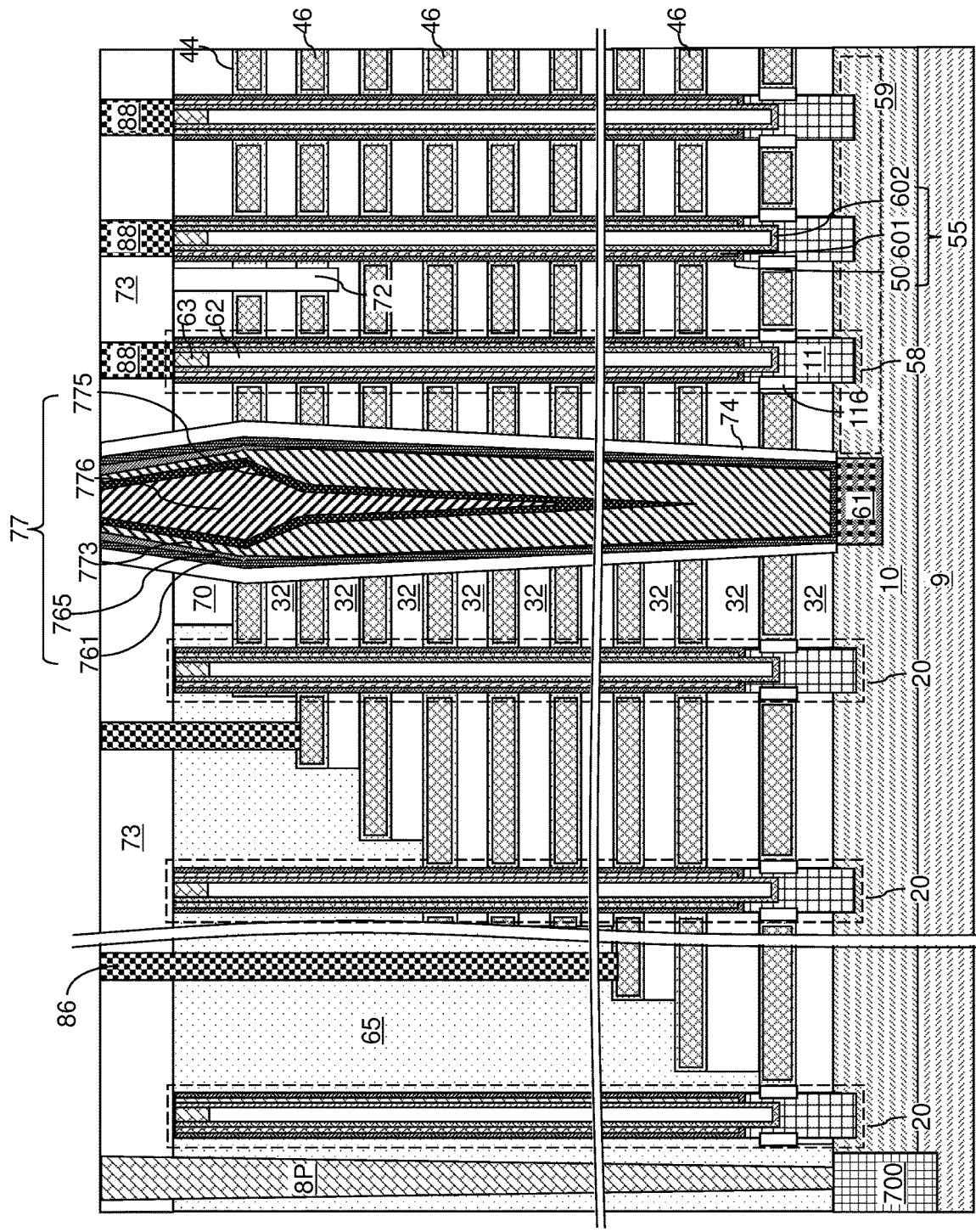

Referring to FIG. 20D, a planarization process can be performed to remove horizontally-extending portions of the conductive materials of the second core fill conductive material portion 776, the metal liner 775, the non-conformal metallic nitride liner 765, and the first metallic nitride liner 761 from above the horizontal plane including the top surface of the contact-level dielectric layer 73. The planarization process may employ a chemical mechanical polishing (CMP) process and/or a recess etch process. Generally, conductive material portions can be removed from above a horizontal plane that is located at, or above, a topmost surface of the alternating stack (32, 46). Remaining conductive material portions that fill the backside cavities constitute backside contact via structures 76.

Each remaining portion of the non-conformal metallic nitride liner 765 within a respective backside contact via structure 76 comprises a tapered vertically-extending portion, which is hereafter referred to as a tapered metallic nitride liner 765, as described above.

Each backside contact via structure 76 comprises a first core fill conductive material portion 773 and a second core fill conductive material portion 776. The first core fill conductive material portion 773 is in direct contact with a lower portion of an inner sidewall of the first metallic nitride liner 761. The metal liner 775 overlies and contacts the first core fill conductive material portion 773. The second core fill conductive material portion 776 overlies and contacts the metal liner 775. In one embodiment, the first core fill conductive material portion 773 and the second core fill conductive material portion 776 comprise tungsten and the metal liner 775 comprises a metal other than tungsten and which preferably has an opposite stress state from that of the tungsten. In one embodiment, the second core fill conductive material portion 776 is laterally spaced from the tapered metallic nitride liner 765 by a vertically-extending tubular portion of the first core fill conductive material portion 773 and the metal liner 775. A lower portion of the first core fill conductive material portion 773 is spaced from the first core fill conductive material portion 776 by the metal layer 775. The processing steps of FIGS. 15A and 15B may be performed to form various contact via structures (88, 86, 8P).

FIGS. 21A-21E are sequential schematic vertical cross-sectional view of an eighth configuration of the exemplary structure during formation of backside trench fill structures 76 and contact via structures (88, 86, 8P) according to an eighth embodiment of the present disclosure.

Figure 21A:
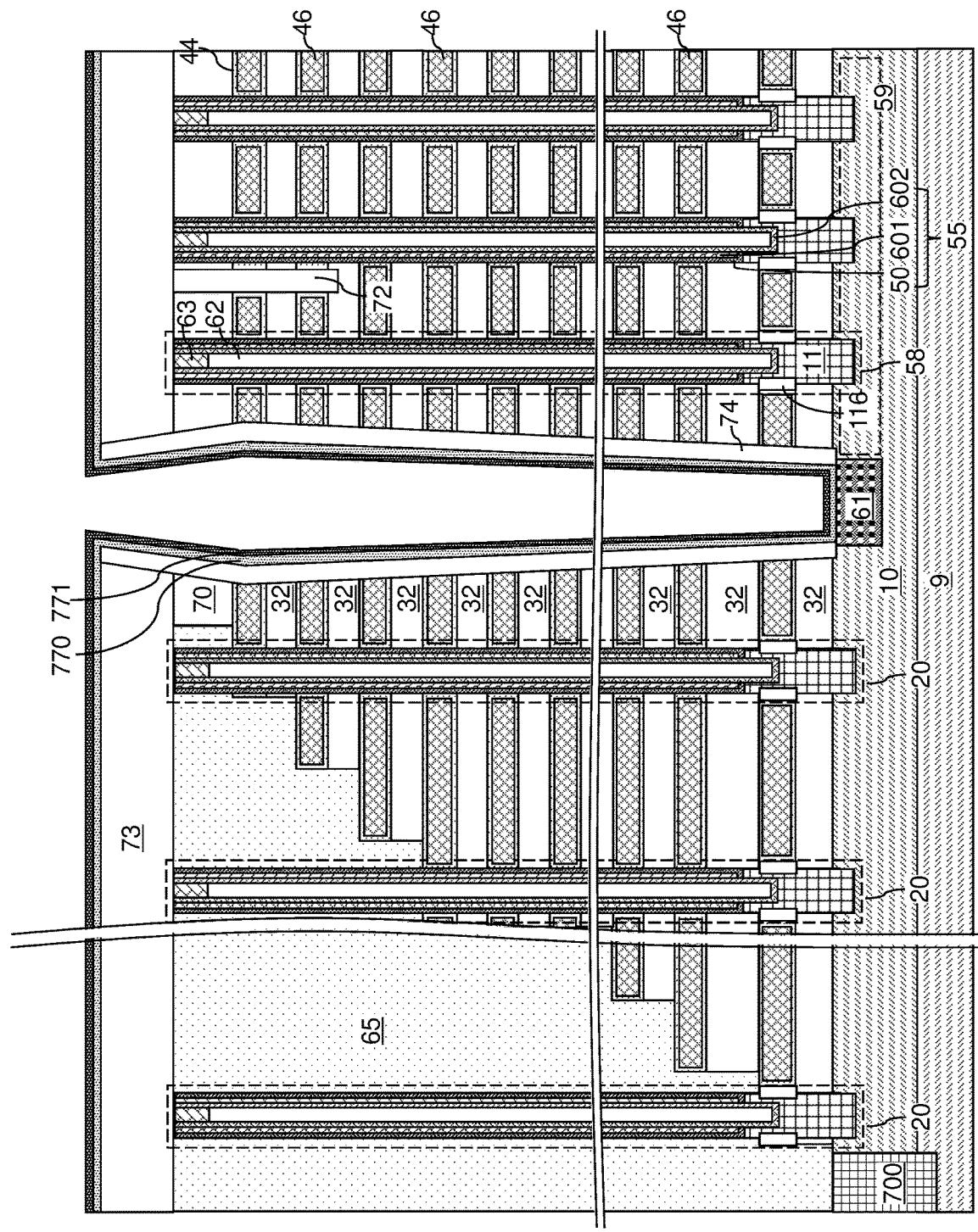
FIGS. 21A-21F are sequential schematic vertical cross-sectional view of an eighth configuration of the exemplary structure during formation of backside trench fill structures and contact via structures according to an eighth embodiment of the present disclosure.

Referring to FIG. 21A, the eighth configuration of the exemplary structure is illustrated, which can be derived from the configuration of the exemplary structure illustrated in FIG. 12A or from the configuration of the exemplary structure illustrated in FIG. 17A by conformally depositing a tungsten nitride liner 770 on the backside trench insulating spacer 74, and by forming a metallic nitride liner 771 comprising a metallic nitride material other than tungsten nitride on the tungsten nitride liner 770. The metallic nitride liner 771 of the eighth configuration of the exemplary structure may comprise and/or may consist essentially of any metallic nitride material that provides a shorter incubation time for deposition of the refractory metal, such as tungsten, than tungsten nitride. In one embodiment, the metallic nitride liner 771 of the eighth configuration of the exemplary structure may comprise titanium nitride, tantalum nitride, or molybdenum nitride. For example, the metallic nitride liner 771 may comprise titanium nitride.

The tungsten nitride liner 770 may be conformally deposited, for example, employing a first conformal deposition process, such as a chemical vapor deposition or atomic layer deposition process. The metallic nitride liner 771 may be conformally deposited, for example, employing a second conformal deposition process, such as another chemical vapor deposition or atomic layer deposition process. The tungsten nitride liner 770 may have a thickness in a range from 2 nm to 100 nm, such as from 4 nm to 20 nm, although lesser and greater thicknesses may also be employed. The metallic nitride liner 771 may have a thickness in a range from 2 nm to 100 nm, such as from 4 nm to 20 nm, although lesser and greater thicknesses may also be employed.

Figure 21B:
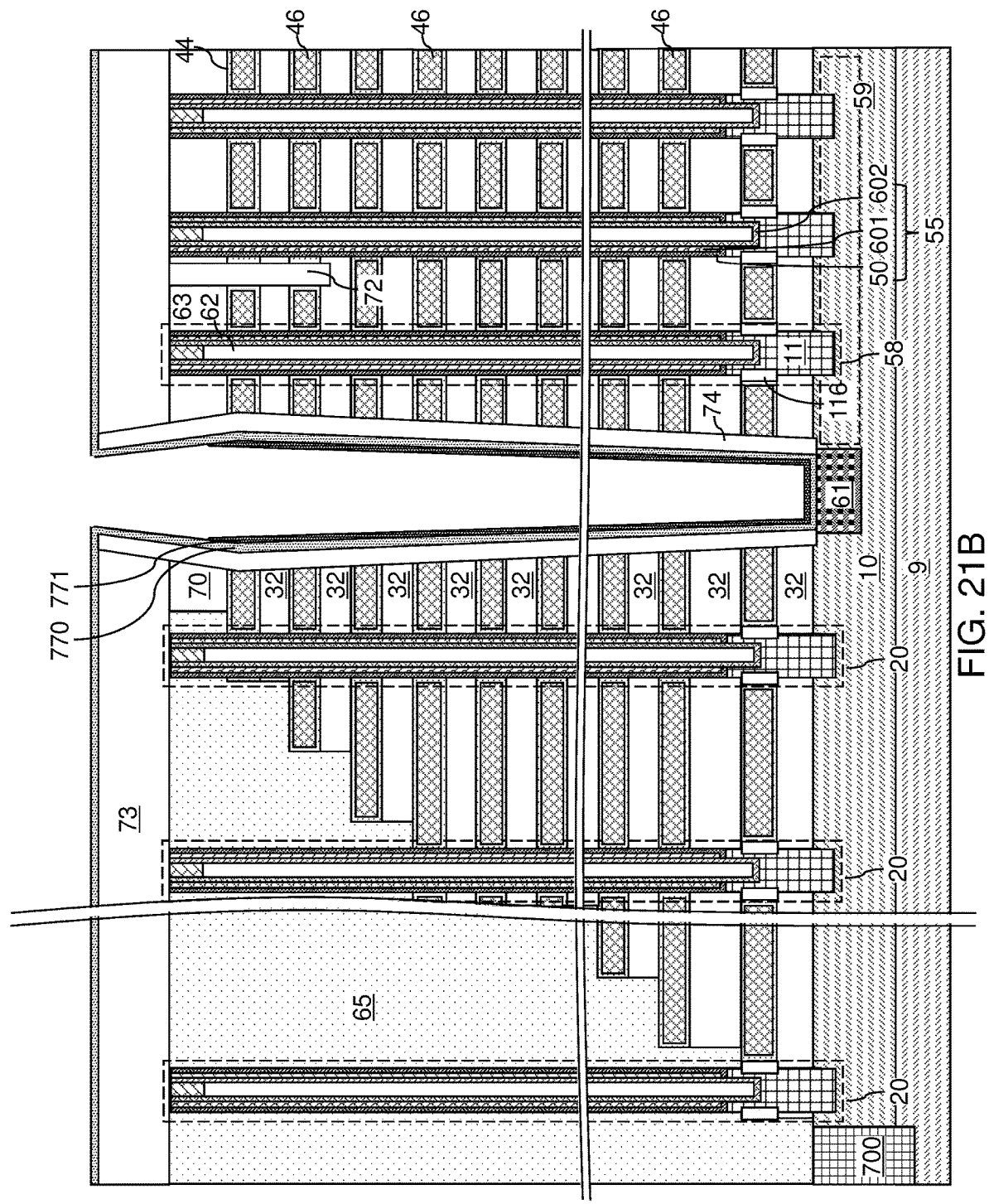

Referring to FIG. 21B, an upper portion of the metallic nitride liner 771 can be removed by performing a depletive anisotropic etch process. The depletive anisotropic etch process may comprise a plasma etch process. The depletive anisotropic etch process is depletive, i.e., the etch rate is limited by the supply of etchant ions. In one embodiment, the density and/or effectiveness of etchant ions decrease from top to bottom during the depletive anisotropic etch process. In one embodiment, the density of etchant ions decreases inside each backside trench 79 with a vertical distance from a horizontal plane including a topmost edge of the respective backside trench 79 (such as the horizontal plane including the top surface of the contact-level dielectric layer 73). The depletive anisotropic etch process provides an etch rate for the metallic nitride liner 771 that decreases with the vertical distance from the horizontal plane including the top surface of the contact-level dielectric layer 73.

The plasma etch process removes the entirety of the horizontally-extending portion of the metallic nitride liner 771 from above the contact-level dielectric layer 73, and removes upper tubular portions of the metallic nitride liner 771 from an upper region of each backside trench 79. An upper portion of the metallic nitride liner 771 can be removed at the level of the contact-level dielectric layer 73 within each backside trench 79, while a lower portion of the metallic nitride liner 771 is not fully removed around lower portions of the alternating stack (32, 46). Each remaining portion of the metallic nitride liner 771 can be located within a lower portion of a respective backside trench 79 below the horizontal plane including the bottom surface of the contact-level dielectric layer 73 as a single continuous structure. Each metallic nitride liner 771 may include vertically-extending portions and a horizontally-extending portion located in the backside trench 79 and overlying a horizontally-extending portion of the tungsten nitride liner 770. An inner sidewall of a vertically-extending portion of the tungsten nitride liner 770 can be physically exposed within each backside trench 79. In one embodiment, the tungsten nitride liner 770 contacts the entirety of inner sidewalls of the backside trench insulating spacer 74.

Figure 21C:
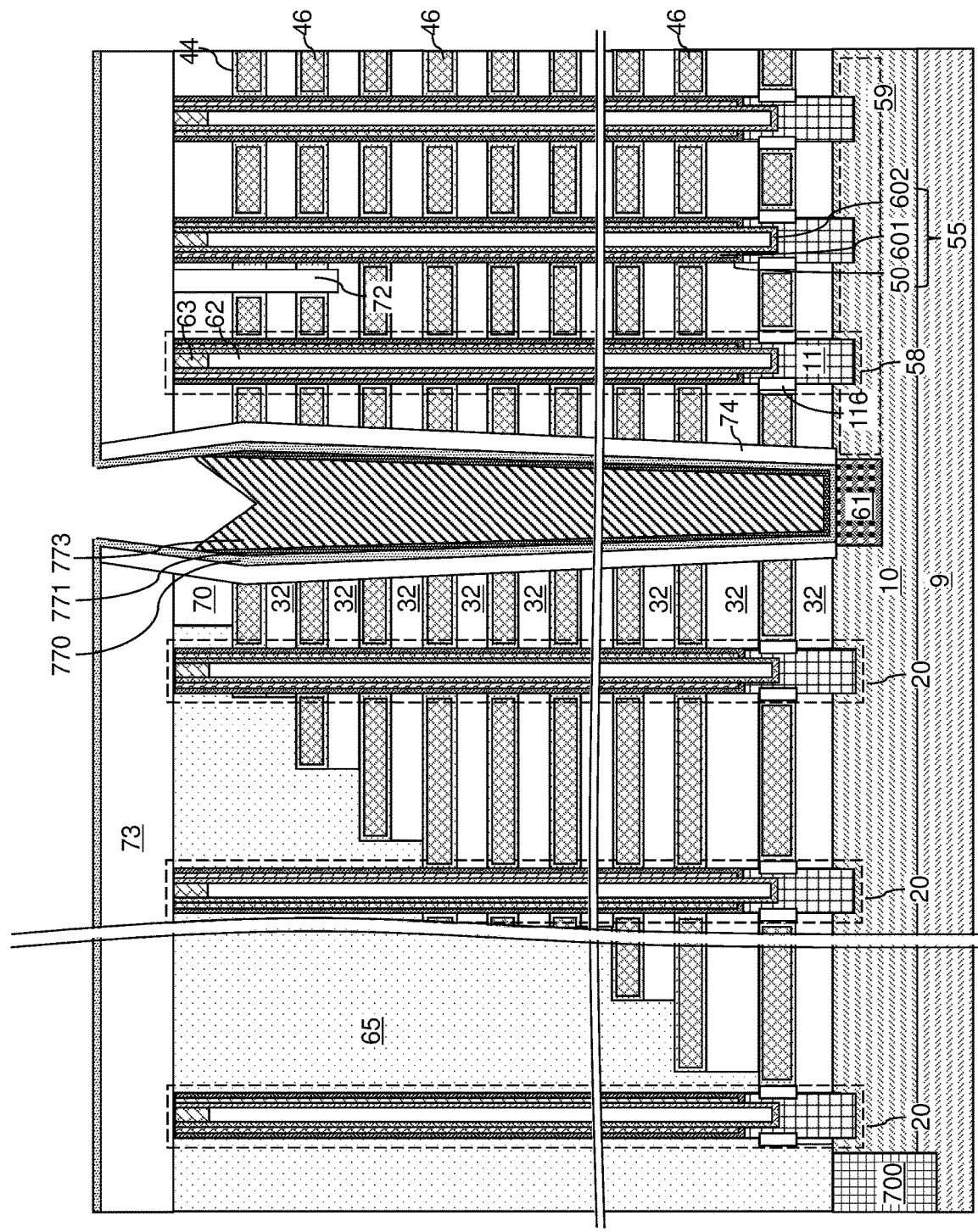

Referring to FIG. 21C, a first core fill conductive material portion 773 can be formed within each backside trench 79 by performing a deposition process having a surface-dependent incubation time that grows a first core fill conductive material from surfaces of the metallic nitride liner 771 while suppressing growth of the first core fill conductive material from the surfaces of the tungsten nitride liner 770. For example, the first core fill conductive material portion 773 may comprise and/or may consist essentially of a refractory metal such as tungsten, tantalum, tungsten or molybdenum. In this case, the deposition process having a surface-dependent incubation time may comprise a chemical vapor deposition or atomic layer deposition process employing a metal-containing precursor gas such as a metal fluoride gas. In an illustrative example, if the first core fill conductive material portion 773 consists essentially of tungsten, then the metal-containing precursor gas may be tungsten hexafluoride.

The incubation time for deposition of the first core fill conductive material on the surfaces of the tungsten nitride liner 770 is longer than the incubation time for deposition of the core fill conductive material on the surfaces of the metallic nitride liner 771. In one embodiment, the growth of the first core fill conductive material portion 773 may occur only from the surfaces of the metallic nitride liner 771, and may be suppressed over the physically exposed surfaces of the tungsten nitride liner 770. In this case, the first core fill conductive material is deposited only in a lower portion of the each backside trench 79 without growth of the first core fill conductive material in an upper portion of each backside trench 79. In one embodiment, each first core fill conductive material portion 773 may fill a lower portion of each backside trench 79, and may have a top surface including tapered top surface segments. In one embodiment, the first core fill conductive material portion 773 consists essentially of tungsten. Generally, the first core fill conductive material portion 773 may be deposited by a deposition process having a surface-dependent incubation time that grows a first core fill conductive material from physically exposed surfaces of the metallic nitride liner 771 while suppressing growth of the first core fill conductive material from physically exposed surfaces of the tungsten nitride liner 770.

Figure 21D:
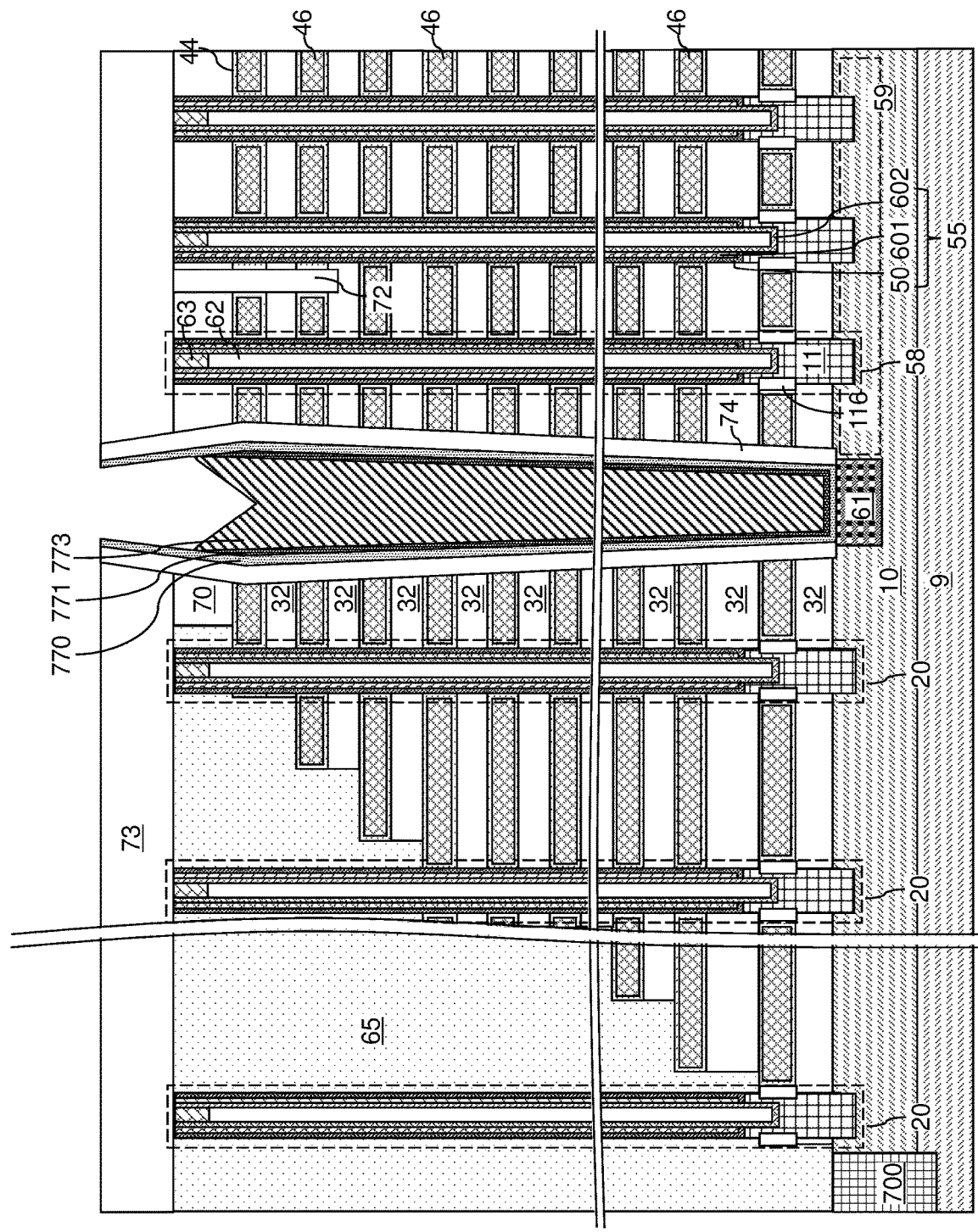

Referring to FIG. 21D, horizontally-extending portions of the tungsten nitride liner 770 overlying the contact-level dielectric layer 73 may be optionally removed, for example, by performing an etch process.

Figure 21E:
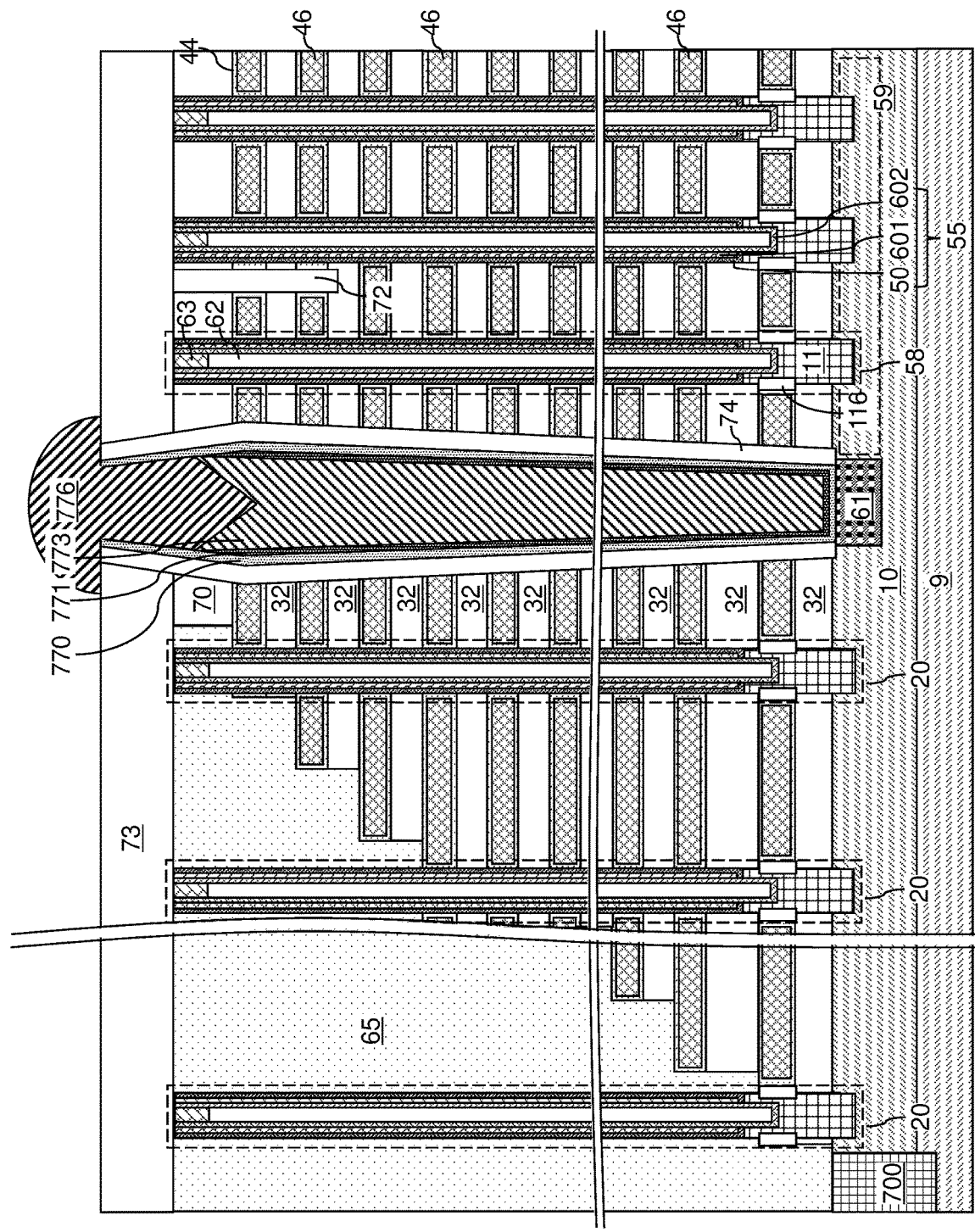

Referring to FIG. 21E, an additional conductive material can be deposited in remaining unfilled volumes of the backside trenches 79 to form a second core fill conductive material portion 776 in each backside trench 79. The additional conductive material is herein referred to as a second core fill conductive material. The second core fill conductive material can be deposited by performing a selective deposition process that deposits a second core fill conductive material from physically exposed surfaces of the first core fill conductive material portions 773 while suppressing growth of the second core fill conductive material from physically exposed surfaces of the contact-level dielectric layer 73. In one embodiment, growth of the second core fill conductive material from surfaces of the tungsten nitride liner 770 may or may not be suppressed. A second core fill conductive material portion 776 grows from the physically exposed surfaces of the first core fill conductive material portion 773 (and optionally from physically exposed surfaces of the tungsten nitride liner 770) within each backside trench 79, and fills an upper portion of the respective backside trench 79. In one embodiment, the first core fill conductive material portions 773 comprise and/or consist essentially of tungsten, and the second core fill conductive material portions 776 comprise and/or consist essentially of a metal other than tungsten, such as titanium, tantalum, molybdenum, cobalt, or ruthenium.

Figure 21F:
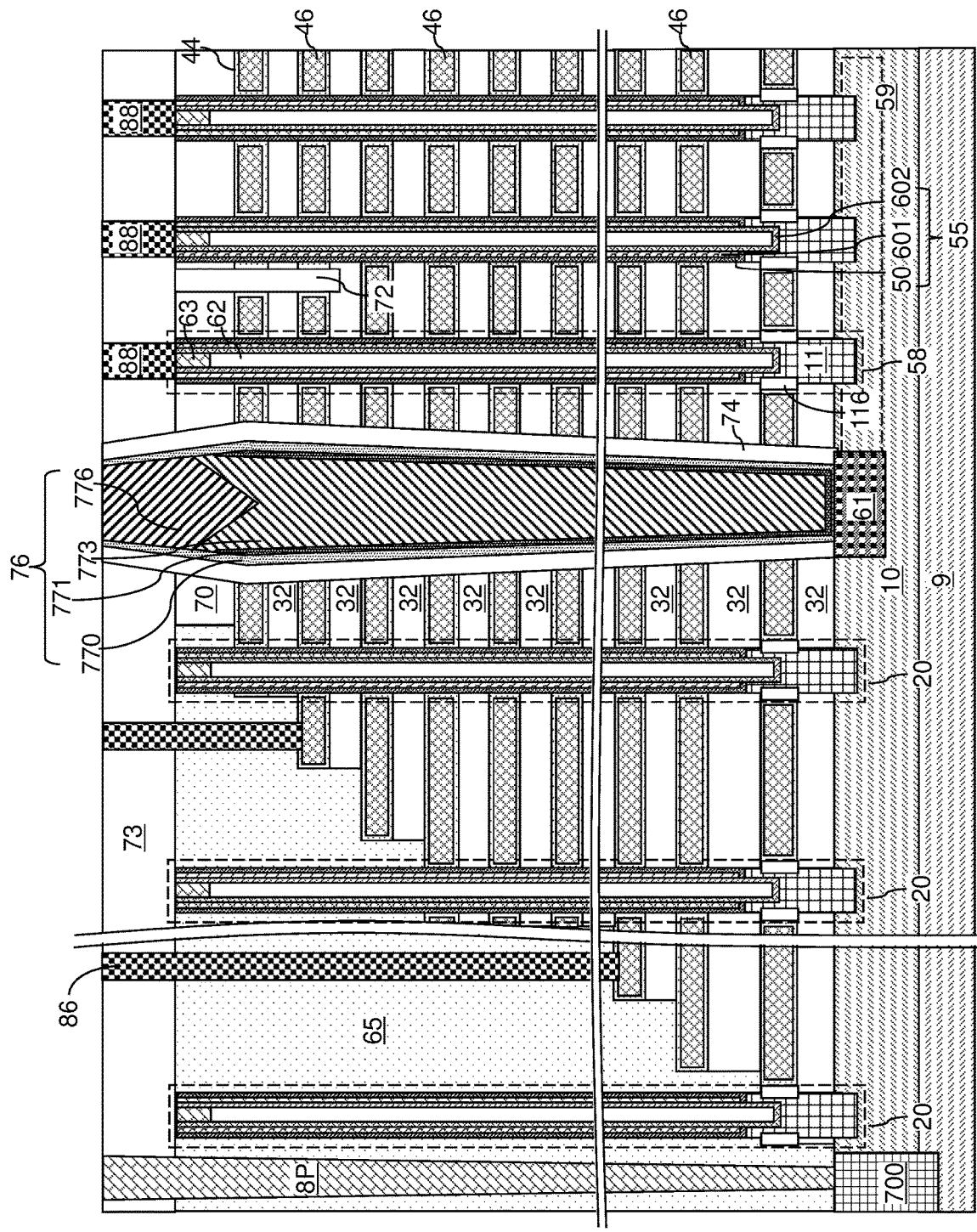

Referring to FIG. 21F, a planarization process can be performed to remove portions of the second core fill conductive material portion 776 from above the horizontal plane including the top surface of the contact-level dielectric layer 73. The planarization process may employ a chemical mechanical polishing (CMP) process and/or a recess etch process. Generally, conductive material portions can be removed from above a horizontal plane that is located at, or above, a topmost surface of the alternating stack (32, 46). Remaining conductive material portions that fill the backside cavities constitute backside contact via structures 76. The processing steps of FIGS. 15A and 15B may be performed to form various contact via structures (88, 86, 8P).

Each backside contact via structure 76 comprises at least one core fill conductive material portion (773, 776). While in the above embodiment the at least one core fill conductive material portion (773, 776) comprises a first core fill conductive material portion 773 and a second core fill conductive material portion 776 having different compositions, embodiments are expressly contemplated herein in which the first and the second core fill conductive material portions have the same composition. For example, both the first core fill conductive material portion 773 and the second core fill conductive material portion 776 may consist essentially of tungsten.

In one embodiment, a backside trench fill structure (74, 76) is formed in each backside trench 79. The backside trench fill structure (74, 76) comprises a backside trench insulating spacer 74 that contacts each layer within the alternating stack (32, 46) and a backside contact via structure 76 that is laterally surrounded by the backside trench insulating spacer 74. The backside contact via structure 76 comprises a tungsten nitride liner 770 in contact with the entirety of an inner sidewall of the backside trench insulating spacer 74, a metallic nitride liner 771 other than tungsten nitride in contact with the tungsten nitride liner 770 and spaced from the backside trench insulating liner 74, a first core fill conductive material portion 773 laterally surrounded by the metallic nitride liner 771, and a second core fill conductive material portion 776 overlying the first core fill material portion 773.

In one embodiment, the tungsten nitride liner 770 vertically extends from the substrate (9, 10) to a horizontal plane including a topmost surface of the backside contact via structure 76. In one embodiment, a topmost surface of the metallic nitride liner 771 is located below the horizontal plane including the topmost surface of the backside contact via structure 76. In one embodiment, the first core fill conductive material portion 773 contacts a segment of an inner sidewall of the tungsten nitride liner 770. In one embodiment, the second core fill conductive material portion 776 contacts an inner sidewall of the tungsten nitride liner 770. In one embodiment, one of the first core fill conductive material portion 773 and the second core fill conductive material portion 776 comprises a tensile-stress-generating metallic material, and another of the first core fill conductive material portion 773 and the second core fill conductive material portion comprises a compressive-stress-generating conductive material. In one embodiment, one of the first core fill conductive material portion 773 and the second core fill conductive material portion 776 comprises tungsten, and another of the first core fill conductive material portion 773 and the second core fill conductive material portion comprises a metal selected from molybdenum, cobalt, or ruthenium. In one embodiment, a bottom portion of the second core fill conductive material portion 776 protrudes downward below a horizontal plane including a topmost surface of the metallic nitride liner 771 and contacts a tapered surface the first core fill conductive material portion 773.

Figure 22A:
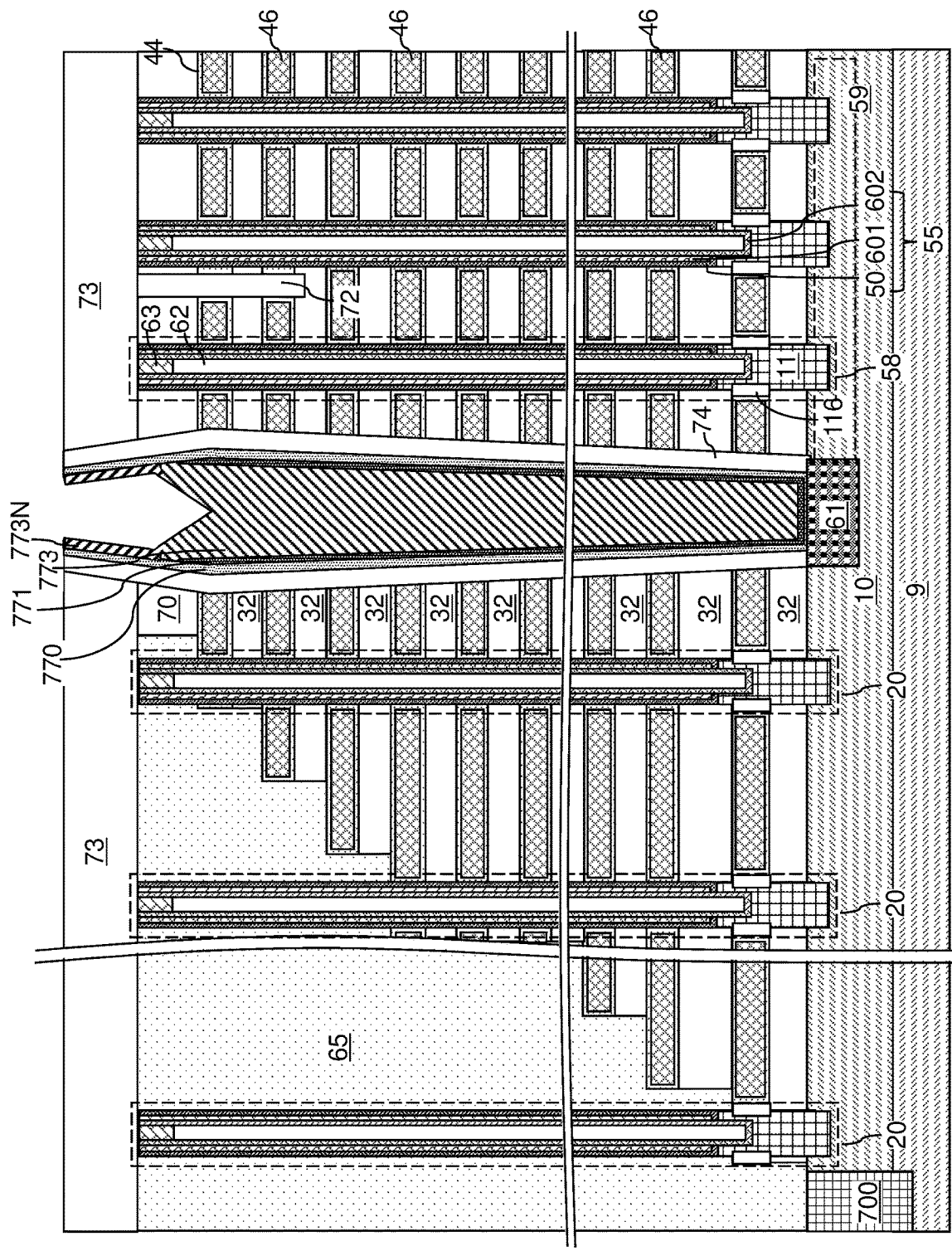
FIGS. 22A-22C are sequential schematic vertical cross-sectional view of a ninth configuration of the exemplary structure during formation of backside trench fill structures and contact via structures according to a ninth embodiment of the present disclosure.
Figure 22B:
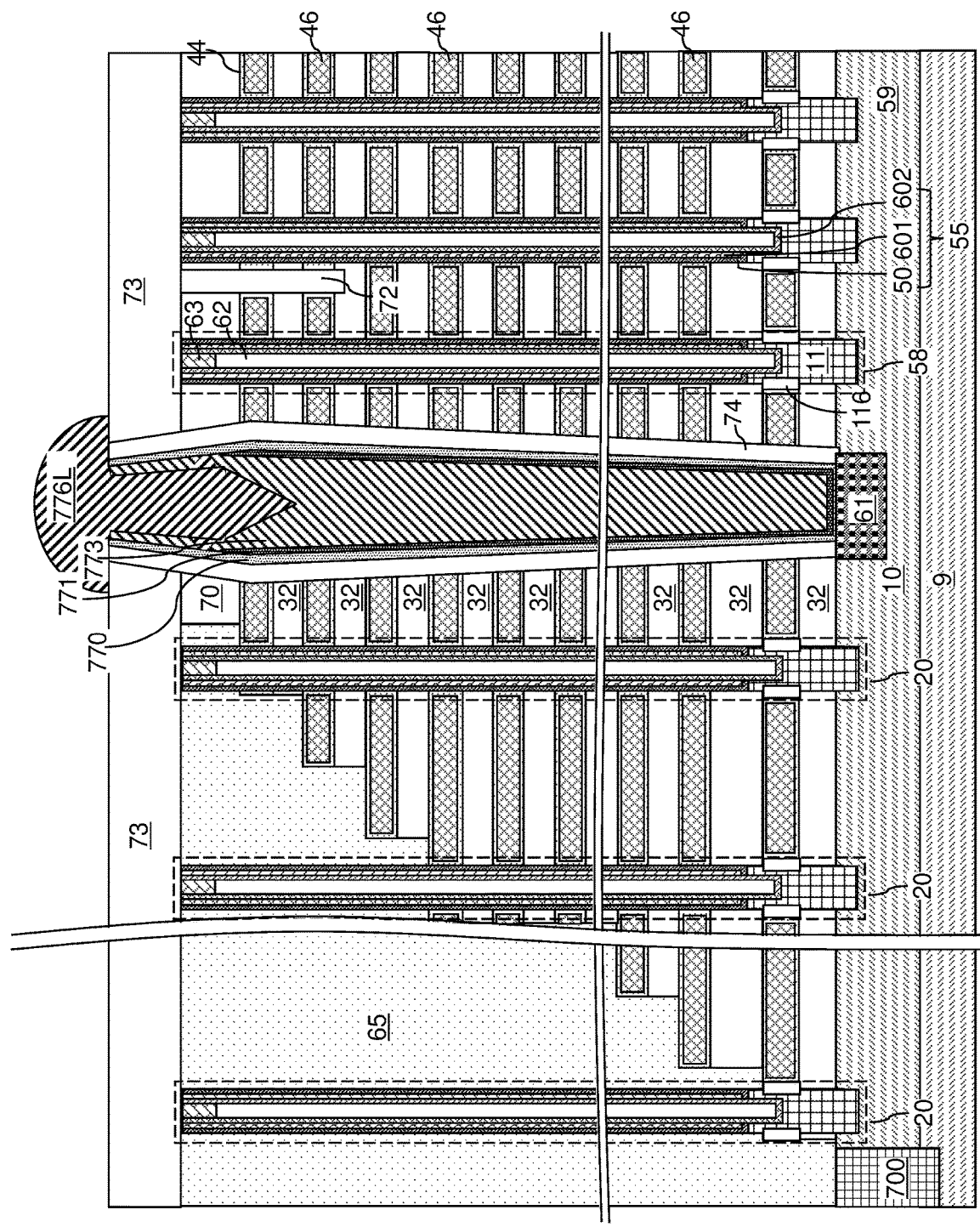
Figure 22C:
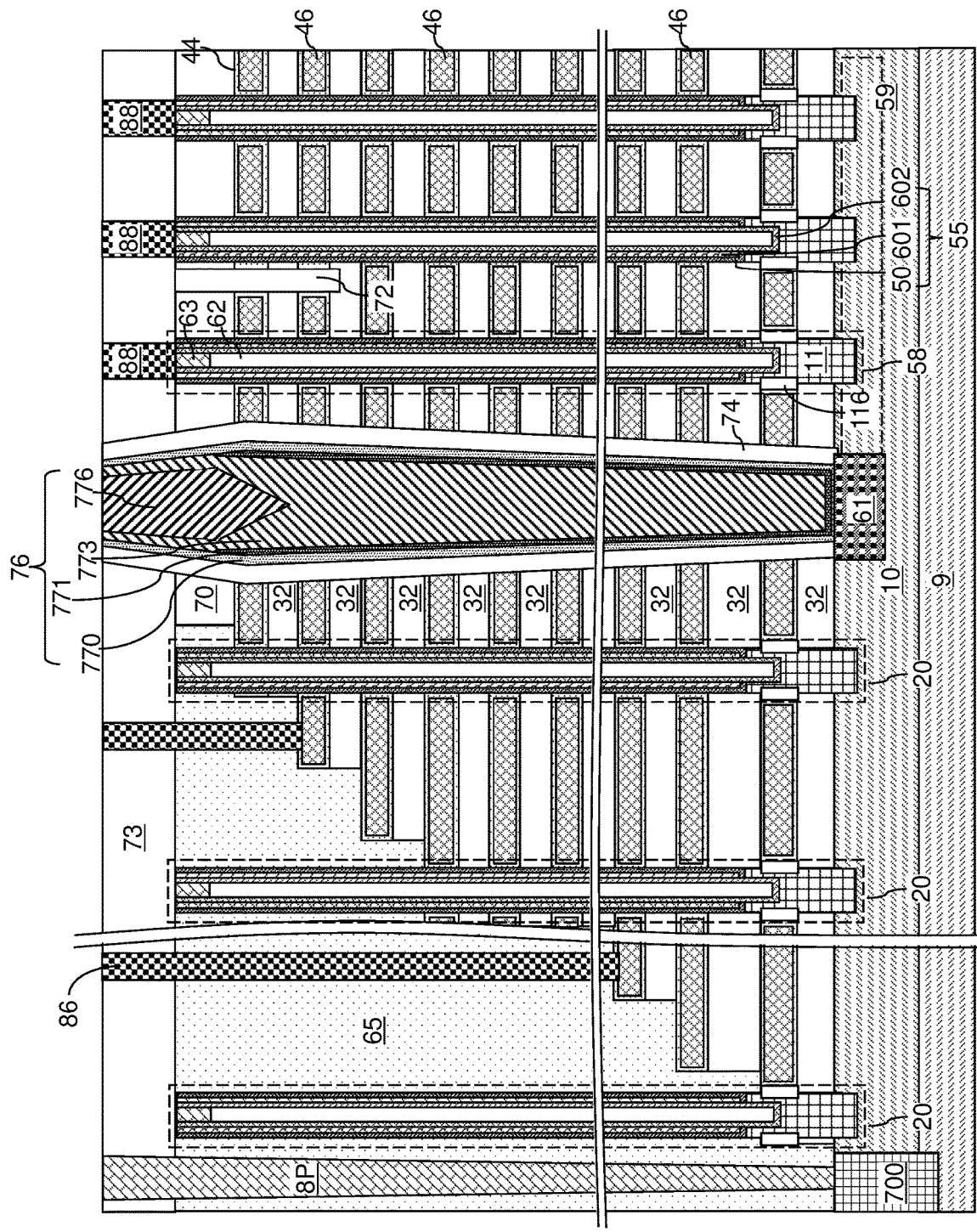

FIGS. 22A-22C are sequential schematic vertical cross-sectional view of a ninth configuration of the exemplary structure during formation of backside trench fill structures (74, 76) and contact via structures (88, 86, 8P) according to a ninth embodiment of the present disclosure.

Referring to FIG. 22A, the ninth configuration of the exemplary structure can be derived from the eighth configuration of the exemplary structure illustrated in FIG. 21C by forming additional tungsten nucleation layer 773N portions on physically exposed sidewalls of the tungsten nitride liner 770. The thickness of the tungsten nucleation layer 773N portions may be in a range from 0.6 nm to 50 nm, such as from 2 nm to 20 nm, although lesser and greater thicknesses may also be employed.

Referring to FIG. 22B, the second core fill conductive material can be selectively deposited in remaining unfilled volumes of the backside trenches 79 to form a second core fill conductive material layer 776L on the tungsten nucleation layer 773N portions. In one embodiment, the first core fill conductive material portions 773 comprise, and/or consist essentially of, tungsten, and the second core fill conductive material layer 776L comprises, and/or consists essentially of, a metal other than tungsten, such as titanium, tantalum, molybdenum, cobalt, or ruthenium.

Referring to FIG. 22C, a planarization process can be performed to remove horizontally-extending portions of the conductive materials of the second core fill conductive material layer 776L from above the horizontal plane including the top surface of the contact-level dielectric layer 73 to form the second core fill conductive material portion 776. The planarization process may employ a chemical mechanical polishing (CMP) process and/or a recess etch process. Generally, conductive material portions can be removed from above a horizontal plane that is located at, or above, a topmost surface of the alternating stack (32, 46). Remaining conductive material portions that fill the backside cavities constitute backside contact via structures 76. Subsequently, the processing steps of FIGS. 15A and 15B may be performed to form various contact via structures (88, 86, 8P).

Figure 23:
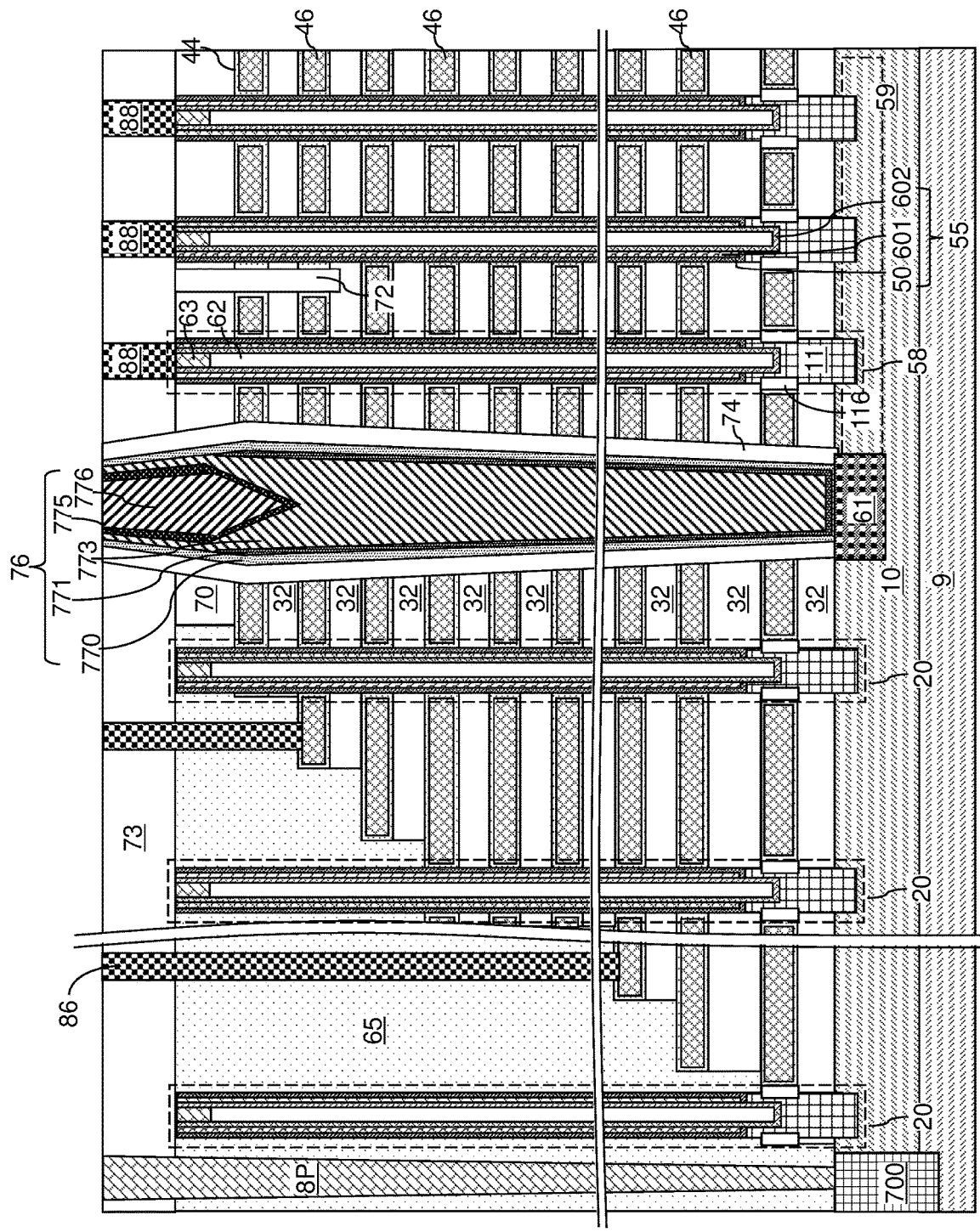
FIG. 23 is a schematic vertical cross-sectional view of a tenth configuration of the exemplary structure after formation of backside trench fill structures and contact via structures according to tenth embodiment of the present disclosure.

FIG. 23 is sequential schematic vertical cross-sectional view of a tenth configuration of the exemplary structure during formation of backside trench fill structures (74, 76) and contact via structures (88, 86, 8P) according to a tenth embodiment of the present disclosure. In this embodiment, a metal liner 775 other than tungsten is formed between the first and the second core fill conductive material portions (773, 776) of the ninth embodiment shown in FIG. 22C, similar to the structure shown in FIG. 20C and described above. The first and the second core fill conductive material portions (773, 776) may comprise tungsten and the metal liner 775 may comprise Mo, Co or Ru having an opposite stress state to that of tungsten.

FIGS. 24A-24D are sequential schematic vertical cross-sectional view of an eleventh configuration of the exemplary structure during formation of backside trench fill structures (74, 76) and contact via structures (88, 86, 8P) according to an eleventh embodiment of the present disclosure.

Figure 24A:
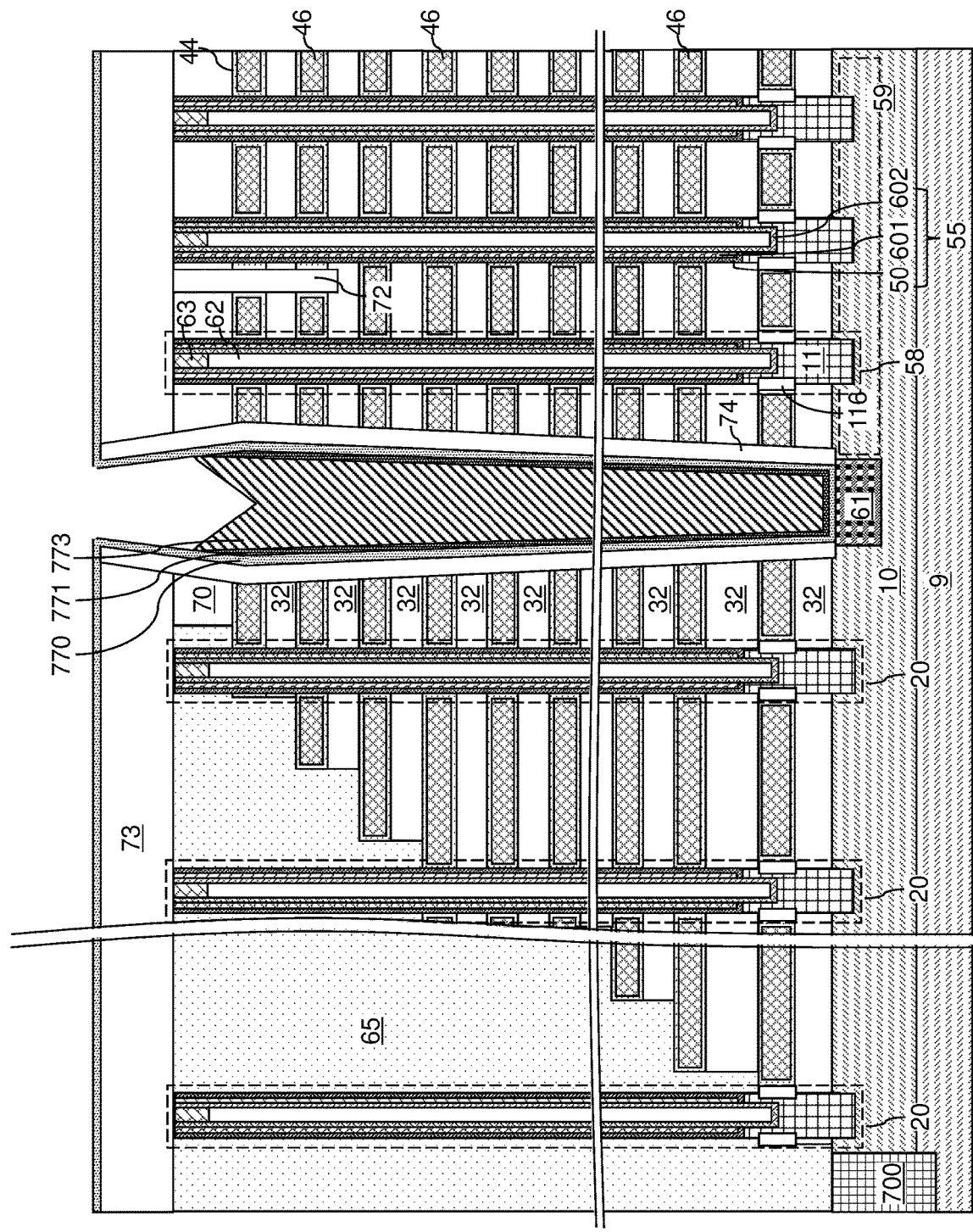
FIGS. 24A-24D are sequential schematic vertical cross-sectional view of an eleventh configuration of the exemplary structure during formation of backside trench fill structures and contact via structures according to an eleventh embodiment of the present disclosure.

Referring to FIG. 24A, the eleventh configuration of the exemplary structure may be the same as the eighth configuration of the exemplary structure illustrated in FIG. 21C.

Figure 24B:
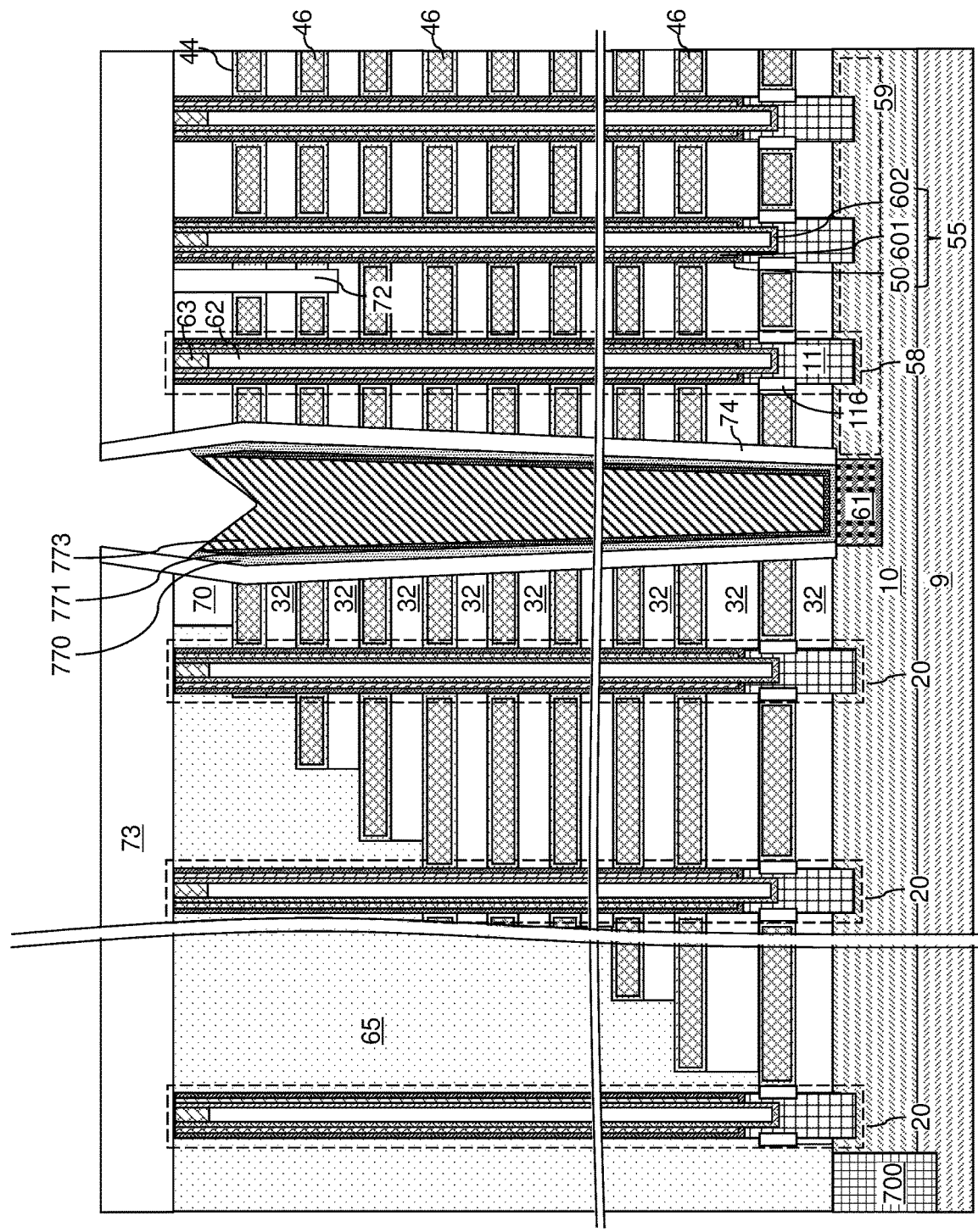

Referring to FIG. 24B, physically exposed portions of the tungsten nitride liner 770 can be removed by performing a selective etch process. The etch process may remove the material of the tungsten nitride liner 770 selective to the dielectric materials of the contact-level dielectric layer 73 and the backside trench insulating spacer 74. Surface regions of the first core fill conductive material portion 773 may or may not be collaterally recessed during the etch process. The etch process may comprise an isotropic etch process such as a wet etch process, or may comprise an anisotropic etch process such as a reactive ion etch process.

Figure 24C:
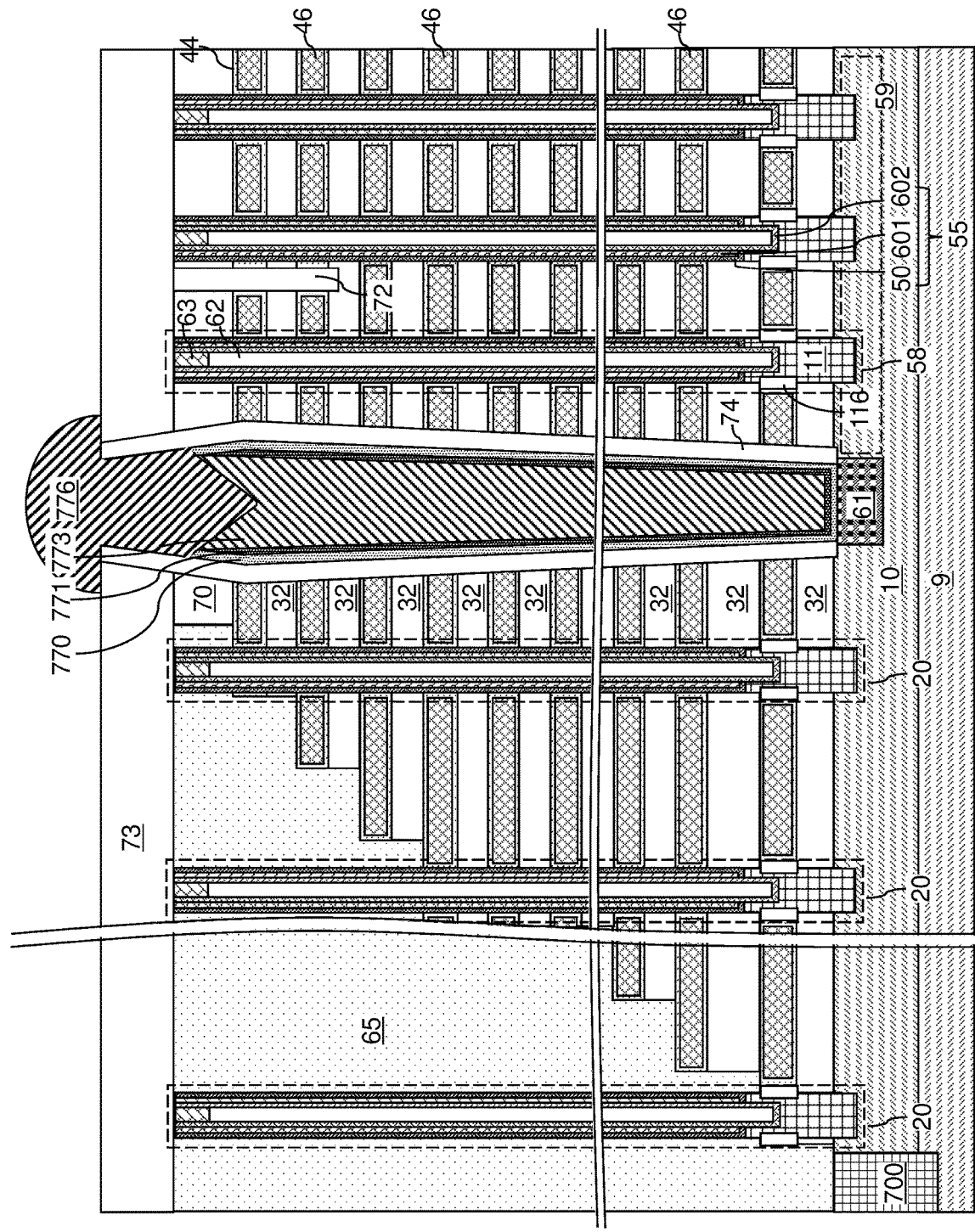

Referring to FIG. 24C, an additional conductive material can be deposited in remaining unfilled volumes of the backside trenches 79 to form a second core fill conductive material portion 776 in each backside trench 79. The additional conductive material is herein referred to as a second core fill conductive material. The second core fill conductive material can be deposited by performing a selective deposition process that deposits a second core fill conductive material from physically exposed surfaces of the first core fill conductive material portions 773 while suppressing growth of the second core fill conductive material from physically exposed dielectric surfaces of the contact-level dielectric layer 73 and the backside trench insulating spacers 74. A second core fill conductive material portion 776 grows from the physically exposed surfaces of the first core fill conductive material portion 773 within each backside trench 79, and fills an upper portion of the respective backside trench 79. In one embodiment, the first core fill conductive material portions 773 comprise and/or consist essentially of tungsten, and the second core fill conductive material portions 776 comprise and/or consist essentially of a metal other than tungsten, such as selected from titanium, tantalum, molybdenum, cobalt, or ruthenium. Alternatively, the second core fill conductive material portions 776 may also comprise tungsten.

Figure 24D:
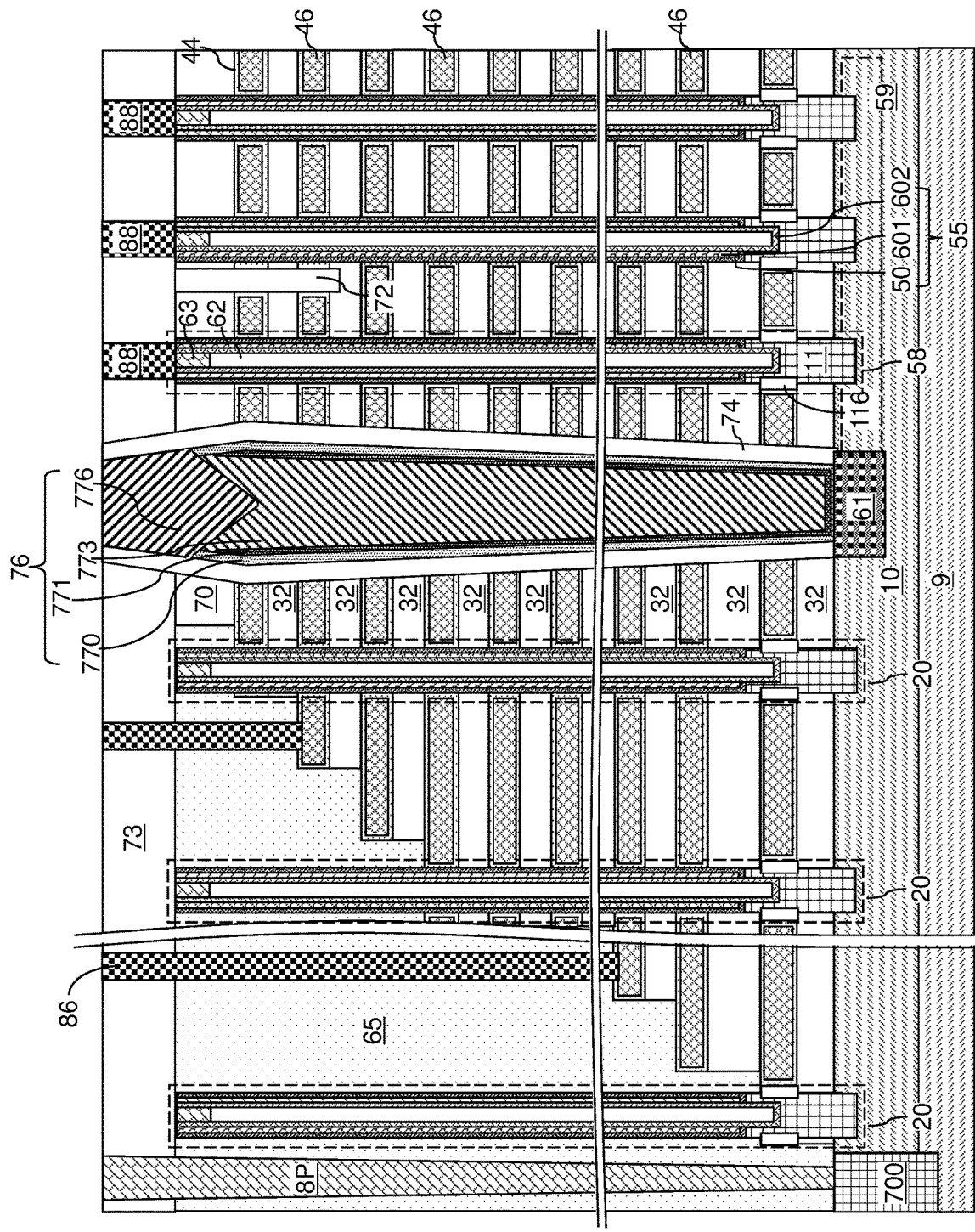

Referring to FIG. 24D, a planarization process can be performed to remove portions of the second core fill conductive material portion 776 from above the horizontal plane including the top surface of the contact-level dielectric layer 73. The planarization process may employ a chemical mechanical polishing (CMP) process and/or a recess etch process. Generally, conductive material portions can be removed from above a horizontal plane that is located at, or above, a topmost surface of the alternating stack (32, 46). Remaining conductive material portions that fill the backside cavities constitute backside contact via structures 76. The processing steps of FIGS. 15A and 15B may be performed to form various contact via structures (88, 86, 8P).

Each backside contact via structure 76 comprises at least one core fill conductive material portion (773, 776). A backside trench fill structure (74, 76) is formed in each backside trench 79. The backside trench fill structure (74, 76) comprises a backside trench insulating spacer 74 that contacts each layer within the alternating stack (32, 46) and a backside contact via structure 76 that is laterally surrounded by the backside trench insulating spacer 74. The backside contact via structure 76 comprises a tungsten nitride liner 770 in contact with a lower portion of an inner sidewall of the backside trench insulating spacer 74, a metallic nitride liner 771 in contact with the tungsten nitride liner 770 and spaced from the backside trench insulating liner 74, a first core fill conductive material portion 773 laterally surrounded by the metallic nitride liner 771, and a second core fill conductive material portion 776 overlying the first core fill material portion 773.

In one embodiment, the tungsten nitride liner 770 vertically extends from the substrate (9, 10) to a horizontal plane including a topmost surface of the backside contact via structure 76. In one embodiment, a topmost surface of the metallic nitride liner 771 is located below the horizontal plane including the topmost surface of the backside contact via structure 76. In one embodiment, the first core fill conductive material portion 773 contacts a segment of an inner sidewall of the tungsten nitride liner 770. In one embodiment, the second core fill conductive material portion 776 contacts a segment of an inner sidewall of a respective backside trench insulating spacer 74. In one embodiment, the second core fill conductive material portion 776 is in contact with a top end surface of the tungsten nitride liner 770.

In one embodiment, one of the first core fill conductive material portion 773 and the second core fill conductive material portion comprises a tensile-stress-generating metallic material, and another of the first core fill conductive material portion 773 and the second core fill conductive material portion comprises a compressive-stress-generating conductive material. In one embodiment, one of the first core fill conductive material portion 773 and the second core fill conductive material portion comprises tungsten, and another of the first core fill conductive material portion 773 and the second core fill conductive material portion comprises a metal selected from titanium, tantalum, molybdenum, cobalt, and ruthenium. In one embodiment, a bottom portion of the second core fill conductive material portion 776 protrudes downward below a horizontal plane including a topmost surface of the metallic nitride liner 771 and contacts a tapered surface the first core fill conductive material portion 773.

Figure 25:
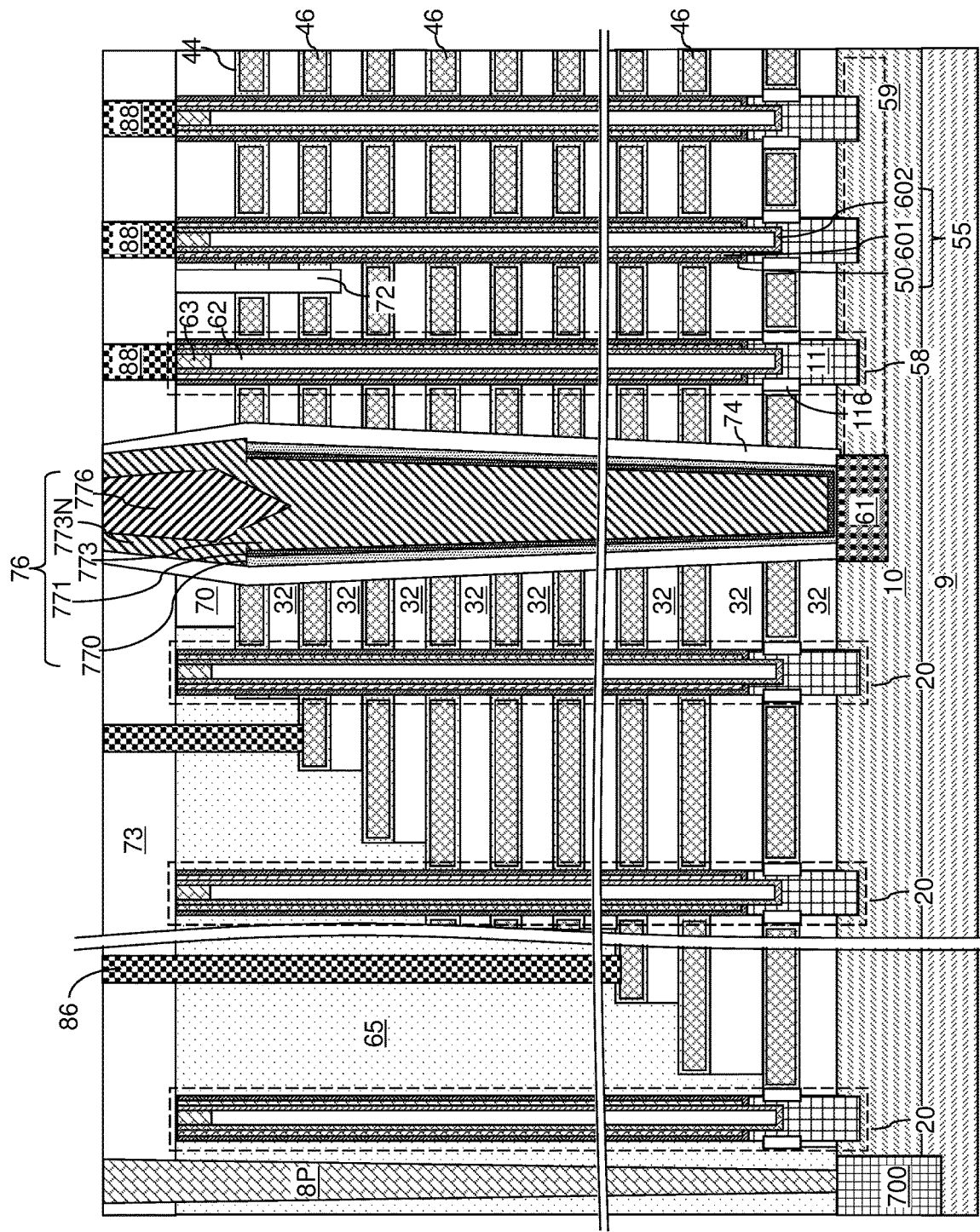
FIG. 25 is schematic vertical cross-sectional view of a twelfth configuration of the exemplary structure after formation of backside trench fill structures and contact via structures according to a twelfth embodiment of the present disclosure.

FIG. 25 is a schematic vertical cross-sectional view of a twelfth configuration of the exemplary structure after formation of backside trench fill structures (74, 76) and contact via structures (88, 86, 8P) according to the twelfth embodiment of the present disclosure.

Referring to FIG. 25, the twelfth configuration of the exemplary structure can be derived from the eleventh configuration of the exemplary structure illustrated in FIG. 24D by forming additional tungsten nucleation layer 773N portions on physically exposed sidewalls of backside trench insulating spacer 74, as described above with respect to FIG. 22A.

Figure 26:
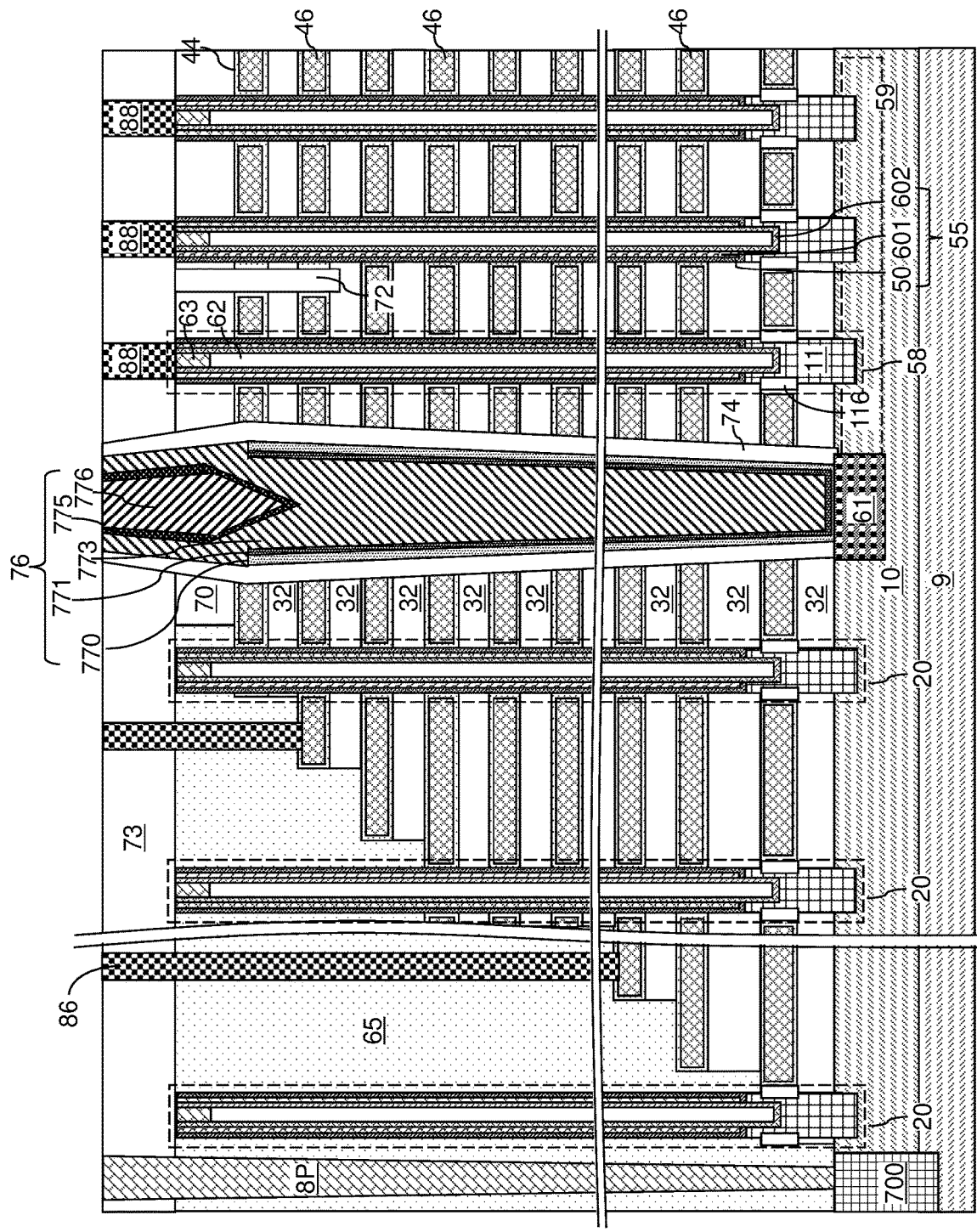
FIG. 26 is a schematic vertical cross-sectional view of a thirteenth configuration of the exemplary structure after formation of backside trench fill structures and contact via structures according to a thirteenth embodiment of the present disclosure.

FIG. 26 is a schematic vertical cross-sectional view of a thirteenth configuration of the exemplary structure after formation of backside trench fill structures (74, 76) and contact via structures (88, 86, 8P) according to the thirteenth embodiment of the present disclosure.

In this embodiment, the metal liner 775 other than tungsten is formed between the first and the second core fill conductive material portions (773, 776) of the twelfth embodiment shown in FIG. 25, similar to the structure shown in FIG. 20C and described above. The first and the second core fill conductive material portions (773, 776) may comprise tungsten and the metal liner 775 may comprise Mo, Co or Ru having an opposite stress state to that of tungsten.

Referring to first, second and third embodiments of the present disclosure, a three dimensional memory device comprises an alternating stack (32, 46) of insulating layers 32 and electrically conductive layers 46; memory openings 49 vertically extending through the alternating stack (32, 46); memory opening fill structures 58 located in the memory openings 49 and comprising a respective vertical semiconductor channel 60 and a respective vertical stack of memory elements (e.g., portions of the memory film); and a backside trench fill structure (74, 76) laterally extending along a first horizontal direction, wherein: the backside trench fill structure (74, 76) comprises a backside trench insulating spacer 74 and a backside contact via structure 76 that is laterally surrounded by the backside trench insulating spacer 74; and the backside contact via structure 76 comprises a first metal layer 762, a second metallic nitride liner 763 comprising a nitride of the first metal and contacting an inner sidewall of the first metal layer 762, a tapered metallic nitride liner 765 is located inside the second metallic nitride liner 763, and at least one core fill conductive material portion 766 that is laterally surrounded by the second metallic nitride liner 763.

In one embodiment, the tapered metallic nitride liner 765 has a tapered vertical profile such that a lateral thickness of the tapered metallic nitride liner 765 decreases with a vertical distance from a horizontal plane including a topmost surface of the backside contact via structure 76 and has a vertical extent that is less than a vertical extent of the second metallic nitride liner 763. In one embodiment, the vertical extent of the tapered metallic nitride liner 765 is 50% or less of a height of the backside contact via structure 76.

In one embodiment, the first metal layer 762 comprises tungsten, the second metallic nitride liner 763 comprises tungsten nitride and the tapered metallic nitride liner 765 also comprises tungsten nitride. In one embodiment, the at least one core fill conductive material portion 766 comprises a tungsten fill material portion having an opposite stress state than the second metallic nitride liner 763.

In the first embodiment, the tapered metallic nitride liner 765 contacts an upper portion of an inner sidewall of the second metallic nitride liner 763.

In the second embodiment, the backside contact via structure 76 further comprises a second metal layer 764 located between the second metallic nitride liner 763 and the at least one core fill conductive material portion 766. The second metal layer 764 may comprise a second tungsten layer, and the tapered metallic nitride liner 765 contacts an upper portion of an inner sidewall of the second metal layer 764.

In some embodiments, the backside contact via structure 76 further comprises a first metallic nitride liner 761 comprising a nitride of a metal other than tungsten, and located between the backside trench insulating spacer 764 and the first metal layer 762. The first metallic nitride liner 761 may comprise titanium nitride.

Referring to the first through eighth embodiments of the present disclosure, a three dimensional memory device comprises an alternating stack of insulating layers 32 and electrically conductive layers 46, memory openings 49 vertically extending through the alternating stack, memory opening fill structures 58 located in the memory openings and comprising a respective vertical semiconductor channel 60 and a respective vertical stack of memory elements (e.g., portions of the memory material layer 54), and a backside trench fill structure (74, 76) laterally extending along a first horizontal direction. The backside trench fill structure comprises a backside trench insulating spacer 74 and a backside contact via structure 76 that is laterally surrounded by the backside trench insulating spacer. The backside contact via structure 76 comprises a first metallic nitride liner 761 in contact with the backside trench insulating spacer 764, a tapered metallic nitride liner 765 having a tapered vertical profile such that a lateral thickness of the tapered metallic nitride liner decreases with a vertical distance from a horizontal plane including a topmost surface of the backside contact via structure 76 and has a vertical extent that is less than a vertical extent of the first metallic nitride liner 761, and at least one core fill conductive material portion (766, 767, 773 and/or 776) that is laterally surrounded by the first metallic nitride liner 761.

According to the ninth to thirteenth embodiments of the present disclosure, a three dimensional memory device comprises an alternating stack of insulating layers 32 and electrically conductive layers 46, memory openings 49 vertically extending through the alternating stack, memory opening fill structures 58 located in the memory openings and comprising a respective vertical semiconductor channel 60 and a respective vertical stack of memory elements (e.g., portions of the memory material layer 54), and a backside trench fill structure (74, 76) laterally extending along a first horizontal direction. The backside trench fill structure comprises a backside trench insulating spacer 74 and a backside contact via structure 76 that is laterally surrounded by the backside trench insulating spacer. The backside contact via structure 76 comprises a tungsten nitride liner 770 in contact with at least a lower portion of an inner sidewall of the backside trench insulating spacer 74, a metallic nitride liner 771 other than tungsten nitride in contact with the tungsten nitride liner 770 and spaced from the backside trench insulating liner 774, a first core fill conductive material portion 773 laterally surrounded by the metallic nitride liner, and a second core fill conductive material portion 776 overlying the first core fill material portion 773.

In a fourteenth configuration of the exemplary structure, a second metallic nitride liner 863 is located laterally between the first metallic nitride liner 861 and a metal core fill conductive material portion 866. The second metallic nitride liner 863 has a lattice constant and a coefficient of thermal expansion between the values of the lattice constant and the coefficient of thermal expansion for the first metallic nitride liner 861 and the values of the lattice constant and the coefficient of thermal expansion of the metal core fill conductive material portion 866.

In one embodiment, the second metallic nitride liner 863 has a lattice constant that is smaller than the lattice constant of the first metallic nitride liner 861, and larger than the lattice constant of the metal core fill conductive material portion 866. In one embodiment, the second metallic nitride liner 863 has a coefficient of thermal expansion that is smaller than the coefficient of thermal expansion of first metallic nitride liner 861, and larger than the coefficient of thermal expansion of the metal core fill conductive material portion 866. The amount of stress and warpage imposed in the substrate by the backside contact via structure 76 may be decreased by gradually decreasing the lattice parameter and/or the coefficient of thermal expansion of the layers of the backside contact via structure 76 from the outside toward the inside of the backside contact via structure 76.

The first metallic nitride liner 861 includes a different metal (e.g., Ti) than a metal (e.g., W or Mo) of the second metallic nitride liner 863. In one embodiment, the second metallic nitride liner 863 comprises a nitride of a metal (e.g., W or Mo) which is the same as the metal (W or Mo) that comprises the metal core fill conductive material portion 866.

A non-limiting list of materials that may be used as the first metallic nitride liner, the second metallic nitride liner, and the metal core fill conductive material portion are listed in Table 1 below.

TABLE 1

| Material | Use | Lattice Parameter (in nm) | CTE (in units of $10^{-6}$/ °C.) |
|---|---|---|---|
| Ti | First metal layer 860; and/or Metal of the first metallic nitride liner 861 | | |
| TiN | First metallic nitride liner 861 | 0.424 | 7.75 |
| WN | Second metallic nitride liner 863 | 0.416 | ~5.7 |
| MoN | Second metallic nitride liner 863 | 4.16 | ~6.7 |
| W | Core fill conductive material portion 866 | 0.317 | 4.5 |
| Mo | Core fill conductive material portion 866 | 0.314 | 5.2 |

Figure 27A:
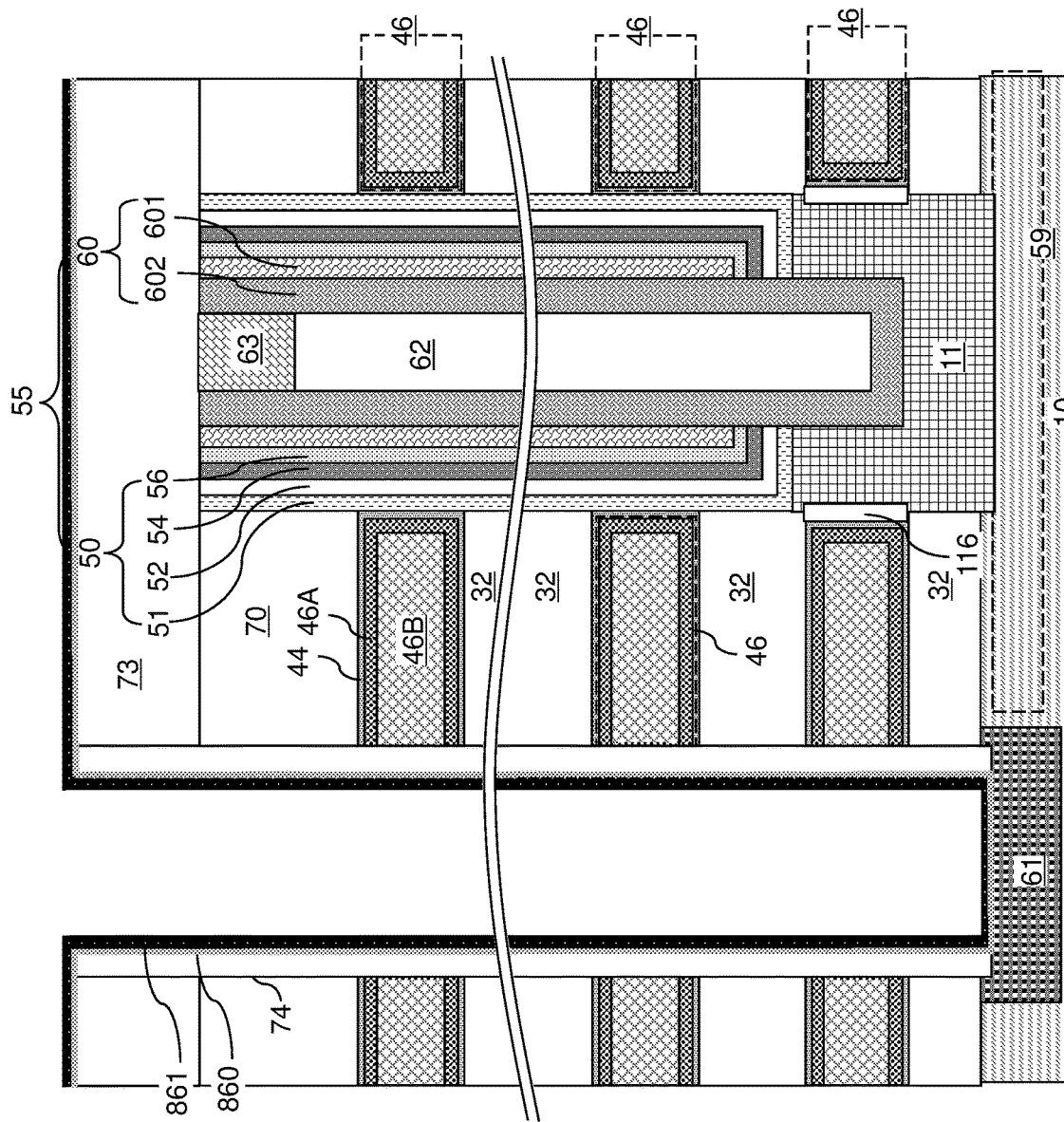
FIGS. 27A-27G are sequential vertical cross-sectional views of a fourteenth configuration of the exemplary structure during formation of a backside trench fill structure according to a fourteenth embodiment of the present disclosure.

Referring to FIG. 27A, a fourteenth configuration of the exemplary structure is illustrated, which can be derived from the exemplary structure illustrated in FIG. 12A by forming an optional first metal layer 860 comprising and/or consisting essentially of a first metal. The first metal may comprise titanium. The first metal layer 860 can be deposited directly on the physically exposed surfaces of the backside trench insulating spacers 74, on the source regions 61, and on the top surface of the contact-level dielectric layer 73. The first metal layer 860 may be deposited by chemical vapor deposition, atomic layer deposition or physical vapor deposition. In one embodiment, the first metal layer 860 may be deposited by a conformal deposition method, such as chemical vapor deposition. In this case, the thickness of the first metal layer 860 may be uniform throughout. The thickness of the first metal layer 860 may be in a range from 10 nm to 200 nm, although lesser and greater thicknesses may also be employed. Alternatively, the first metal layer 860 may be omitted.

Figure 27B:
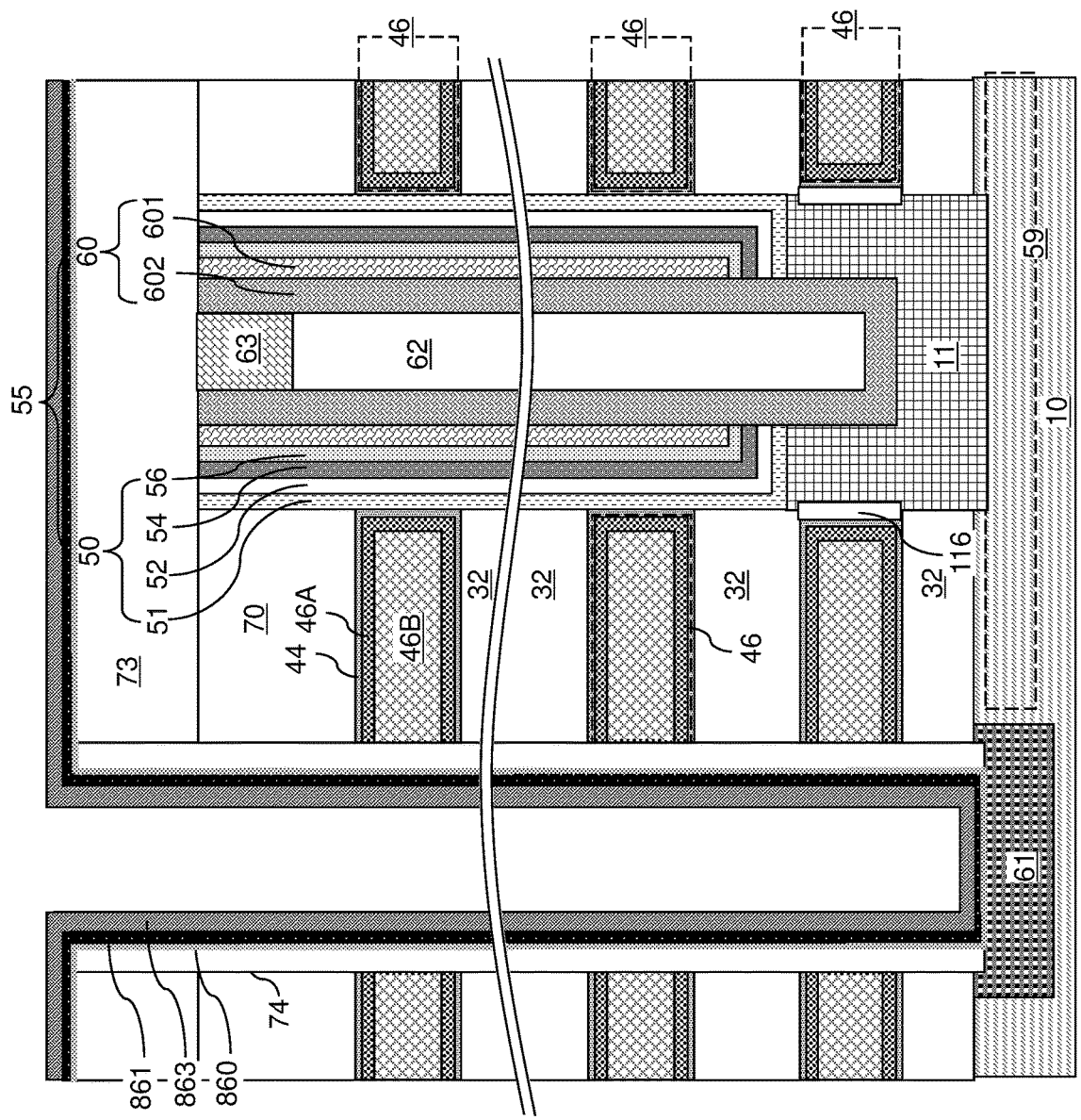

Referring to FIG. 27B, a first metallic nitride liner 861 can formed on the first metal layer 860 (if present, or on the physically exposed surfaces of the backside trench insulating spacers 74, on the source regions 61, and on the top surface of the contact-level dielectric layer 73, if the first metal layer 860 is omitted). The first metallic nitride liner 861 comprises and/or consists essentially of the nitride of the first metal, and may comprise titanium nitride. The first metallic nitride liner 861 may be formed directly on the physically exposed surfaces (such as the inner sidewalls) of the first metal layer 860. The first metallic nitride liner 861 may be deposited by chemical vapor deposition, atomic layer deposition or physical vapor deposition. In one embodiment, the first metallic nitride liner 861 may be deposited by a conformal deposition method, such as chemical vapor deposition. In this case, the thickness of the first metallic nitride liner 861 may be uniform throughout. The thickness of the first metallic nitride liner 861 may be in a range from 10 nm to 200 nm, although lesser and greater thicknesses may also be employed.

Figure 27C:
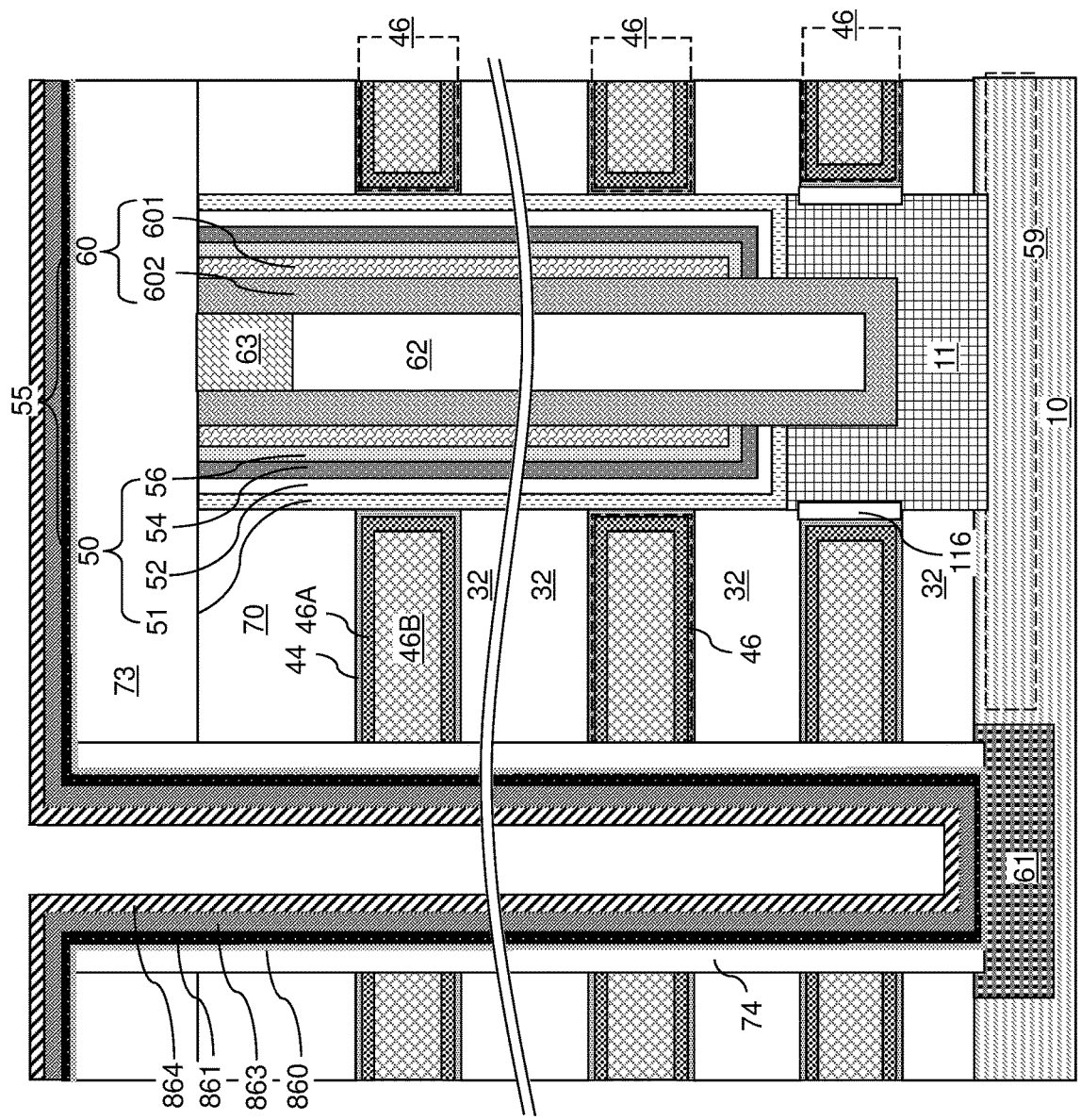

Referring to FIG. 27C, a second metallic nitride liner 863 can be deposited on the first metallic nitride liner 861. The second metallic nitride liner 863 comprises and/or consists essentially of the nitride of the second metal which is different from the first metal, and may comprise tungsten nitride or molybdenum nitride. The second metallic nitride liner 863 is formed directly on the physically exposed surfaces (such as the inner sidewalls) of the first metallic nitride layer 861. The second metallic nitride liner 863 may be deposited by chemical vapor deposition, atomic layer deposition or physical vapor deposition. In one embodiment, the second metallic nitride liner 863 may be deposited by a conformal deposition method, such as chemical vapor deposition. In this case, the thickness of the second metallic nitride liner 863 may be uniform throughout. The thickness of the second metallic nitride liner 863 may be in a range from 10 nm to 200 nm, although lesser and greater thicknesses may also be employed. In one embodiment, the second metallic nitride liner 863 may be deposited as a polycrystalline material by employing an elevated deposition temperature, which may be in a range from 300 degrees Celsius to 400 degrees Celsius, although lower and higher deposition temperatures may also be employed.

Figure 27D:
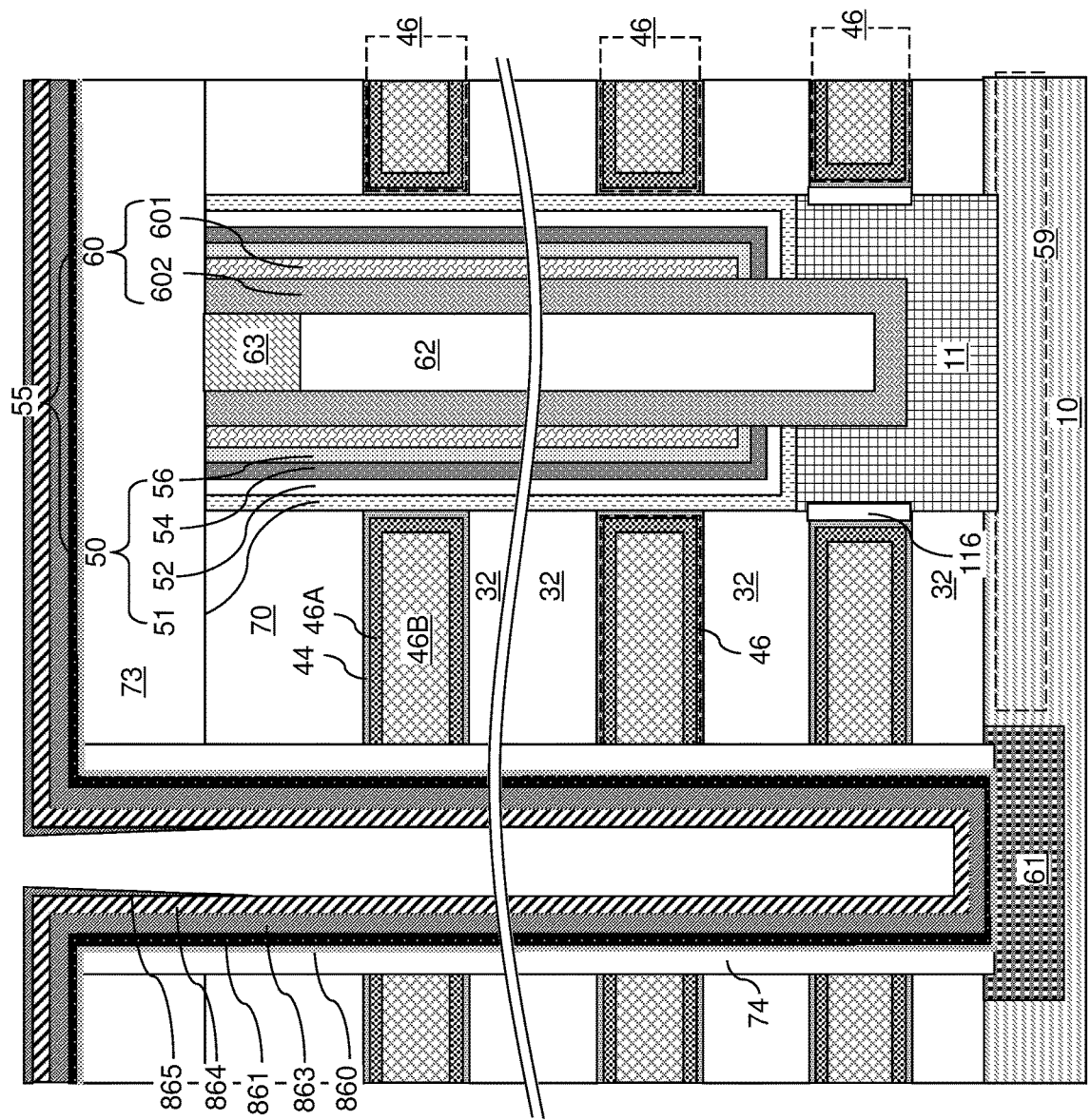

Referring to FIG. 27D, an optional second metal layer 764 can be deposited over the second metallic nitride liner 763. The second metal layer 764 may comprise a tungsten nucleation layer if the core fill conductive material portion 866 comprises tungsten. Alternatively, if the core fill conductive material portion 866 comprises molybdenum, then the second metal layer 764 may be omitted.

Furthermore, an optional tapered metallic nitride liner 865 may be formed on the second metal layer 764 if the core fill conductive material portion 866 comprises tungsten. The tapered metallic nitride liner 865 may be the same as the tapered metallic nitride liner 765, and may be formed by the same process as the tapered metallic nitride liner 765. The tapered metallic nitride liner 865 may comprise a non-conformal, tapered tungsten nitride liner. The tapered metallic nitride liner 865 may be amorphous. Alternatively, if the core fill conductive material portion 866 comprises molybdenum, then the tapered metallic nitride liner 865 may be omitted.

Figure 27E:
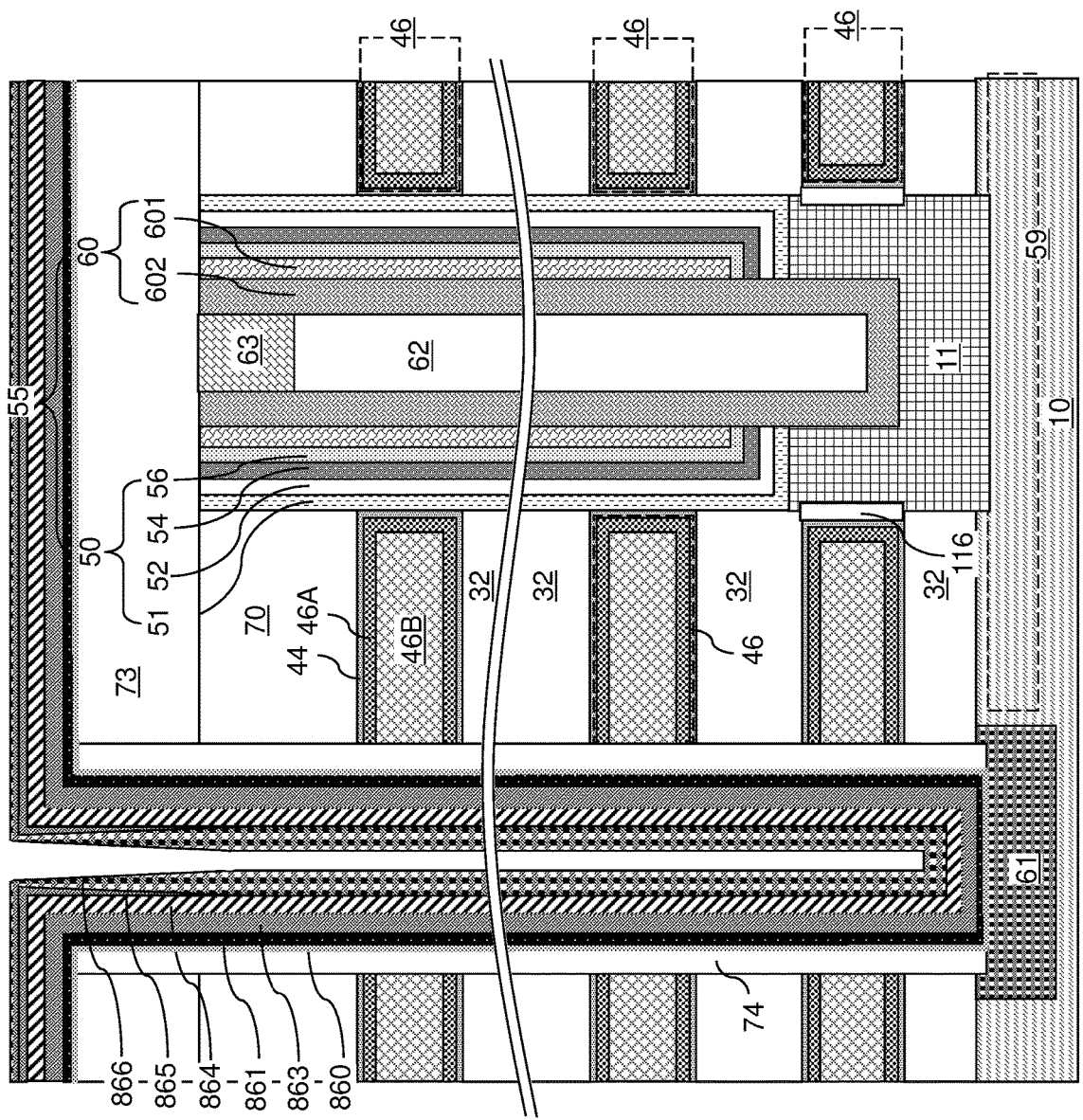

Referring to FIG. 27E, a first metal core fill conductive material portion 866 is formed over the second metallic nitride liner 863 (and over the optional second metal layer 764 and over the optional tapered metallic nitride liner 865 if present). If the first metal core fill conductive material portion 866 comprises tungsten, then it may be deposited using the ICEfill® ALD process available from Lam Research as described above over the second tungsten nitride liner 863, over the tungsten second metal layer (i.e., nucleation layer) 764 and over the tapered tungsten nitride liner 865. If the a first metal core fill conductive material portion 866 comprises molybdenum, then it may be deposited directly on the second molybdenum nitride liner 863 using any suitable molybdenum deposition process, such as CVD, ALD or sputtering.

Figure 27F:
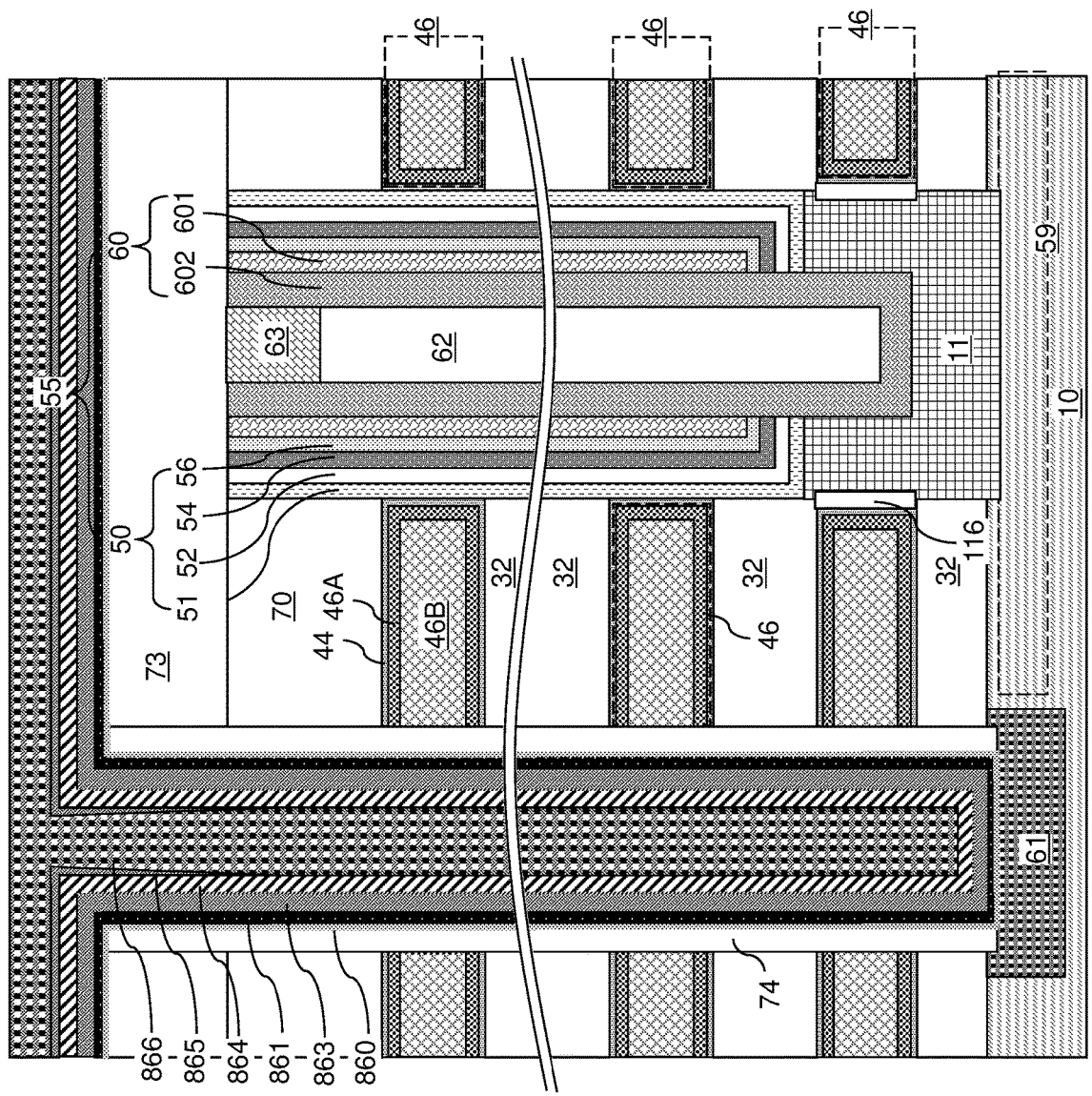

Referring to FIG. 27F, the deposition process for deposition of the second metal can be continued to further grow the first metal core fill conductive material portion 866. The deposition process can be continued to fill the entire cavity in each of the backside trenches 79. Generally, the first metal core fill conductive material portion 866 consisting essentially of the second metal can be deposited on the inner sidewalls of the second metallic nitride liner 863 or on the inner sidewalls of the tapered metallic nitride liner 865 (if present). Thus, the tapered metallic nitride liner 865 (if present) contacts an upper portion of an outer sidewall of the first metal core fill conductive material portion 866.

Figure 27G:
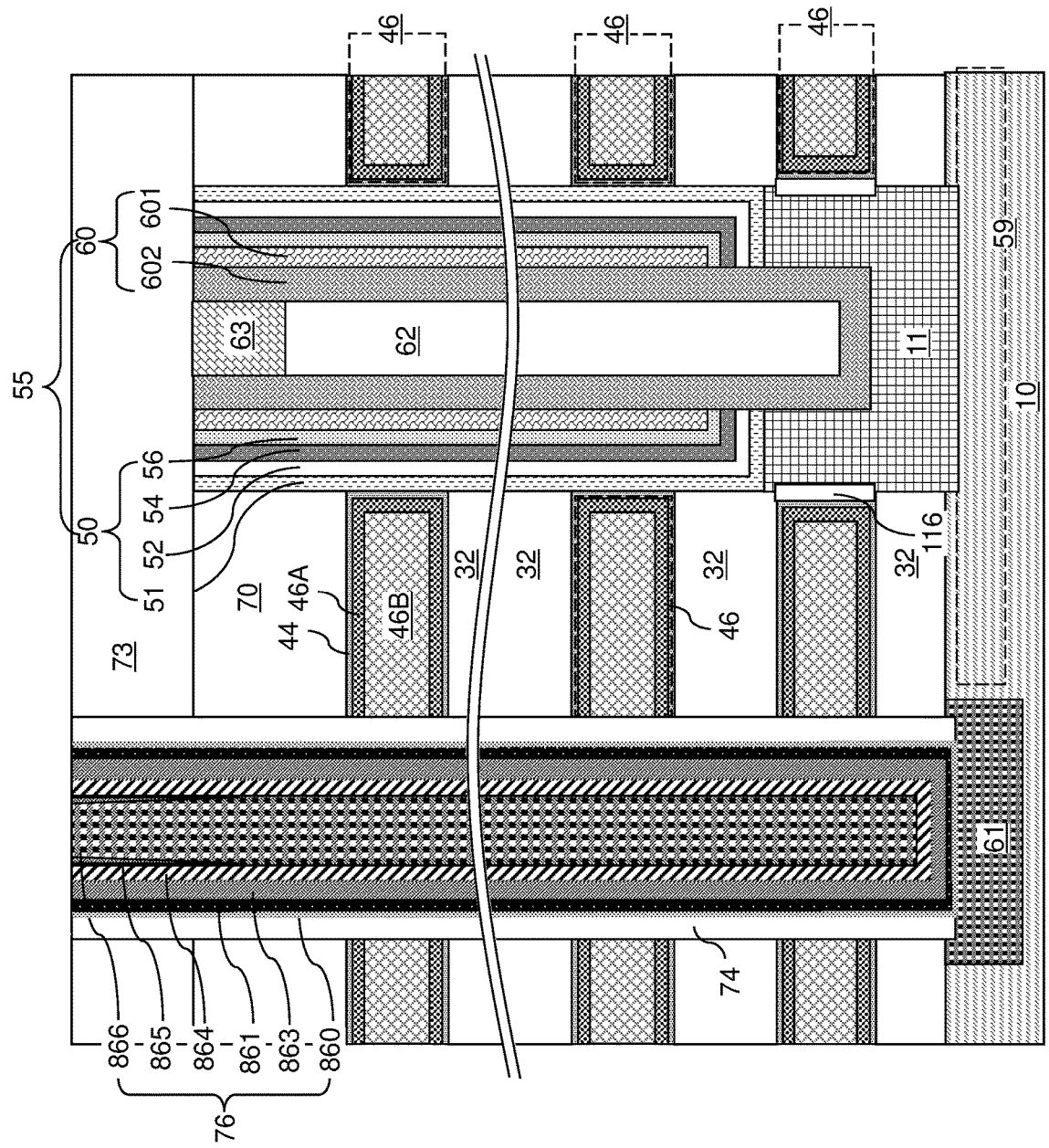

Referring to FIG. 27G, portions of the first metal core fill conductive material portion 866, the tapered metallic nitride liner 865 (if present), the second metal layer 864 (if present), the second metallic nitride liner 863, the first metallic nitride liner 861, and the first metal layer 860 that overlie the horizontal plane including the top surface of the contact-level dielectric layer 873 can be removed by performing a planarization process. The planarization process may comprise a recess etch process and/or a chemical mechanical polishing (CMP) process. Each contiguous combination of remaining portions of the first core fill conductive material portion 866, the tapered metallic nitride liner 865 (if present), the second metal layer 864 (if present), the second metallic nitride liner 863, the first metallic nitride liner 861, and the first metal layer 860 constitute a backside contact via structure 76. Each backside contact via structure 76 can be formed in a respective backside trench 79 over a respective backside trench insulating spacer 74.

Subsequently, the processing steps described with reference to FIGS. 15A and 15B can be performed to form various contact via structures (88, 86).

Figure 28:
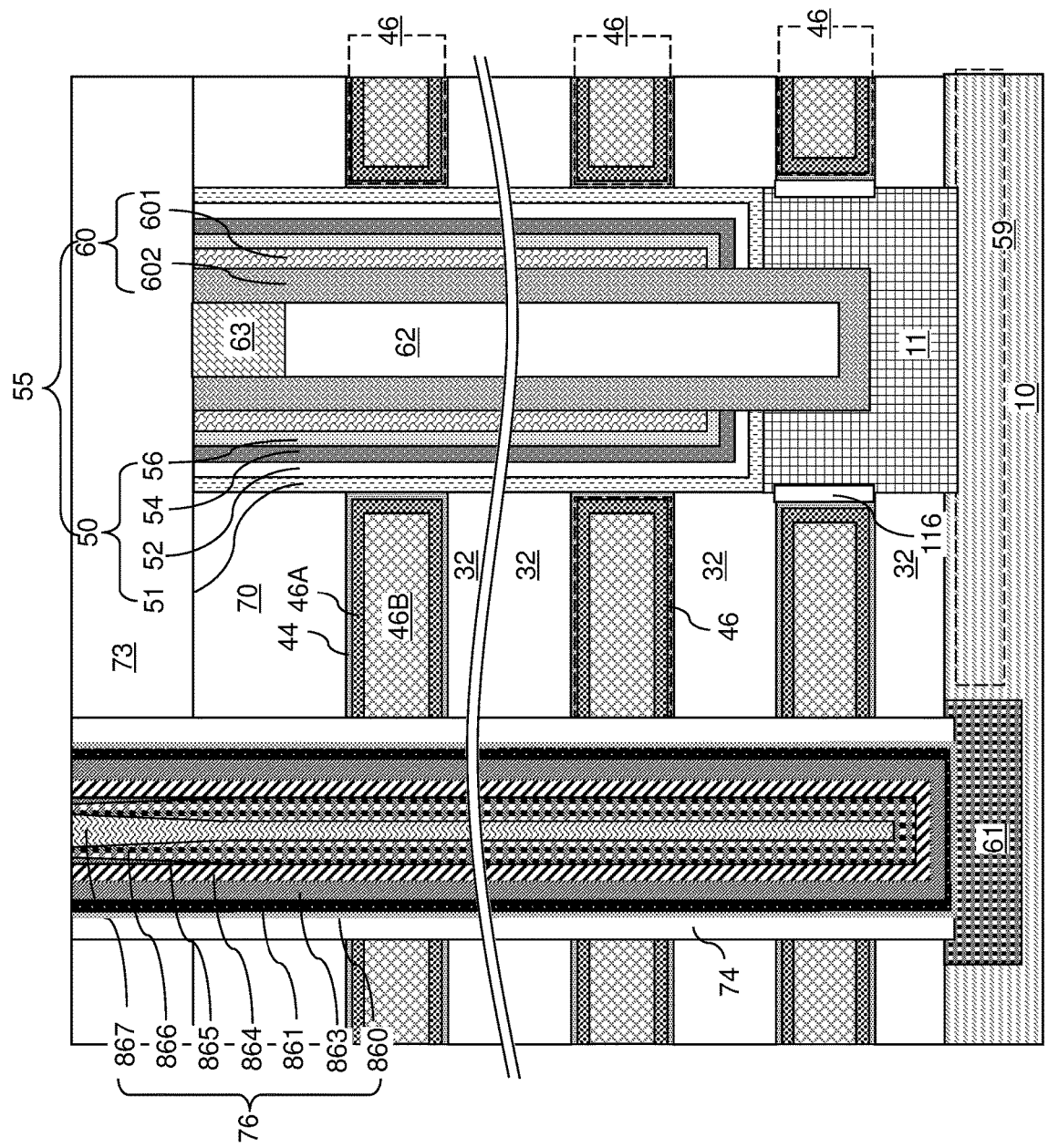
FIG. 28 is a vertical cross-sectional view of a fifteenth configuration of the exemplary structure according to a fifteenth embodiment of the present disclosure.

Referring to FIG. 28, a fifteenth configuration of the exemplary structure can be derived from the fourteenth configuration of the exemplary structure illustrated in FIG. 27E by discontinuing the deposition process for deposition of the first metal core fill conductive material portion 866, and by performing a conformal deposition process that deposits a conductive fill material that is different from the second metal in the remaining volumes of the voids in the backside trenches 79. In this case, the conductive fill material that fills the remaining volumes of the voids in the backside trenches 79 may comprise a doped semiconductor material, such as polysilicon. Subsequently, the planarization process described with reference to FIG. 27G can be performed to remove portions of the various fill material that overlie the horizontal plane including the top surface of the contact-level dielectric layer 73. In this case, each backside contact via structure 76 may comprise a second core fill conductive material portion 867 (which may comprise a doped semiconductor material), the first metal core fill conductive material portion 866, the tapered metallic nitride liner 865 (if present), the second metal layer 864 (if present), the second metallic nitride liner 863, the first metallic nitride liner 861, and the first metal layer 860.

Referring collectively to FIGS. 27A-27G and 28 and according to various embodiments of the present disclosure, a three dimensional memory device is provided, which comprises: an alternating stack (32, 46) of insulating layers 32 and electrically conductive layers 46; memory openings 49 vertically extending through the alternating stack (32, 46); memory opening fill structures 58 located in the memory openings 49 and comprising a respective vertical semiconductor channel 60 and a respective vertical stack of memory elements; and a backside trench fill structure (74, 76) laterally extending along a first horizontal direction hd1, wherein: the backside trench fill structure (74, 76) comprises a backside trench insulating spacer 74 and a backside contact via structure 76 that is laterally surrounded by the backside trench insulating spacer 74; and the backside contact via structure 76 comprises: a first metal layer 860 comprising a first metal; a first metallic nitride liner 861 comprising a nitride of the first metal and contacting an inner sidewall of the first metal layer 860; a second metallic nitride liner 863 comprising a nitride of a second metal and contacting an inner sidewall of the first metallic nitride liner 861; and a first core fill conductive material portion 866 consisting essentially of the second metal and contacting an inner sidewall of the second metallic nitride liner 863.

In one embodiment, a lattice constant of the nitride of the second metal is less than a lattice constant of the nitride of the first metal; and a lattice constant of the second metal is less than the lattice constant of the nitride of the second metal. In one embodiment, a coefficient of thermal expansion (CTE) of the nitride of the second metal is less than a CTE of the nitride of the first metal; and a CTE of second metal is less than the CTE of the nitride of the second metal. In one embodiment, the second metal is molybdenum. In one embodiment, the second metal is tungsten. In one embodiment, the first metal is selected from titanium and tantalum.

In one embodiment, the second metallic nitride liner 863 is polycrystalline; and the backside contact via structure 76 comprises an amorphous tapered metallic nitride liner 865 contacting an upper portion of the inner sidewall of the second metallic nitride liner 863. In one embodiment, the amorphous tapered metallic nitride liner 865 consists essentially of an amorphous nitride of the second metal. In one embodiment, a vertical extent of the amorphous tapered metallic nitride liner 865 is 50% or less of a height of the backside contact via structure 76. In one embodiment, the amorphous tapered metallic nitride liner 865 contacts an upper portion of an outer sidewall of the first core fill conductive material portion 866 and has a tapered vertical cross-sectional profile such that a lateral thickness of the amorphous tapered metallic nitride liner 865 increases with a vertical distance from a horizontal plane including a bottom surface of the alternating stack (32, 46).

The various embodiments of the present disclosure may be employed to provide backside contact via structures providing enhanced fill characteristics and/or providing reduced mechanical stress on the substrate through use of various conductive materials.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A three dimensional memory device, comprising:
an alternating stack of insulating layers and electrically conductive layers;
memory openings vertically extending through the alternating stack;
memory opening fill structures located in the memory openings and comprising a respective vertical semiconductor channel and a respective vertical stack of memory elements; and
a backside trench fill structure laterally extending along a first horizontal direction,
wherein:
the backside trench fill structure comprises a backside trench insulating spacer and a backside contact via structure that is laterally surrounded by the backside trench insulating spacer;
the backside contact via structure comprises:
a first metallic nitride liner comprising a nitride of titanium;
a first metal core fill conductive material portion consisting essentially of tungsten; and
a second metallic nitride liner comprising a nitride of the tungsten located between an inner sidewall of the first metallic nitride liner and an outer sidewall of the first metal core fill conductive material portion;
the second metallic nitride liner is polycrystalline; and
the backside contact via structure further comprises an amorphous tapered metallic nitride liner.

2. The three-dimensional memory device of claim 1, wherein:
the amorphous tapered metallic nitride liner consists essentially of amorphous tungsten nitride;
a vertical extent of the amorphous tapered metallic nitride liner is 50% or less of a height of the backside contact via structure; and
the amorphous tapered metallic nitride liner contacts an upper portion of an outer sidewall of the first metal core fill conductive material portion and has a tapered vertical cross-sectional profile such that a lateral thickness of the amorphous tapered metallic nitride liner increases with a vertical distance from a horizontal plane including a bottom surface of the alternating stack.

* * * * *